US008911565B2

(12) United States Patent
Inaguma et al.

(10) Patent No.: US 8,911,565 B2
(45) Date of Patent: Dec. 16, 2014

(54) FE-BASED METAL PLATE AND METHOD OF MANUFACTURING THE SAME

(75) Inventors: Tooru Inaguma, Tokyo (JP); Miho Tomita, Tokyo (JP); Youji Mizuhara, Tokyo (JP); Hiroaki Sakamoto, Tokyo (JP)

(73) Assignee: Nippon Steel & Sumitomo Metal Corporation, Tokyo (JP)

( * ) Notice: Subject to any disclaimer, the term of this patent is extended or adjusted under 35 U.S.C. 154(b) by 111 days.

(21) Appl. No.: 13/504,319

(22) PCT Filed: Oct. 27, 2010

(86) PCT No.: PCT/JP2010/069102
§ 371 (c)(1),
(2), (4) Date: Apr. 26, 2012

(87) PCT Pub. No.: WO2011/052654
PCT Pub. Date: May 5, 2011

(65) Prior Publication Data
US 2012/0211129 A1 Aug. 23, 2012

(30) Foreign Application Priority Data
Oct. 28, 2009 (JP) .................. 2009-248057

(51) Int. Cl.
*C21D 8/02* (2006.01)
*B32B 15/01* (2006.01)

(51) Int. Cl.
(52) U.S. Cl.
CPC .............. *C23C 2/26* (2013.01); *C21D 2221/10* (2013.01); *C21D 2211/004* (2013.01); *C21D 8/1233* (2013.01); *C23C 2/12* (2013.01); *H01F 1/16* (2013.01); *C22C 38/004* (2013.01); *C21D 2221/00* (2013.01); *C23C 2/28* (2013.01); *C23C 14/16* (2013.01); *C22C 38/16* (2013.01); *C22C 38/001* (2013.01); *B32B 15/012* (2013.01); *C22C 38/04* (2013.01); *C21D 2211/005* (2013.01); *C21D 8/1222* (2013.01); *B32B 15/011* (2013.01); *C22C 38/002* (2013.01); *C21D 2201/05* (2013.01); *C22C 38/08* (2013.01); *C22C 38/02* (2013.01); *C22C 38/18* (2013.01); *C23C 14/5893* (2013.01); *B32B 15/013* (2013.01); *C22C 38/06* (2013.01); *C23C 10/28* (2013.01)
USPC ............ 148/308; 148/320; 148/529; 148/534

(58) Field of Classification Search
USPC .................. 148/100–122, 306–309, 529–536
See application file for complete search history.

(56) References Cited

U.S. PATENT DOCUMENTS 4,529,453 A * 7/1985 Rastogi ......................... 148/308
6,503,339 B1 * 1/2003 Pircher et al. ................. 148/120
(Continued)

FOREIGN PATENT DOCUMENTS

EP 0 987 341 3/2000
JP 01-108345 4/1989
(Continued)

OTHER PUBLICATIONS

Machine-English translation of Japanese Patent No. 09-078129, Takashima Minoru et al. , Mar. 25, 1997.*
(Continued)

*Primary Examiner* — Deborah Yee
(74) *Attorney, Agent, or Firm* — Kenyon & Kenyon LLP

(57) ABSTRACT

On at least one surface of a base metal plate (1) of an α-γ transforming Fe or Fe alloy, a metal layer (2) containing ferrite former is formed. Next, the base metal plate (1) and the metal layer (2) are heated to an A3 point of the Fe or the Fe alloy, whereby the ferrite former are diffused into the base metal plate (1) to form an alloy region (1b) in a ferrite phase in which an accumulation degree of {200} planes is 25% or more and an accumulation degree of {222} planes is 40% or less. Next, the base metal plate (1) is heated to a temperature higher than the A3 point of the Fe or the Fe alloy, whereby the accumulation degree of the {200} planes is increased and the accumulation degree of the {222} planes is decreased while the alloy region (1b) is maintained in the ferrite phase.

19 Claims, 3 Drawing Sheets

(51) Int. Cl.
| | |
|---|---|
| *C21D 8/12* | (2006.01) |
| *C23C 2/12* | (2006.01) |
| *H01F 1/16* | (2006.01) |
| *C22C 38/00* | (2006.01) |
| *C23C 2/28* | (2006.01) |
| *C23C 14/16* | (2006.01) |
| *C22C 38/16* | (2006.01) |
| *C23C 2/26* | (2006.01) |
| *C22C 38/04* | (2006.01) |
| *C22C 38/08* | (2006.01) |
| *C22C 38/02* | (2006.01) |
| *C22C 38/18* | (2006.01) |
| *C23C 14/58* | (2006.01) |
| *C22C 38/06* | (2006.01) |
| *C23C 10/28* | (2006.01) |

(56) References Cited

U.S. PATENT DOCUMENTS

| | | | |
|---|---|---|---|
| 7,846,271 B2 * | 12/2010 | Choi et al. | 148/111 |
| 2009/0022636 A1 | 1/2009 | Inaguma et al. | |
| 2010/0043928 A1 | 2/2010 | Sung | |

FOREIGN PATENT DOCUMENTS

| | | |
|---|---|---|
| JP | 01-252727 | 10/1989 |
| JP | 03-036242 | 2/1991 |
| JP | 05-065537 | 3/1993 |
| JP | 05-279740 | 10/1993 |
| JP | 09-078129 | 3/1997 |
| JP | 10-140298 | 5/1998 |
| JP | 10-140299 | 5/1998 |
| JP | 11-293424 | 10/1999 |
| JP | 2006-144116 | 6/2006 |
| JP | 2007-051338 | 3/2007 |
| JP | 2010-513716 | 4/2010 |
| KR | 2001-0006259 | 1/2001 |

OTHER PUBLICATIONS

International Search Report dated Feb. 15, 2011, issued in corresponding PCT Application No. PCT/JP2010/069102.
International Preliminary Report on Patentability dated Jun. 21, 2012 issued in corresponding PCT Application No. PCT/JP2010/069102.
Office Action dated Dec. 4, 2013 issued in corresponding Korean Application No. 10-2012-7010921 [With English Summary of Office Action].

* cited by examiner

FE-BASED METAL PLATE AND METHOD OF MANUFACTURING THE SAME

This application is a national stage application of International Application No. PCT/JP2010/069102, filed Oct. 27, 2010, which claims priority to Japanese Application No. 2009-248057, filed Oct. 28, 2009, the content of which is incorporated by reference in its entirety.

TECHNICAL FIELD

The present invention relates to a Fe-based metal plate used for a magnetic core or the like and a method of manufacturing the same.

BACKGROUND ART

Silicon steel plates have been conventionally used for magnetic cores of electric motors, power generators, transformers, and the like. A silicon steel plate used for a magnetic core is required to be small in magnetic energy loss (core loss) in an alternating magnetic field and to be high in magnetic flux density in practical magnetic fields. To realize these, it is effective to increase electric resistance and to accumulate <100> axes being a direction of easy magnetization of αFe, in a direction of a used magnetic field. Especially when {100} planes of αFe are highly accumulated in a surface (rolled surface) of a silicon steel plate, <100> axes are highly accumulated in the rolled surface, so that higher magnetic flux density can be obtained. Therefore, there have been proposed various techniques aiming at the higher accumulation of {100} planes in a surface of a silicon steel plate.

However, the conventional techniques have difficulty in realizing the stable high accumulation of [100] planes in a surface of a Fe-based metal plate such as a silicon steel plate.

CITATION LIST

Patent Literature

Patent Literature 1: Japanese Laid-open Patent Publication No. 01-252727
Patent Literature 2: Japanese Laid-open Patent Publication No. 05-279740
Patent Literature 3: Japanese Laid-open Patent Publication No. 2007-51338
Patent Literature 4: Japanese Laid-open Patent Publication No. 2006-144116
Patent Literature 5: Japanese National Publication of International Patent Application No. 2010-513716

SUMMARY OF INVENTION

Technical Problem

It is an object of the present invention to provide a Fe-based metal plate capable of having higher magnetic flux density and a method of manufacturing the same.

Solution to Problem (1) A method of manufacturing an Fe-based metal plate including:
forming a metal layer containing ferrite former on at least one surface of a base metal plate of an α-γ transforming Fe or Fe alloy;
next heating the base metal plate and the metal layer to an A3 point of the Fe or the Fe alloy so as to diffuse the ferrite former into the base metal plate and form an alloy region of a ferrite phase in which an accumulation degree of {200} planes is 25% or more and an accumulation degree of {222} planes is 40% or less; and
next heating the base metal plate to a temperature equal to or higher than the A3 point of the Fe or the Fe alloy so as to increase the accumulation degree of the {200} planes and decrease the accumulation degree of the {222} planes while maintaining the alloy region of the ferrite phase.

(2) The method of manufacturing an Fe-based metal plate according to (1), including, after the increasing the accumulation degree of the {200} planes and the decreasing the accumulation degree of the {222} planes, cooling the base metal plate to a temperature lower than the A3 point of the Fe or the Fe alloy so as to transform an unalloyed region in the base metal plate from an austenitic phase to a ferrite phase, further increase the accumulation degree of the {200} planes and further decrease the accumulation degree of the {222} planes.

(3) The method of manufacturing an Fe-based metal plate according to (1) or (2), wherein, in the increasing the accumulation degree of the {200} planes and the decreasing the accumulation degree of the {222} planes, the accumulation degree of the {200} planes is increased to 30% or more and the accumulation degree of the {222} planes is decreased to 30% or less.

(4) The method of manufacturing an Fe-based metal plate according to (1) or (2), wherein, in the increasing the accumulation degree of the {200} planes and the decreasing the accumulation degree of the {222} planes, the accumulation degree of the {200} planes is increased to 50% or more and the accumulation degree of the {222} planes is decreased to 15% or less.

(5) The method of manufacturing an Fe-based metal plate according to any one of (1) to (4), wherein, in the increasing the accumulation degree of the {200} planes and the decreasing the accumulation degree of the {222} planes, the ferrite former contained in the metal layer are all diffused into the base metal plate.

(6) The method of manufacturing an Fe-based metal plate according to any one of (1) to (5), wherein the ferrite former are at least one kind selected from a group consisting of Al, Cr, Ga, Ge, Mo, Sb, Si, Sn, Ti, V, W, and Zn.

(7) The method of manufacturing an Fe-based metal plate according to any one of (1) to (6), wherein, in the increasing the accumulation degree of the {200} planes and the decreasing the accumulation degree of the {222} planes, an area ratio of a ferrite single phase region to the metal plate in a cross section in a thickness direction is made to 1% or more.

(8) The method of manufacturing an Fe-based metal plate according to any one of (1) to (7), wherein as the base metal plate, used is one in which a working strain is brought about and in which dislocation density is not less than $1 \times 10^{15}$ m/m$^3$ nor more than $1 \times 10^{17}$ m/m$^3$.

(9) The method of manufacturing an Fe-based metal plate according to any one of (1) to (7), wherein as the base metal plate, used is one in which a working strain is brought about by cold rolling in which rolling reduction ratio is not less than 97% nor more than 99.99%.

(10) The method of manufacturing an Fe-based metal plate according to any one of (1) to (7), wherein as the base metal plate, used is one in which a working strain is brought about by shot blasting.

(11) The method of manufacturing an Fe-based metal plate according to any one of (1) to (7), wherein as the base metal plate, used is one in which a working strain is brought about by cold rolling in which rolling reduction ratio is not less than 50% nor more than 99.99% and shot blasting.

(12) The method of manufacturing an Fe-based metal plate according to any one of (1) to (7), wherein as the base metal plate, used is one in which a shear strain of 0.2 or more is brought about by cold rolling.

(13) The method of manufacturing an Fe-based metal plate according to any one of (1) to (7), wherein as the base metal plate, used is one in which a shear strain of 0.1 or more is brought about by cold rolling and a working strain is brought about by shot blasting.

(14) The method of manufacturing an Fe-based metal plate according to any one of (1) to (13), wherein a thickness of the base metal plate is not less than 10 μm nor more than 5 mm.

(15) A Fe-based metal plate, containing ferrite former, wherein, in a surface, an accumulation degree of {200} planes in a ferrite phase is 30% or more and an accumulation degree of {222} planes in the ferrite phase is 30% or less.

(16) The Fe-based metal plate according to (15), being formed by diffusion of the ferrite former from a surface to an inner part of an α-γ transforming Fe or Fe alloy plate.

(17) The Fe-based metal plate according to (15) or (16), including, on the surface, a metal layer containing the ferrite former.

(18) The Fe-based metal plate according to any one of (15) to (17), wherein the accumulation degree of the {200} planes is 50% or more and the accumulation degree of the {222} planes is 15% or less.

(19) The Fe-based metal plate according to any one of (15) to (18), wherein the ferrite former are at least one kind selected from a group consisting of Al, Cr, Ga, Ge, Mo, Sb, Si, Sn, Ti, V, W, and Zn.

(20) The Fe-based metal plate according to any one of (15) to (19), including a 1% ferrite single phase region or more in terms of an area ratio in a thicknesswise cross section of the metal plate.

The accumulation degree of the {200} planes in the ferrite phase is expressed by an expression (1) and the accumulation degree of the {222} planes in the ferrite phase is expressed by an expression (2).

$$\text{accumulation degree of } \{200\} \text{ planes} = [\{i(200)/I(200)\}/\Sigma\{i(hkl)/I(hkl)\}] \times 100 \quad (1)$$

$$\text{accumulation degree of } \{222\} \text{ planes} = [\{i(222)/I(222)\}/\Sigma\{i(hkl)/I(hkl)\}] \times 100 \quad (2)$$

Here, i(hkl) is actually measured integrated intensity of {hkl} planes in the surface of the Fe-based metal plate or the base metal plate, and I(hkl) is theoretical integrated intensity of {hkl} planes in a sample having random orientation. As the (hkl) planes, used are, for examples, 11 kinds of {110}, {200}, {211}, {310}, {222}, {321}, {411}, {420}, {332}, {521}, and {442} planes.

Advantageous Effects of Invention

According to the present invention, it is possible to obtain a Fe-based metal plate in which an accumulation degree of {200} planes in a ferrite phase is high and an accumulation degree of {222} planes in the ferrite phase is low, and to improve magnetic flux density.

DESCRIPTION OF EMBODIMENTS (Basic Principle of Present Invention)

First, a basic principle of the present invention will be described. FIG. 1A to FIG. 1E are cross-sectional views showing the basic principle of the present invention.

Figure 1A:
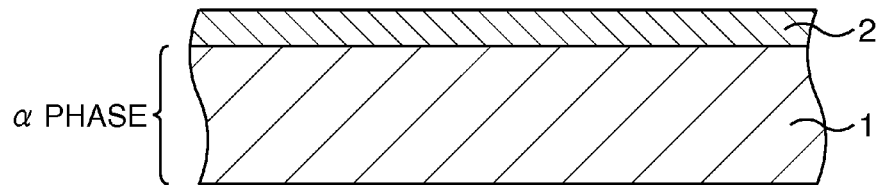
FIG. 1A is a cross-sectional view showing a basic principle of the present invention.

In the present invention, for example, as illustrated in FIG. 1A, a metal layer 2 containing ferrite former is formed on at least one surface of a base metal plate 1 composed of an α-γ transforming Fe-based metal (Fe or Fe alloy). As the base metal plate 1, for example, pure iron plate cold-rolled with a very high rolling reduction ratio of about 99.8% is used. Further, as the metal layer 2, an Al layer is formed, for example.

Figure 1B:
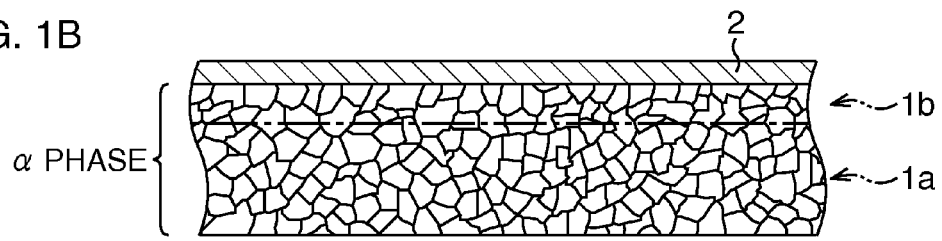
FIG. 1B which continues from FIG. 1A, is a cross-sectional view showing the basic principle of the present invention.

Next, the base metal plate 1 and the metal layer 2 are heated to the A3 point of the material (pure iron) of the base metal plate 1. During the heating, as illustrated in FIG. 1B, Al being the ferrite former in the metal layer 2 is diffused into the base metal plate 1, so that an alloy region 1b in a ferrite phase (α phase) is formed. The remainder of the base metal plate 1 is an unalloyed region 1a in the α phase until an instant immediately before the A3 point is reached. In accordance with the heating, recrystallization occurs in the alloy region 1b and the unalloyed region 1a. Further, since a large strain has been generated due to the cold rolling, planes parallel to a surface of the base metal plate 1 (rolled surface), of grains generated by the recrystallization are likely to be oriented in {100}. Therefore, many grains whose planes parallel to the rolled surface are oriented in {100} are generated both in the alloy region 1b and the unalloyed region 1a. Here, important points of the present invention are that, by the instant before the temperature reaches the A3 point, α-phase grains oriented in {100} are contained in the alloy region 1b due to the diffusion of Al being the ferrite former, and that the alloy region 1b has the α single phase alloy composition.

Figure 1C:
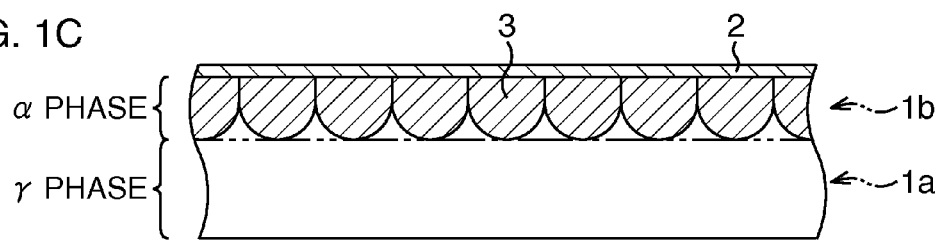
FIG. 1C, which continues from FIG. 1B, is a cross-sectional view showing the basic principle of the present invention.

Thereafter, the base metal plate 1 and the metal layer 2 are further heated to a temperature equal to or higher than the A3 point of the pure iron. As a result, as illustrated in FIG. 1C, the unalloyed region 1a composed of the pure iron is γ-transformed to become an austenitic phase (γ phase), while the alloy region 1b containing Al being the ferrite former is maintained in the α phase. Even at the temperature equal to or higher than the A3 point, the α-phase grains oriented in {100}, which are formed at lower than the A3 point, do not undergo the γ-transformation and their crystal orientation is maintained. Further, in the alloy region 1b, grains 3 whose planes parallel to the rolled surface are oriented in {100} predominantly grow. Along with the growth of the {100} grains, grains oriented in other directions vanish. For example, grains whose planes parallel to the rolled surface are oriented in {111} decrease. Therefore, in the alloy region 1b, the accumulation degree of {200} planes in the α phase increases and the accumulation degree of {222} planes in the α phase decreases.

Figure 1D:
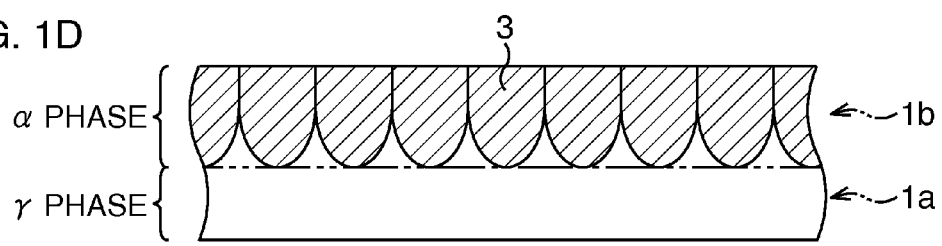
FIG. 1D, which continues from FIG. 1C, is a cross-sectional view showing the basic principle of the present invention.

Then, when the base metal plate 1 and the metal layer 2 are kept at the temperature equal to or higher than the A3 point of the pure iron, Al in the metal layer 2 further diffuses into the base metal plate 1, and as illustrated in FIG. 1D, the alloy region 1b in the α phase expands. That is, in accordance with the diffusion of Al being the ferrite former, part of the unalloyed region 1a in the γ phase changes to the alloy region 1b in the α phase. At the time of this change, since the alloy region 1b being a region adjacent to a metal layer 2 side of the region where the change occurs has already been oriented in {100}, the region where the change occurs takes over the crystal orientation of the alloy region 1b to be oriented in {100}. As a result, the grains 3 whose planes parallel to the rolled surface are oriented in {100} further grow. Then, along with the growth of the grains 3, the accumulation degree of the {200} planes in the α phase further increases and the accumulation degree of the {222} planes in the α phase further decreases.

Figure 1E:
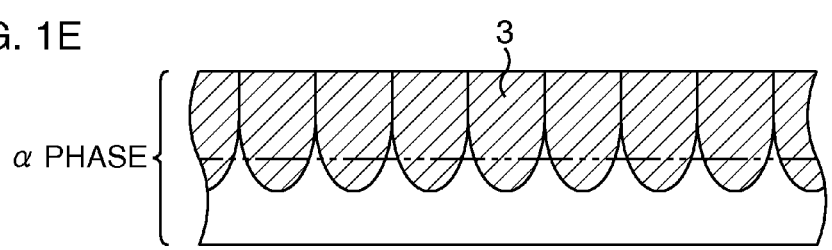
FIG. 1E, which continues from FIG. 1D, is a cross-sectional view showing the basic principle of the present invention.

Subsequently, the base metal plate 1 is cooled to a temperature lower than the A3 point of the pure iron. As a result, as illustrated in FIG. 1E, the unalloyed region 1a composed of the pure iron is α-transformed to the α phase. At the time of the phase transformation as well, since the alloy region 1b being the region adjacent to the metal layer 2 side of the region where the phase transformation occurs has already been oriented in {100}, the region where the phase transformation occurs takes over the crystal orientation of the alloy region 1b to be oriented in {100}. As a result, the grains 3 whose planes parallel to the rolled surface are oriented in {100} further grow. Then, along with the growth of the grains 3, the accumulation degree of the {200} planes in the α phase further increases and the accumulation degree of the {222} planes in the α phase further decreases. That is, a high accumulation degree of the {200} planes in the α phase is obtained also in the unalloyed region 1a.

Incidentally, when the metal layer 2 is thick and the keeping time of the temperature equal to or higher than the A3 point is long, Al sufficiently diffuses and the unalloyed region 1a sometimes disappears before the temperature of the base metal plate 1 reaches lower than the A3 point at the time of the cooling. In this case, the phase transformation of the unalloyed region 1a does not occur, and since the whole region has become the alloy region 1b, the state at the start of the cooling is maintained.

Therefore, in the Fe-based metal plate (Fe or Fe alloy plate) manufactured through these processes, the accumulation degree of the {200} planes in the α phase is extremely high and the accumulation degree of the {222} planes in the α phase is extremely low. Therefore, high magnetic flux density is obtained.

Here, conditions in the present invention will be described.

"Base Metal Plate"

As a material of the base metal plate, an α-γ transforming Fe-based metal (Fe or Fe alloy) is used. The Fe-based metal contains, for example, 70 mass % Fe or more. Further, the α-γ transformation series is, for example, a component series which has the A3 point within a range of about 600° C. to 1000° C., and which has an α phase as its main phase at lower than the A3 point and has a γ phase as its main phase at the A3 point or higher. Here, the main phase refers to a phase whose volume ratio is over 50%. The use of the α-γ transforming Fe-based metal makes it possible to form a region having an α single phase composition in accordance with the diffusion and alloying of a ferrite former. Examples of the α-γ transforming Fe-based metal may be pure iron, low-carbon steel, and the like. For example, usable is pure iron whose C content is 1 mass ppm to 0.2 mass %, with the balance being Fe and inevitable impurities. Also usable is silicon steel composed of an α-γ transforming component whose basic components are C with a 0.1 mass % content or less and Si with a 0.1 mass % to 2.5 mass % content. Further, any of these to which various kinds of elements are added may also be used. Examples of the various elements are Mn, Ni, Cr, Al, Mo, W, V, Ti, Nb, B, Cu, Co, Zr, Y, Hf, La, Ce, N, O, P, S, and so on. However, it is preferable that Mn and Ni are not contained because they may involve a risk of lowering magnetic flux density.

As the base metal plate, one in which a strain is brought about is used, for example. This is intended to generate many grains whose planes parallel to the rolled surface are oriented in {100}, at the time of the recrystallization of the base metal plate, thereby improving the accumulation degree of the {200} planes in the α phase. For example, it is preferable to bring about a working strain with which dislocation density becomes not less than $1\times10^{15}$ m/m$^3$ nor more than $1\times10^{17}$ m/m$^3$. A method for generating such a strain is not particularly limited, but, for example, it is preferable to apply cold rolling with a high rolling reduction ratio, especially with a rolling reduction ratio of not less than 97% nor more than 99.99%. Alternatively, a shear strain of 0.2 or more may be generated by cold rolling. It is possible to generate the shear strain by, for example, rotating upper and lower reduction rolls at different speeds at the time of the cold rolling. In this case, the larger a difference in the rotation speed between the upper and lower reduction rolls, the larger the shear strain. The shear strain may be calculated from diameters of the reduction rolls and a difference in rotation speed therebetween.

The strain need not exist all along the thickness direction of the base metal plate, and the strain only needs to exist in a portion where the formation of the alloyed region starts, that is, in a surface layer portion of the base metal plate. Therefore, the working strain may be brought about by shot blasting, or the generation of the working strain or the generation of the shear strain by the cold rolling may be combined with the generation of the working strain by the shot blasting. When the cold rolling and the shot blasting are combined, a rolling reduction ratio of the cold rolling may be not less than 50% nor more than 99.99%. When the generation of the shear strain and the shot blasting are combined, the shear strain may be 0.1 or more. When the working strain is brought about by the shot blasting, it is possible to make the orientation of the {100} planes of the grains uniform in planes parallel to the surface of the Fe-based metal plate.

As the base metal plate, one in which a texture oriented in {100} is formed in the surface layer portion in advance may be used, for example. In this case as well, in the alloy region, it is possible to increase the accumulation degree of the {200} planes in the α phase and decrease the accumulation degree of the {222} planes in the α phase. It is possible to obtain such a base metal plate by, for example, subjecting a metal plate including a large strain to recrystallization annealing.

Though details will be described later, a base metal plate may be used in which an α-phase alloy region where the accumulation degree of the {200} planes in the α phase is 25% or more and the accumulation degree of the {222} planes in the α phase is 40% or less is formed at the time of the heating to the A3 point.

A thickness of the base metal plate is preferably not less than 10 μm nor more than 5 mm, for example. As will be described later, a thickness of the Fe-based metal plate is preferably more than 10 μm and 6 mm or less. Considering that the metal layer is formed, when the thickness of the base metal plate is not less than 10 μm nor more than 5 mm, the thickness of the Fe-based metal plate may be easily more than 10 μm and 6 mm or less.

"Ferrite former and Metal Layer"

As the ferrite former, Al, Cr, Ga, Ge, Mo, Sb, Si, Sn, Ta, Ti, V, W, Zn, or the like is preferably used. The use of any of these elements facilitates forming the region having the α single phase composition and makes it possible to efficiently enhance the accumulation degree of the {200} planes in the α phase.

A method of forming the metal layer containing the ferrite former is not particularly limited, and examples thereof may be plating methods such as a hot dipping method and an electrolytic plating method, dry process methods such as a PVD (physical vapor deposition) method and a CVD (chemical vapor deposition) method, a rolling clad method, powder coating, and so on. Among them, the plating method and the rolling clad method are preferable especially when the method is industrially implemented. This is because they may easily and efficiently form the metal layer.

A thickness of the metal layer is preferably not less than 0.05 μm nor more than 1000 μm. When the thickness of the metal layer is less than 0.05 μm, it may be difficult to sufficiently form the alloy region and it is not sometimes possible to obtain the sufficient accumulation degree of the {200} planes in the α phase. Further, when the thickness of the metal layer is over 1000 μm, the metal layer sometimes remains thickly after the cooling to lower than the A3 point and a high magnetic property cannot be sometimes obtained.

"Ratio of Alloying of Metal Layer"

In the metal layer, a ratio of its portion alloyed with the base metal plate is preferably 10% or more in the thickness direction. When the ratio is less than 10%, it may be difficult to sufficiently form the alloy region and it is not sometimes possible to obtain the sufficient accumulation degree of the {200} planes in the α phase. Incidentally, the ratio (alloying ratio) may be expressed by an expression (3), where S0 is an area of the metal layer before the heating in a cross section perpendicular to the surface of the base metal plate and S is an area of the metal layer after the heating and the cooling.

$$\text{alloying ratio} = ((S0-S)/S0) \times 100 \quad (3)$$

"Ratio of α Single Phase Region"

The region having the α single phase composition as a result of the alloying of the ferrite former and Fe has mainly a ferrite single phase (α single phase region) after the heating and the cooling. On the other hand, the unalloyed region in the base metal plate has mainly the α-γ transformed region after the heating and the cooling. Therefore, the α single phase region is substantially equivalent to the alloyed region. A ratio of the α single phase region to the base metal plate is preferably 1% or more in terms of an area ratio in a cross section in the thickness direction. When the ratio is less than 1%, the alloy region is not sufficiently formed and the sufficient accumulation degree of the {200} planes in the α phase is not sometimes obtained. In order to obtain a higher accumulation degree of the {200} planes in the α phase, the ratio is preferably 5% or more.

Further, in the α single phase region where the ferrite former is alloyed, since electric resistance is high, an effect of improving a core loss characteristic is obtained. As a desirable condition under which this effect is obtained, the ratio of the α single phase region to the metal plate in the thickness direction is 1% or more. When it is less than 1%, the accumulation degree of the {200} planes is not sufficiently high and it may be difficult to obtain an excellent core loss characteristic.

In order to obtain a more excellent core loss characteristic, the ratio of the α single phase region to the metal plate in the thickness direction is desirably not less than 5% nor more than 80%. When it is 5% or more, the accumulation degree of the {200} planes is remarkably high and the core loss characteristic accordingly improves. When it is 80% or less, the electric resistance of the α single phase region is still higher and the core loss is remarkably lower due to a synergistic effect with the effect of improving the accumulation degree of the {200} planes.

Here, the ratio of the α single phase region may be expressed by an expression (4), where T0 is an area of the cross section perpendicular to the surface of the Fe-based metal plate after the heating and the cooling and T is an area of the α single phase region after the heating and the cooling. Here, when Al is used as the ferrite former is, for example, the α single phase region is a region where the Al content is not less than 0.9 mass % nor more than 10 mass %. This range differs depending on the kind of the ferrite former and is a range shown in a Fe-based alloy phase diagram or the like.

$$\text{ratio of } \alpha \text{ single phase region} = (T/T0) \times 100 \quad (4)$$

"Plane Accumulation Degrees in Fe-based Metal Plate"

The accumulation degree of the {200} planes in the α phase in the surface (rolled surface) of the Fe-based metal plate is 30% or more. When the accumulation degree of the {200} planes in the α phase is less than 30%, it may be not possible to obtain sufficiently high magnetic flux density. In order to obtain higher magnetic flux density, the accumulation degree of the {200} planes in the α phase is preferably 50% or more. However, when the accumulation degree of the {200} planes in the α phase is over 99%, the magnetic flux density saturates. Further, making the accumulation degree of the {200} planes in the α phase higher than 99% is difficult in view of manufacture. Therefore, the accumulation degree of the {200} planes in the α phase is preferably 99% or less, more preferably 95% or less.

The accumulation degree of the {222} planes in the α phase in the surface (rolled surface) of the Fe-based metal plate is 30% or less. When the accumulation degree of the {222} planes in the α phase is over 30%, it is not possible to obtain sufficiently high magnetic flux density. In order to obtain higher magnetic flux density, the accumulation degree of the {222} planes in the α phase is preferably 15% or less. However, when the accumulation degree of the {222} planes in the α phase is less than 0.01%, the magnetic flux density saturates. Further, making the accumulation degree of the {222} planes in the α phase less than 0.01% may be difficult in view of manufacture. Therefore, the accumulation degree of the {222} planes in the α phase is preferably 0.01% or more.

These plane accumulation degrees may be measured by X-ray diffraction using a MoKα ray. To be in more detail, in α phase crystals, integrated intensities of eleven orientation planes ({110}, {200}, {211}, {310}, {222}, {321}, {411}, {420}, {332}, {521}, and {442}) parallel to its surface is measured for each sample, each measurement value is divided by theoretical integrated intensity of the sample having random orientation, and thereafter, a ratio of the intensity of {200} or {222} is found in percentage.

At this time, the accumulation degree of the {200} planes in the α phase is expressed by an expression (1) and the accumulation degree of the {222} planes in the α phase is expressed by an expression (2), for example.

$$\text{accumulation degree of } \{200\} \text{planes} = [\{i(200)/I(200)\}/\Sigma\{i(hkl)/I(hkl)\}] \times 100 \quad (1)$$

$$\text{accumulation degree of } \{222\} \text{planes} = [\{i(222)/I(222)\}/\Sigma\{i(hkl)/I(hkl)\}] \times 100 \quad (2)$$

Here, i(hkl) is actually measured integrated intensity of {hkl} planes in the surface of the Fe-based metal plate or the base metal plate, and I(hkl) is theoretical integrated intensity of the {hkl} planes in the sample having random orientation. Incidentally, instead of the theoretical integrated intensity of the sample having the random orientation, results of actual measurement using the sample (actually measured values) may be used.

Incidentally, only making Al and Si contained in the steel plate for the purpose of reducing the core loss accompanying the increase in the electric resistance has difficulty in sufficiently reducing the core loss due to the influence of magnetostriction. When the α phase plane accumulation degree is within the aforesaid range, a remarkably good core loss can be obtained. This is thought to be because a difference in magnetostriction among grains is extremely small. This effect is distinguished especially when there are many columnar crystals extending in a direction perpendicular to the surface of the Fe-based metal plate.

"Thickness of Fe-Based Metal Plate"

The thickness of the Fe-based metal plate is preferably over 10 μm and 6 mm or less. When the thickness is 10 μm or less, very many Fe-based metal plates are used when they are stacked to form a magnetic core, which results in much gap between the Fe-based metal plates accompanying the stacking. As a result, high magnetic flux density may be difficult to obtain. Further, when the thickness is over 6 mm, it may be difficult to form a wide alloyed region and it is difficult to sufficiently improve the accumulation degree of the {200} planes in the α phase.

"State of Metal Layer after Heating and Cooling"

In accordance with the heating and the cooling, the whole metal layer may be diffused into the base metal plate or part of the metal layer may remain on a front surface and/or a rear surface of the base metal plate. Further, when part of the metal layer remains after the heating and the cooling, the remaining part may be removed by etching or the like. The metal layer remaining on the front surface and/or the rear surface of the base metal plate may enhance chemical stability of the surface layer portion of the Fe-based metal plate to improve corrosion resistance depending on its composition. When the metal layer is made to remain for the purpose of improving corrosion resistance, its thickness is preferably not more than 0.01 μm nor less than 500 μm. When the thickness is less than 0.01 μm, the metal layer may suffer a defect such as breakage, which is likely to make the core loss unstable. When the thickness is over 500 μm, the metal layer may suffer a defect such as exfoliation, which is likely to make corrosion resistance unstable.

"Transition of α Phase Plane Accumulation Degrees"

In heating the base metal plate and the metal layer, the accumulation degree of the {200} planes in the α phase is 25% or more and the accumulation degree of the {222} planes in the α phase is 40% or less in the alloy region when the A3 point is reached. When the accumulation degree of the {200} planes in the α phase is less than 25%, and when the accumulation degree of the {222} planes in the α phase is over 40%, it may be difficult to set the accumulation degree of the {222} planes in the α phase to 30% or less and the accumulation degree of the {200} planes in the α phase to 30% or more in the Fe-based metal plate. Further, the accumulation degree of the {200} planes in the α phase is preferably 50% or less and the accumulation degree of the {222} planes in the α phase is preferably 1% or more, in the alloy region when the A3 point is reached. When the accumulation degree of the {200} planes in the α phase is over 50%, and when the accumulation degree of the {222} planes in the α phase is less than 1%, the magnetic flux density of the Fe-based metal plate is likely to saturate. Further, in view of manufacture, it may be difficult to set the accumulation degree of the {200} planes in the α phase to more than 50% and to set the accumulation degree of the {222} planes in the α phase to less than 1%.

Further, in heating and cooling the base metal plate and the metal layer, it is preferable that the accumulation degree of the {200} planes in the α phase is 30% or more and the accumulation degree of the {222} planes in the α phase is 30% or less, in the alloy region when the cooling is started. When the accumulation degree of the {200} planes in the α phase is less than 30%, and when the accumulation degree of the {222} planes in the α phase is over 30%, it is likely to be difficult to set the accumulation degree of the {222} planes in the α phase to 30% or less and set the accumulation degree of the {200} planes in the α phase to 30% or more, in the Fe-based metal plate. Further, when the cooling is started, it is preferable that the accumulation degree of the {200} planes in the α phase is 99% or less and the accumulation degree of the {222} planes in the α phase is 0.01% or more, in the alloy region. When the accumulation degree of the {200} planes in the α phase is over 99%, and when the accumulation degree of the {222} planes in the α phase is less than 0.01%, the magnetic flux density of the Fe-based metal plate is likely to saturate. Further, in view of manufacture, it may be difficult to set the accumulation degree of the {200} planes in the α phase to over 99% and to set the accumulation degree of the {222} planes in the α phase to less than 0.01%.

Further, it is more preferable that the accumulation degree of the {200} planes in the α phase is 50% or more and the accumulation degree of the {222} planes in the α phase is 15% or less, in the alloy region when the cooling is started. Further, the accumulation degree of the {200} planes in the α phase is more preferably 95% or less in the alloy region when the cooling is started.

When an unalloyed region exists at the start of the cooling, the unalloyed region transforms from the γ phase to the α phase at the A3 point as described above. In the unalloyed region after the transformation, it is also preferable that the accumulation degree of the {200} planes in the α phase is not less than 30% nor more than 99%. When the accumulation degree of the {200} planes in the α phase is less than 30%, it is likely to be difficult to set the accumulation degree of the {222} planes in the α phase of the Fe-based metal plate to 30% or less. When the accumulation degree of the {200} planes in the α phase is over 99%, the magnetic flux density of the Fe-based metal plate is likely to saturate. Further, in view of manufacture, it may be difficult to set the accumulation degree of the {200} planes in the α phase to over 99%.

"Temperature Increasing Rate and Cooling Rate"

Heating up to the A3 point temperature and heating up to the temperature equal to or higher than the A3 point may be continuously performed, and temperature increasing rates thereof are preferably not less than 0.1° C./sec nor more than 500° C./sec. When the temperature increasing rate is within this range, grains whose planes parallel to the surface of the base metal plate are oriented in {100} are likely to be generated at the time of the recrystallization.

A keeping temperature after the temperature increase is preferably not lower than A3 point nor higher than 1300° C. When the temperature is kept at over 1300° C., the effect saturates. Further, the keeping time is not particularly limited, and the cooling may be started immediately after a predetermined temperature is reached. Further, when the temperature is kept for 36000 sec (ten hours), it is possible to fully diffuse the ferrite former into the metal layer.

A cooling rate at the time of the cooling to the temperature lower than A3 point is preferably not less than 0.1° C./sec nor more than 500° C./sec. The cooling with the temperature range facilitates enhancing the accumulation degree of the {200} planes in the α phase.

An atmosphere at the time of the temperature increase and an atmosphere at the time of the cooling are not particularly limited, and in order to suppress oxidization of the base metal plate and the metal layer, a non-oxidizing atmosphere is preferable. For example, an atmosphere of mixed gas of inert gas such as Ar gas or $N_2$ gas and reducing gas such as $H_2$ gas is preferable. Further, the temperature increase and/or the cooling may be performed under vacuum.

(First Embodiment)

Next, a first embodiment will be described. FIG. 2A to FIG. 2D are cross-sectional views showing a method of manufacturing a Fe-based metal plate according to the first embodiment of the present invention in order of processes.

Figure 2A:
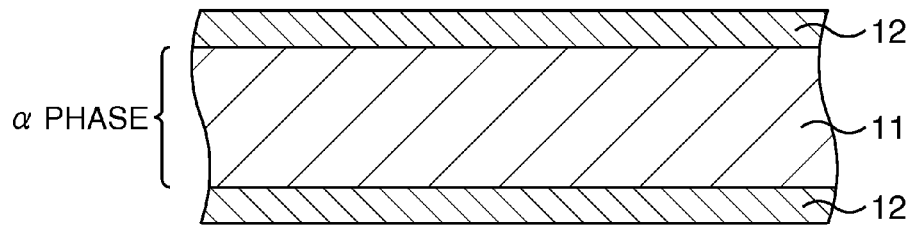
FIG. 2A is a cross-sectional view showing a method of manufacturing a Fe-based metal plate according to a first embodiment.

In the first embodiment, as illustrated in FIG. 2A, metal layers 12 containing Al are first formed on a front surface and a rear surface of a base metal plate 11 composed of pure iron and having strain.

Next, the base metal plate 11 and the metal layers 12 are heated to the A3 point of the pure iron (911° C.) so that ferrite former in the metal layers 12 are diffused into the base metal plate 11, whereby alloy regions in an α phase are formed. The remainder of the base metal plate 11 is an unalloyed region in the α phase until an instant immediately before the A3 point is reached. In accordance with the heating, recrystallization occurs in the base metal plate 11. Further, because of the strain in the base metal plate 11, planes parallel to a surface (rolled surface) of the base metal plate 11, of grains generated by the recrystallization are likely to be oriented in {100}. Therefore, many grains whose planes parallel to the rolled surface are oriented in {100} are generated in the base metal plate 11.

Figure 2B:
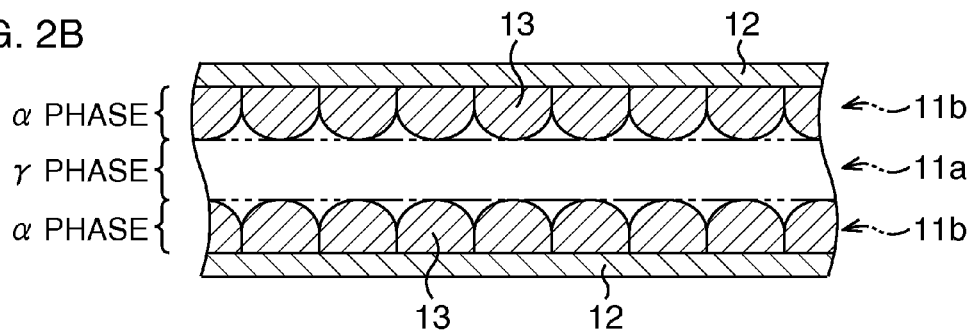
FIG. 2B, which continues from FIG. 2A, is a cross-sectional view showing the method of manufacturing the Fe-based metal plate.

Thereafter, the base metal plate 11 and the metal layers 12 are further heated up to a temperature equal to or higher than the A3 point of the pure iron. As a result, as illustrated in FIG. 2B, the unalloyed region 11a comprised of the α-γ transforming pure iron undergoes γ-transformation to become a γ phase, while the alloy regions 11b containing Al being the ferrite former are maintained in the α phase. Further, Al in the metal layers 12 further diffuses into the base metal plate 11, so that the alloy regions 11b in the α phase expand. Further, in the alloy regions 11b, since the grains 13 whose planes parallel to the rolled surface are oriented in {100} predominantly grow, an accumulation degree of {200} planes in the α phase increases and an accumulation degree of {222} planes in the α phase decreases, in the alloy regions 11b.

Figure 2C:
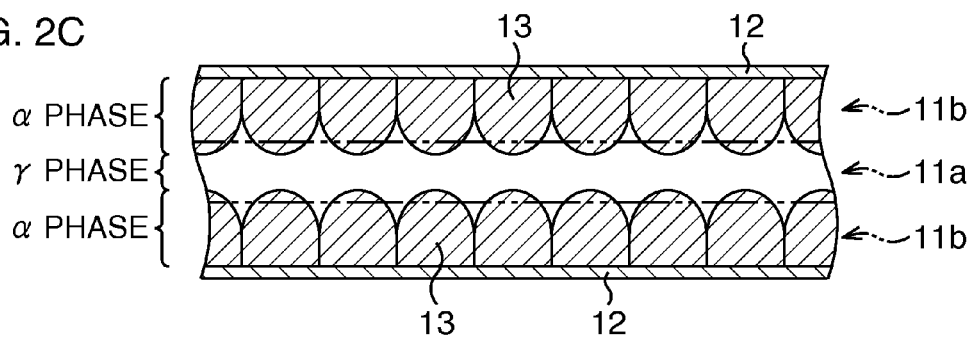
FIG. 2C, which continues from FIG. 2B, is a cross-sectional view showing the method of manufacturing the Fe-based metal plate.

Then, the base metal plate 11 and the metal layers 12 are kept at the temperature equal to or higher than the A3 point of the pure iron, and Al in the metal layers 12 further diffuses into the base metal plate 11, and as illustrated in FIG. 2C, the alloy regions 11b in the α phase expand. That is, in accordance with the diffusion of Al, part of the unalloyed region 11a in the γ phase changes to the alloy regions 11b in the α phase. At the time of the change, since the alloy regions 11b, which are adjacent to metal layer 12 sides of the regions undergoing the change, have been already oriented in {100}, the regions undergoing the change take over the crystal orientation of the alloy regions 11b to be oriented in {100}. As a result, the grains 13 whose planes parallel to the rolled surface are oriented in {100} further grow. Then, along with the growth of the grains 13, grains oriented in other directions vanish. For example, grains whose planes parallel to the rolled surface are oriented in {111} decrease. As a result, the accumulation degree of the {200} planes in the α phase further increases and the accumulation degree of the {222} planes in the α phase further decreases.

Figure 2D:
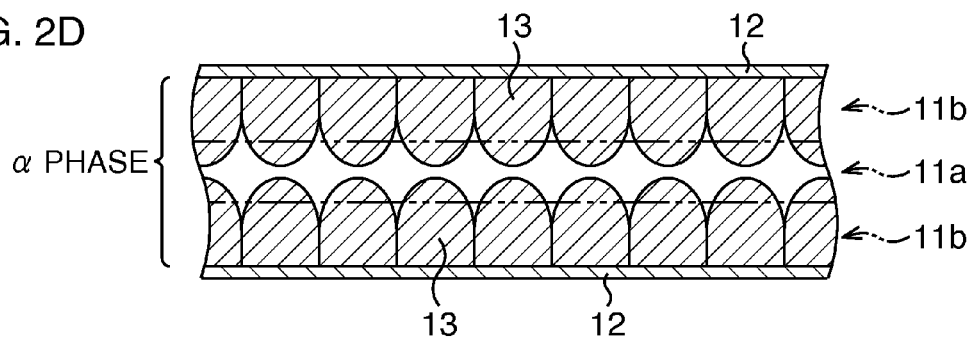
FIG. 2D, which continues from FIG. 2C, is a cross-sectional view showing the method of manufacturing the Fe-based metal plate.

Subsequently, the base metal plate 11 is cooled to a temperature lower than the A3 point of the pure iron. As a result, as illustrated in FIG. 2D, the unalloyed region 11a undergoes α-transformation to become the α phase. At the time of the phase transformation as well, since the alloy regions 11b, which are adjacent to the metal layer 12 sides of the regions undergoing the phase transformation, have already been oriented in {100}, the regions undergoing the phase transformation take over the crystal orientation of the alloy regions 11b to be oriented in {100}. As a result, the grains 13 further grow. Then, along with the growth of the grains 13, the grains oriented in the other directions further vanish. As a result, the accumulation degree of the {200} planes in the α phase further increases and the accumulation degree of the {222} planes in the α phase further decreases. That is, a high accumulation degree of the {200} planes in the α phase is also obtained in the unalloyed region 11a.

Thereafter, insulating films are formed on the surfaces of the metal layers 12. In this manner, the Fe-based metal plate may be manufactured. Incidentally, the metal layers 12 may be removed before the formation of the insulating films.

(Second Embodiment)

Figure 3:
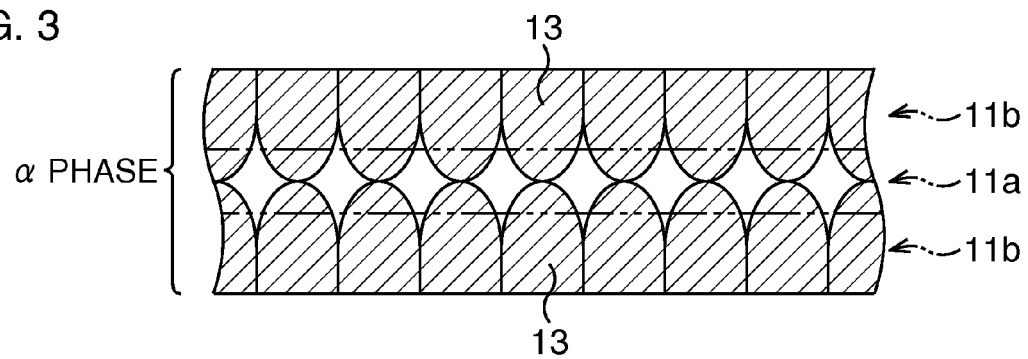
FIG. 3 is a cross-sectional view showing a method of manufacturing a Fe-based metal plate according to a second embodiment.

Next, a second embodiment will be described. FIG. 3 is a cross-sectional view showing a method of manufacturing a Fe-based metal plate according to the second embodiment of the present invention.

In the second embodiment, in the same manner as that of the first embodiment, the processes up to the heating of the base metal plate 11 and the metal layers 12 to a temperature of the A3 point of pure iron are performed (FIG. 2A to FIG. 2B). Then, the base metal plate 11 and the metal layers 12 are kept at a temperature equal to or higher than the A3 point. At this time, the temperature is kept for a longer time or the keeping temperature is made higher than in the first embodiment, and as illustrated in FIG. 3, Al in the metal layers 12 is all diffused into the base metal plate 11. Further, grains 13 are greatly gown, and almost all the grains oriented in directions other than {100} are made to vanish, so that the whole base metal plate 11 is turned into the α phase.

Thereafter, the cooling of the base metal plate 11 and the formation of the insulating films are performed in the same manner as that in the first embodiment. In this manner, the Fe-based metal plate may be manufactured.

(Third Embodiment)

Figure 4:
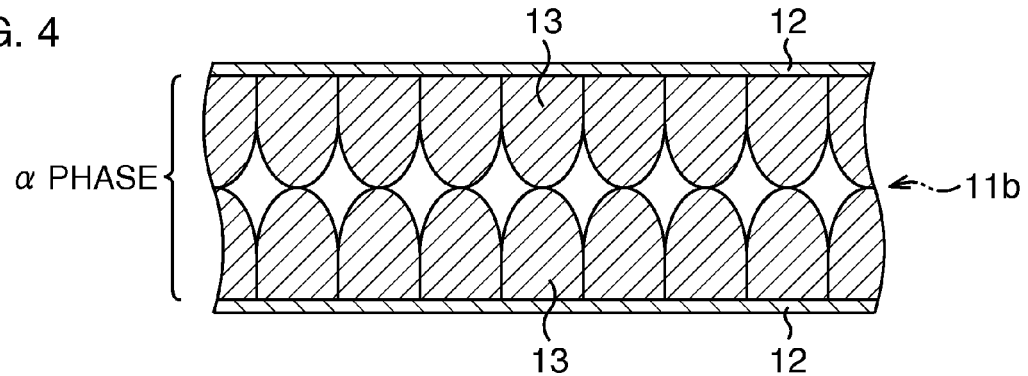
FIG. 4 is a cross-sectional view showing a method of manufacturing a Fe-based metal plate according to a third embodiment.

Next, a third embodiment will be described. FIG. 4 is a cross-sectional view showing a method of manufacturing a Fe-based metal plate according to the third embodiment of the present invention.

In the third embodiment, in the same manner as that in the first embodiment, the processes up to the heating of the base metal plate 11 and the metal layers 12 to a temperature of the A3 point of pure iron are performed (FIG. 2A to FIG. 2B). Here, the metal layers 12 are formed thicker than in the first embodiment. Then, the base metal plate 11 and the metal layers 12 are kept at a temperature equal to or higher than the A3 point of the pure iron. At this time, the temperature is kept for a longer time or the keeping temperature is made higher than in the first embodiment, and as illustrated in FIG. 4, Al is diffused into the whole base metal plate 11. That is, the whole base metal plate 11 is turned into the alloy region 11b.

Thereafter, the cooling of the base metal plate 11 and the formation of the insulating films are performed in the same manner as that in the first embodiment. In this manner, the Fe-based metal plate may be manufactured.

EXAMPLE

First Experiment

In a first experiment, correlations between 27 kinds of manufacturing conditions (condition No. 1-1 to condition No. 1-27) and an accumulation degree of {200} planes and an accumulation degree of {222} planes were studied.

Base metal plates used in the first experiment contained C: 0.0001 mass %, Si: 0.0001 mass %, Al: 0.0002 mass %, and inevitable impurities, with the balance being Fe. The base metal plates were fabricated in such manner that an ingot was produced by vacuum melting, followed by hot rolling and cold rolling. In the hot rolling, the ingot with a 230 mm thickness heated to 1000° C. was thinned to a 50 mm thickness, whereby a hot-rolled plate was obtained. Thereafter, plate materials different in thickness were cut out from the hot-rolled plate by machining, and the plate materials were subjected to the cold rolling with rolling reduction ratios listed in Table 1. Thicknesses of the obtained base metal plates (cold-rolled plates) are listed in Table 1.

Next, dislocation density of each of the base metal plates was measured with a transmission electron microscope. In this measurement, a thin film sample with which a texture of a cross section perpendicular to a surface of each of the base metal plates could be observed was fabricated, and a region from the surface to a thickness-direction center of the base metal plate was observed. Then, texture photographs were taken at several places in this region, and the dislocation density was found from the number of dislocation lines. Average values of the obtained dislocation densities are listed in Table 1.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, it was found that, as rolled, the accumulation degree of the {200} planes in the α phase was within a 20% to 26% range and the accumulation degree of the {222} planes in the α phase was an 18% to 24% range, in each of the base metal plates.

Thereafter, Al layers as the metal layers were formed on a front surface and a rear surface of each of the base metal plates by an ion plating (IP) method or a hot dipping method, except in the condition No. 1-1. Thickness of each of the metal layers (total thickness on the both surfaces) is listed in Table 1. The metal layers whose thickness (total thickness on the both surfaces) was 0.01 µm to 0.4 µm were formed by the IP method, and the metal layers whose thickness (total thickness on the both surfaces) was 13 µm to 150 µm were formed by the hot dipping method. The total thickness on the both surfaces is a value obtained by summing the thickness measured on one surface and the thickness measured on the other surface.

Subsequently, heat treatment was applied on the base metal plates on which the metal layers were formed, under various conditions. A gold image furnace was used for the heat treatment, and the temperature increasing rate and the keeping time were variously controlled by program control. The temperature increase and the temperature keeping were performed in an atmosphere vacuumed to $10^{-3}$ Pa level. At the time of cooling at a cooling rate of 1° C./sec or lower, temperature control was performed in vacuum by furnace output control. At the time of cooling at a cooling rate of 10° C./sec or more, Ar gas was introduced and the cooling rate was controlled by the adjustment of its flow rate. In this manner, 27 kinds of Fe-based metal plates were manufactured.

Further, in the heat treatment, three samples were prepared per condition, and the accumulation degree of the {200} planes in the α phase and the accumulation degree of the {222} planes in the α phase were measured at three stages of the heat treatment.

One of the samples (first sample) was heated from room temperature to the A3 point (911° C.) at each temperature increasing rate listed in Table 1, and was cooled to room temperature immediately at a cooling rate of 100° C./sec, except in the condition No. 1-2. In the condition No. 1-2, the sample was heated to 900° C. and was immediately cooled to room temperature at a cooling rate of 100° C./sec. Then, the accumulation degree of the {200} planes in the α phase and the accumulation degree of the {222} planes in the α phase were measured. Results of these are listed in Table 1.

Another sample (second sample) was heated from room temperature to 1000° C. at the same temperature increasing rate as that for the first sample, was kept at 1000° C. for each time listed in Table 1, and was cooled to room temperature at a cooling rate of 100° C./sec, except in No. 1-2. In the condition No. 1-2, the sample was heated to 900° C., was kept at 900° C. for the time listed in Table 1, and was cooled to room temperature at a cooling rate of 100° C./sec. Then, the accumulation degree of the {200} planes in the α phase and the accumulation degree of the {222} planes in the α phase were measured. Results of these are listed in Table 1.

The other one sample (third sample) was heated and was kept at 900° C. or 1000° C. similarly to the second sample, and thereafter was cooled to room temperature at each cooling rate listed in Table 1. Then, the accumulation degree of the {200} planes in the α phase and the accumulation degree of the {222} planes in the α phase were measured. Results of these are listed in Table 1. In the measurement of the accumulation degree of the {200} planes in the α phase and the accumulation degree of the {222} planes in the α phase in the third samples, when the whole Fe-based alloy plate was alloyed, a thickness-direction center region was an evaluation target, and when an unalloyed region existed in the Fe-based alloy plate, the unalloyed region was an evaluation target. Distances of these evaluation targets from the surface of the Fe-based alloy plate are listed in Table 1 (column of "distance"). In fabricating test pieces, portions above the evaluation targets were removed so that the evaluation targets were exposed.

TABLE 1

| | CONDITION No. | BASE METAL PLATE | | | METAL LAYER | | HEATING RATE (° C./s) | FIRST SAMPLE | | |
|---|---|---|---|---|---|---|---|---|---|---|
| | | REDUCTION RATIO (%) | DISLOCATION DENSITY (m/m³) | THICKNESS (μm) | ELEMTNT | THICKNESS (μm) | | MEASURED TEMPERATURE (° C.) | ACCUMULATION DEGREE OF [200] PLANE (%) | ACCUMULATION DEGREE OF [222] PLANE (%) |
| COMPARATIVE EXAMPLE | 1-1 | 97.6 | $2 \times 10^{10}$ | 150 | NONE | | 10 | 911 | 22 | 12 |
| EXAMPLE OF PRESENT INVENTION | 1-2 | 97.6 | $2 \times 10^{16}$ | 150 | Al | 20 | 10 | 900 | 23 | 12 |
| | 1-3 | 95 | $6 \times 10^{14}$ | 150 | Al | 20 | 10 | 911 | 27 | 11 |
| | 1-4 | 97.6 | $2 \times 10^{16}$ | 150 | Al | 20 | 10 | 911 | 38 | 9 |
| | 1-5 | 99.8 | $7 \times 10^{18}$ | 150 | Al | 20 | 10 | 911 | 42 | 5.3 |
| | 1-6 | 97.6 | $2 \times 10^{15}$ | 8 | Al | 0.01 | 10 | 911 | 38 | 9 |
| | 1-7 | 97.6 | $2 \times 10^{16}$ | 30 | Al | 0.4 | 10 | 911 | 38 | 9 |
| | 1-8 | 97.6 | $2 \times 10^{10}$ | 350 | Al | 13 | 10 | 911 | 38 | 9 |
| | 1-9 | 97.6 | $2 \times 10^{16}$ | 500 | Al | 50 | 10 | 911 | 38 | 9 |
| | 1-10 | 97.6 | $2 \times 10^{16}$ | 750 | Al | 150 | 10 | 911 | 38 | 9 |
| | 1-11 | 97.6 | $2 \times 10^{16}$ | 150 | Al | 20 | 500 | 911 | 27 | 11 |
| | 1-12 | 97.6 | $2 \times 10^{10}$ | 150 | Al | 20 | 100 | 911 | 34 | 10 |
| | 1-13 | 97.6 | $2 \times 10^{16}$ | 150 | Al | 20 | 1 | 911 | 42 | 5.2 |
| | 1-14 | 97.6 | $2 \times 10^{16}$ | 150 | Al | 20 | 0.1 | 911 | 38 | 9 |
| | 1-15 | 97.6 | $2 \times 10^{15}$ | 160 | Al | 20 | 0.01 | 911 | 31 | 14 |
| | 1-16 | 97.6 | $2 \times 10^{16}$ | 150 | Al | 20 | 10 | 911 | 38 | 9 |
| | 1-17 | 97.6 | $2 \times 10^{15}$ | 150 | Al | 20 | 10 | 911 | 38 | 9 |
| | 1-18 | 97.6 | $2 \times 10^{15}$ | 150 | Al | 20 | 10 | 911 | 38 | 9 |
| | 1-19 | 97.6 | $2 \times 10^{10}$ | 150 | Al | 20 | 10 | 911 | 38 | 9 |
| | 1-20 | 97.6 | $2 \times 10^{15}$ | 150 | Al | 20 | 10 | 911 | 38 | 9 |
| | 1-21 | 97.6 | $2 \times 10^{15}$ | 150 | Al | 20 | 10 | 911 | 38 | 9 |
| | 1-22 | 97.6 | $2 \times 10^{15}$ | 150 | Al | 20 | 10 | 911 | 38 | 9 |
| | 1-23 | 97.6 | $2 \times 10^{16}$ | 150 | Al | 20 | 10 | 911 | 38 | 9 |
| | 1-24 | 97.6 | $2 \times 10^{16}$ | 150 | Al | 20 | 10 | 911 | 38 | 9 |
| | 1-25 | 97.6 | $2 \times 10^{16}$ | 150 | Al | 20 | 10 | 911 | 38 | 9 |
| | 1-26 | 97.6 | $2 \times 10^{15}$ | 150 | Al | 20 | 10 | 911 | 38 | 9 |
| | 1-27 | 97.6 | $2 \times 10^{15}$ | 150 | Al | 20 | 10 | 911 | 38 | 9 |

| | CONDITION No. | SECOND SAMPLE | | | | THIRD SAMPLE | | | |
|---|---|---|---|---|---|---|---|---|---|
| | | KEEPING TEMPERATURE (° C.) | KEEPING TIME (s) | ACCUMULATION DEGREE OF [200] PLANE (%) | ACCUMULATION DEGREE OF [222] PLANE (%) | COOLING RATE (° C./s) | DISTANCE (μm) | ACCUMULATION DEGREE OF [200] PLANE (%) | ACCUMULATION DEGREE OF [222] PLANE (%) |
| COMPARATIVE EXAMPLE | 1-1 | 1000 | 10 | 13 | 13 | 100 | 75 | 13 | 13 |
| EXAMPLE OF PRESENT INVENTION | 1-2 | 900 | 10 | 24 | 12 | 100 | 78 | 24 | 12 |
| | 1-3 | 1000 | 10 | 38 | 8 | 100 | 78 | 38 | 8 |
| | 1-4 | 1000 | 10 | 48 | 3.8 | 100 | 78 | 48 | 3.8 |
| | 1-5 | 1000 | 10 | 72 | 0.2 | 100 | 78 | 72 | 0.2 |
| | 1-6 | 1000 | 10 | 39 | 10 | 100 | 4 | 39 | 10 |
| | 1-7 | 1000 | 10 | 40 | 8 | 100 | 16 | 40 | 8 |
| | 1-8 | 1000 | 10 | 48 | 3.8 | 100 | 190 | 48 | 3.8 |
| | 1-9 | 1000 | 10 | 48 | 3.8 | 100 | 250 | 48 | 3.8 |
| | 1-10 | 1000 | 10 | 41 | 11 | 100 | 320 | 30 | 15 |
| | 1-11 | 1000 | 10 | 39 | 8 | 100 | 78 | 39 | 8 |
| | 1-12 | 1000 | 10 | 44 | 4.3 | 100 | 78 | 44 | 4.3 |
| | 1-13 | 1000 | 10 | 55 | 2.1 | 100 | 78 | 55 | 11 |
| | 1-14 | 1000 | 10 | 52 | 2.8 | 100 | 78 | 52 | 2.8 |
| | 1-15 | 1000 | 10 | 40 | 8 | 100 | 78 | 40 | 8 |
| | 1-16 | 1100 | 10 | 58 | 2.2 | 100 | 78 | 58 | 2.2 |
| | 1-17 | 1250 | 10 | 63 | 1.3 | 100 | 78 | 63 | 1.3 |
| | 1-18 | 1350 | 10 | 67 | 0.4 | 100 | 78 | 67 | 0.4 |
| | 1-19 | 1000 | 0 | 42 | 8.5 | 100 | 78 | 42 | 8.5 |
| | 1-20 | 1000 | 60 | 55 | 2.1 | 100 | 78 | 55 | 2.1 |
| | 1-21 | 1000 | 600 | 60 | 1.7 | 100 | 78 | 60 | 1.7 |
| | 1-22 | 1000 | 3600 | 63 | 1.3 | 100 | 78 | 63 | 1.3 |
| | 1-23 | 1000 | 36000 | 64 | 1.2 | 100 | 78 | 64 | 1.2 |
| | 1-24 | 1000 | 10 | 48 | 3.8 | 1000 | 78 | 39 | 8 |
| | 1-25 | 1000 | 10 | 48 | 3.8 | 10 | 78 | 48 | 3.8 |
| | 1-26 | 1000 | 10 | 48 | 3.8 | 1 | 78 | 48 | 3.8 |
| | 1-27 | 1000 | 10 | 48 | 3.8 | 0.1 | 78 | 48 | 3.8 |

Further, an alloying ratio of the metal layer and a ratio of an α single phase region in each of the Fe-based metal plates were measured in the following manner. First, in-plane distribution of the Fe content and in-plane distribution of the Al content in the cross section perpendicular to the surface of the Fe-based metal plate were measured by an EPMA (Electron Probe Micro-Analysis) method. At this time, as for a field of view, its dimension in a direction parallel to the surface of the Fe-based metal plate (rolling direction) was set to 1 mm and its dimension in the thickness direction was set to a thickness of the Fe-based metal plate. Then, a region where the Fe content was 0.5 mass % or less and the Al content was 99.5 mass % or more was regarded as an alloy layer, and the alloying ratio was found from the aforesaid expression (3). Further, a region where the Al content was 0.9 mass % or more was regarded as an alloy region, and the ratio of the α single phase region was found from the aforesaid expression (4). Results of these are listed in Table 2.

Further, magnetic flux density B50 and saturation magnetic flux density Bs to a magnetizing force of 5000 A/m were measured. In the measurement of the magnetic flux density B50, a SST (Single Sheet Tester) was used, and a measurement frequency was set to 50 Hz. In the measurement of the saturation magnetic flux density Bs, a VSM (Vibrating Sample Magnetometer) was used and a magnetizing force of $0.8 \times 10^6$ A/m was applied. Then, a ratio B50/Bs of the magnetic flux density B50 to the saturation magnetic flux density Bs was calculated. Results of these are listed in Table 2.

accumulation degree of the {200} planes in the α phase was not obtained and a good magnetic property was not obtained even though high-density dislocation existed in the base metal plate. In the condition No. 1-2 being a comparative example, since the heating temperature was lower than the A3 point (911° C.), improvement in the accumulation degree of the {200} planes in the α phase owing to the γ-α transformation was not caused, and a good magnetic property was not obtained.

Second Experiment

In a second experiment, six kinds of base metal plates different in composition were used, and various kinds of materials were used as the metal layers, and correlations between 73 kinds of conditions (condition No. 2-1 to condition No. 2-73) and an accumulation degree of {200} planes and an accumulation degree of {222} planes were studied.

Components contained in six kinds of the base metal plates used in the second experiment are listed in Table 3. The

TABLE 2

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs |
|---|---|---|---|---|---|---|---|---|
| COMPARATIVE | 1-1 | — | 0 | 13 | 13 | 1.70 | 2.16 | 0.79 |
| EXAMPLE | 1-2 | 73 | 0.9 | 24 | 12 | 1.55 | 1.95 | 0.79 |
| EXAMPLE | 1-3 | 87 | 35 | 38 | 8 | 1.71 | 1.95 | 0.88 |
| OF | 1-4 | 87 | 35 | 48 | 3.8 | 1.74 | 1.95 | 0.89 |
| PRESENT | 1-5 | 87 | 35 | 72 | 0.2 | 1.84 | 1.95 | 0.94 |
| INVENTION | 1-6 | 100 | 100 | 39 | 10 | 1.88 | 2.14 | 0.88 |
| | 1-7 | 100 | 81 | 40 | 8 | 1.90 | 2.14 | 0.89 |
| | 1-8 | 75 | 23 | 48 | 3.8 | 1.89 | 2.10 | 0.90 |
| | 1-9 | 60 | 13 | 48 | 3.8 | 1.78 | 2.00 | 0.89 |
| | 1-10 | 40 | 4 | 41 | 11 | 1.61 | 1.85 | 0.87 |
| | 1-11 | 31 | 3 | 39 | 8 | 1.72 | 1.95 | 0.88 |
| | 1-12 | 54 | 13 | 44 | 4.3 | 1.72 | 1.95 | 0.88 |
| | 1-13 | 94 | 47 | 55 | 2.1 | 1.76 | 1.95 | 0.90 |
| | 1-14 | 100 | 61 | 52 | 2.8 | 1.75 | 1.95 | 0.90 |
| | 1-15 | 100 | 75 | 40 | 8 | 1.73 | 1.95 | 0.89 |
| | 1-16 | 100 | 34 | 58 | 2.2 | 1.77 | 1.95 | 0.91 |
| | 1-17 | 100 | 64 | 63 | 1.3 | 1.80 | 1.95 | 0.92 |
| | 1-18 | 100 | 86 | 67 | 0.4 | 1.82 | 1.95 | 0.93 |
| | 1-19 | 68 | 1.1 | 42 | 8.5 | 1.74 | 1.95 | 0.89 |
| | 1-20 | 95 | 54 | 55 | 2.1 | 1.75 | 1.95 | 0.90 |
| | 1-21 | 100 | 65 | 60 | 1.7 | 1.78 | 1.95 | 0.91 |
| | 1-22 | 100 | 85 | 63 | 1.3 | 1.81 | 1.95 | 0.93 |
| | 1-23 | 100 | 100 | 64 | 1.2 | 1.80 | 1.95 | 0.92 |
| | 1-24 | 87 | 35 | 48 | 3.8 | 1.72 | 1.95 | 0.88 |
| | 1-25 | 87 | 35 | 48 | 3.8 | 1.74 | 1.95 | 0.89 |
| | 1-26 | 87 | 35 | 48 | 3.8 | 1.74 | 1.95 | 0.89 |
| | 1-27 | 87 | 35 | 48 | 3.8 | 1.74 | 1.95 | 0.89 |

As listed in Table 1, in examples of the present invention (conditions No. 1-3 to No. 1-27), the accumulation degree of the {200} planes in the α phase was high at each of the stages of the heat treatment. Further, as listed in Table 2, in the examples of the present invention, the alloying ratio and the ratio of the α single phase region were high. As listed in Table 2, according to the examples of the present invention, the Fe-based metal plates in which the accumulation degree of the {200} planes in the α phase was not less than 30% nor more than 99% and the accumulation degree of the {222} planes in the α phase was not less than 0.01% nor more than 30% were obtained. Further, in the Fe-based metal plates of the examples of the present invention, the ratio B50/Bs was 0.87 or more. That is, according to the examples of the present invention, an excellent magnetic property was obtained.

On the other hand, in the condition No. 1-1 being a comparative example, since the metal layer was not formed, a high balance of the base metal plates was Fe and inevitable impurities. Table 3 also lists actually measured values of A3 points of the base metal plates. The base metal plates were fabricated in such a manner that an ingot was produced by vacuum melting, followed by hot rolling and cold rolling. In the hot rolling, the ingot with a 230 mm thickness heated to 1000° C. was thinned to a 50 mm thickness, whereby a hot-rolled plate was obtained. Thereafter, plate materials different in thickness were cut out from the hot-rolled plate by machining, and the plate materials were subjected to the cold rolling with rolling reduction ratios listed in Table 4, subjected to shot blasting, or subjected to the both. In the shot blasting, iron beads each with a 1 mm to 3 mm diameter were made to continuously collide with both surfaces of the base metal plates for ten seconds each. Whether the shot blasting was performed or not and the thickness of each of the obtained base metal plates (cold-rolled plates) are listed in Table 4 and Table 5.

TABLE 3

| COMPOSITION OF | COMPONENT ELEMENT (mass %) | | | | | | | | | A3 POINT |
|---|---|---|---|---|---|---|---|---|---|---|
| BASE METAL PLATE | C | Si | Mn | Al | P | N | S | O | OTHERS | (° C.) |
| A | 0.0003 | 0.05 | 0.15 | 0.0005 | 0.0001 | 0.0002 | <0.0004 | 0.0002 | Ti: 0.03 | 910 |
| B | 0.0002 | 0.1 | 0.12 | 0.0002 | 0.0001 | 0.0003 | <0.0004 | 0.0001 | Zr: 0.02 | 911 |
| C | 0.0002 | 0.3 | 0.08 | 0.05 | 0.0001 | 0.0003 | <0.0004 | 0.0001 | | 916 |
| D | 0.0001 | 0.4 | 0.12 | 0.15 | 0.0001 | 0.0002 | <0.0004 | 0.0001 | | 922 |
| E | 0.0001 | 0.5 | 1.0 | 0.21 | 0.0001 | 0.0003 | <0.0004 | 0.0001 | Cr: 2.0 | 914 |
| F | 0.0001 | 0.01 | 1.7 | 0.01 | 0.0001 | 0.0002 | <0.0004 | 0.0001 | | 872 |

Next, dislocation density of each of the base metal plates was measured with a transmission electron microscope in the same manner as in the first experiment. Here, in each of the base metal plates having undergone the blasting, since a texture with high dislocation density was observed in a region 50 µm from the surface, dislocation density in this region was measured. Average values of the obtained dislocation densities are listed in Table 4 and Table 5.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, and it was found that, as rolled, the accumulation degree of the {200} planes in the α phase was within a 19% to 27% range and the accumulation degree of the {222} planes in the α phase was within a 18% to 25% range in each of the base metal plates.

Thereafter, metal layers were formed on a front Surface and a rear surface of each of the base metal plates by an IP method, a hot dipping method, a sputtering method, or a vapor deposition method, except in the conditions No. 2-1, No. 2-13, No. 2-25, No. 2-37, No. 2-43, No. 2-49, No. 2-55, No. 2-61, and No. 2-67. Thickness of each of the metal layers (total thickness on the both surfaces) is listed in Table 4 and Table 5. Si layers were formed by the IP method, Sn layers were formed by the hot dipping method, and Ti layers were formed by the sputtering method. Further, Ga layers were formed by the vapor deposition method, Ge layers were formed by the vapor deposition method, No layers were formed by the sputtering method, V layers were formed by the sputtering method, Cr layers were formed by the sputtering method, and As layers were formed by the vapor deposition method.

Subsequently, heat treatment was applied on the base metal plates, on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 4 and Table 5.

TABLE 4

| | | | BASE METAL PLATE | | | | METAL LAYER | |
|---|---|---|---|---|---|---|---|---|
| | CONDITION No. | COMPO- SITION | BLASTING | REDUCTION RATE (%) | DISLOCATION DENSITY (m/m$^3$) | THICKNESS (µm) | ELEMENT | THICKNESS (µm) |
| COMPARATIVE | 2-1 | A | WITHOUT | 97.2 | $1 \times 10^{16}$ | 250 | NONE | |
| EXAMPLE | 2-2 | A | WITHOUT | 97.2 | $1 \times 10^{16}$ | 250 | Si | 33 |
| EXAMPLE | 2-3 | A | WITHOUT | 971 | $1 \times 10^{16}$ | 250 | Si | 33 |
| OF | 2-4 | A | WITHOUT | 972 | $1 \times 10^{16}$ | 250 | Si | 33 |
| PRESENT | 2-5 | A | WITHOUT | 97.2 | $1 \times 10^{16}$ | 250 | Si | 33 |
| INVENTION | 2-6 | A | WITHOUT | 97.2 | $1 \times 10^{16}$ | 250 | Si | 33 |
| | 2-7 | B | WITH | 0 | $1 \times 10^{14}$ | 350 | Si | 38 |
| | 2-8 | B | WITH | 49 | $8 \times 10^{14}$ | 350 | Si | 38 |
| | 2-9 | B | WITH | 50 | $1 \times 10^{15}$ | 350 | Si | 38 |
| | 2-10 | B | WITH | 70 | $6 \times 10^{15}$ | 350 | Si | 38 |
| | 2-11 | B | WITH | 90 | $5 \times 10^{15}$ | 350 | Si | 38 |
| | 2-12 | B | WITH | 97 | $1 \times 10^{17}$ | 350 | Si | 38 |
| COMPARATIVE | 2-13 | C | WITHOUT | 98.2 | $3 \times 10^{16}$ | 326 | NONE | |
| EXAMPLE | 2-14 | C | WITHOUT | 98.2 | $3 \times 10^{16}$ | 326 | Sn | 17 |
| EXAMPLE | 2-15 | C | WITHOUT | 98.2 | $3 \times 10^{16}$ | 326 | Sn | 17 |
| OF | 2-16 | C | WITHOUT | 98.2 | $3 \times 10^{16}$ | 326 | Sn | 17 |
| PRESENT | 2-17 | C | WITHOUT | 98.2 | $3 \times 10^{16}$ | 326 | Sn | 17 |
| INVENTION | 2-18 | C | WITHOUT | 98.2 | $3 \times 10^{16}$ | 326 | Sn | 17 |
| | 2-19 | D | WITH | 0 | $1 \times 10^{14}$ | 500 | Sn | 23 |
| | 2-20 | D | WITH | 49 | $7 \times 10^{14}$ | 500 | Sn | 23 |
| | 2-21 | D | WITH | 50 | $1 \times 10^{15}$ | 500 | Sn | 23 |
| | 2-22 | D | WITH | 70 | $5 \times 10^{15}$ | 500 | Sn | 23 |
| | 2-23 | D | WITH | 90 | $7 \times 10^{16}$ | 500 | Sn | 23 |
| | 2-24 | D | WITH | 97 | $1 \times 10^{17}$ | 500 | Sn | 23 |
| COMPARATIVE | 2-25 | E | WITHOUT | 97.1 | $2 \times 10^{16}$ | 100 | NONE | |
| EXAMPLE | 2-26 | E | WITHOUT | 97.1 | $2 \times 10^{16}$ | 100 | Ti | 8 |
| EXAMPLE | 2-27 | E | WITHOUT | 97.1 | $2 \times 10^{16}$ | 100 | Ti | 8 |
| OF | 2-28 | E | WITHOUT | 97.1 | $2 \times 10^{16}$ | 100 | Ti | 8 |
| PRESENT | 2-29 | E | WITHOUT | 97.1 | $2 \times 10^{16}$ | 100 | Ti | 8 |
| INVENTION | 2-30 | E | WITHOUT | 97.1 | $2 \times 10^{16}$ | 100 | Ti | 8 |
| | 2-31 | F | WITH | 0 | $1 \times 10^{14}$ | 700 | Ti | 29 |

TABLE 4-continued

| | | | | | | | | |
|---|---|---|---|---|---|---|---|---|
| | 2-32 | F | WITH | 49 | $8 \times 10^{14}$ | 700 | Ti | 29 |
| | 2-33 | F | WITH | 50 | $1 \times 10^{15}$ | 700 | Ti | 29 |
| | 2-34 | F | WITH | 70 | $7 \times 10^{15}$ | 700 | Ti | 29 |
| | 2-35 | F | WITH | 90 | $5 \times 10^{16}$ | 700 | Ti | 29 |
| | 2-36 | F | WITH | 97 | $1 \times 10^{17}$ | 700 | Ti | 29 |

| | | | FIRST SAMPLE | | | SECOND SAMPLE | |
|---|---|---|---|---|---|---|---|
| | CONDITION No. | HETING RATE (°C./s) | MEASURED TEMPERATURE (°C.) | ACCUMULATION DEGREE OF [200] PLANE (%) | ACCUMULATION DEGREE OF [222] PLANE (%) | KEEPING TEMPERATURE (°C.) | KEEPING TIME (s) |
| COMPARATIVE EXAMPLE | 2-1 | 20 | 910 | 18 | 14 | 1000 | 20 |
| | 2-2 | 20 | 900 | 21 | 13 | 900 | 20 |
| EXAMPLE OF PRESENT INVENTION | 2-3 | 20 | 910 | 36 | 8 | 1000 | 20 |
| | 2-4 | 20 | 910 | 36 | 8 | 1100 | 20 |
| | 2-5 | 20 | 910 | 35 | 8 | 1250 | 20 |
| | 2-6 | 20 | 910 | 35 | 8 | 1350 | 20 |
| | 2-7 | 10 | 911 | 25 | 13 | 1200 | 120 |
| | 2-8 | 10 | 911 | 26 | 11 | 1200 | 120 |
| | 2-9 | 10 | 911 | 27 | 10 | 1200 | 120 |
| | 2-10 | 10 | 911 | 39 | 7 | 1200 | 120 |
| | 2-11 | 10 | 911 | 41 | 5.1 | 1200 | 120 |
| | 2-12 | 10 | 911 | 48 | 4.2 | 1200 | 120 |
| COMPARATIVE EXAMPLE | 2-13 | 8 | 916 | 19 | 12 | 1000 | 40 |
| | 2-14 | 8 | 900 | 24 | 12 | 900 | 40 |
| EXAMPLE OF PRESENT INVENTION | 2-15 | 8 | 916 | 45 | 5.7 | 1000 | 40 |
| | 2-16 | 8 | 916 | 45 | 5.7 | 1100 | 40 |
| | 2-17 | 8 | 916 | 45 | 5.7 | 1250 | 40 |
| | 2-18 | 8 | 916 | 45 | 5.7 | 1350 | 40 |
| | 2-19 | 1 | 922 | 25 | 13 | 1050 | 1800 |
| | 2-20 | 1 | 922 | 26 | 11 | 1050 | 1800 |
| | 2-21 | 1 | 922 | 27 | 10 | 1050 | 1800 |
| | 2-22 | 1 | 922 | 37 | 8 | 1050 | 1800 |
| | 2-23 | 1 | 922 | 42 | 5.2 | 1050 | 1800 |
| | 2-24 | 1 | 922 | 46 | 5.6 | 1050 | 1800 |
| COMPARATIVE EXAMPLE | 2-25 | 10 | 914 | 19 | 12 | 1000 | 40 |
| | 2-26 | 10 | 900 | 23 | 12 | 900 | 40 |
| EXAMPLE OF PRESENT INVENTION | 2-27 | 10 | 914 | 45 | 5.7 | 1000 | 40 |
| | 2-28 | 10 | 914 | 45 | 5.7 | 1100 | 40 |
| | 2-29 | 10 | 914 | 45 | 5.7 | 1250 | 40 |
| | 2-30 | 10 | 914 | 45 | 5.7 | 1350 | 40 |
| | 2-31 | 0.1 | 872 | 25 | 12 | 950 | 350 |
| | 2-32 | 0.1 | 872 | 25 | 11 | 950 | 360 |
| | 2-33 | 0.1 | 872 | 27 | 10 | 950 | 360 |
| | 2-34 | 0.1 | 872 | 38 | 7 | 950 | 380 |
| | 2-35 | 0.1 | 872 | 41 | 8 | 950 | 360 |
| | 2-36 | 0.1 | 872 | 43 | 5.3 | 950 | 360 |

| | | SECOND SAMPLE | | THIRD SAMPLE | | | |
|---|---|---|---|---|---|---|---|
| | CONDITION No. | ACCUMULATION DEGREE OF [200] PLANE (%) | ACCUMULATION DEGREE OF [222] PLANE (%) | COOLING RATE (°C./s) | DISTANCE (μm) | ACCUMULATION DEGREE OF [200] PLANE (%) | ACCUMULATION DEGREE OF [222] PLANE (%) |
| COMPARATIVE EXAMPLE | 2-1 | 13 | 13 | 200 | 125 | 13 | 13 |
| | 2-2 | 23 | 11 | 200 | 132 | 23 | 11 |
| EXAMPLE OF PRESENT INVENTION | 2-3 | 49 | 3.9 | 200 | 132 | 49 | 3.9 |
| | 2-4 | 60 | 1.9 | 200 | 132 | 60 | 1.9 |
| | 2-5 | 75 | 0.5 | 200 | 132 | 75 | 0.5 |
| | 2-6 | 74 | 0.6 | 200 | 132 | 74 | 0.6 |
| | 2-7 | 30 | 12 | 80 | 185 | 30 | 12 |
| | 2-8 | 31 | 10 | 80 | 185 | 31 | 10 |
| | 2-9 | 41 | 5.8 | 80 | 185 | 41 | 5.8 |
| | 2-10 | 72 | 0.9 | 80 | 185 | 72 | 0.9 |
| | 2-11 | 75 | 0.8 | 80 | 185 | 75 | 0.8 |
| | 2-12 | 92 | 0.1 | 80 | 185 | 92 | 0.1 |
| COMPARATIVE EXAMPLE | 2-13 | 13 | 13 | 50 | 163 | 13 | 13 |
| | 2-14 | 25 | 12 | 50 | 175 | 25 | 12 |
| EXAMPLE OF PRESENT INVENTION | 2-15 | 53 | 2.5 | 50 | 175 | 53 | 2.5 |
| | 2-16 | 73 | 0.6 | 50 | 175 | 73 | 0.6 |
| | 2-17 | 95 | 0.1 | 50 | 175 | 95 | 0.1 |
| | 2-18 | 74 | 0.8 | 50 | 175 | 74 | 0.8 |
| | 2-19 | 30 | 10 | 100 | 265 | 30 | 10 |
| | 2-20 | 35 | 9 | 100 | 265 | 35 | 9 |
| | 2-21 | 43 | 5.4 | 100 | 265 | 43 | 5.4 |
| | 2-22 | 69 | 1.5 | 100 | 265 | 69 | 1.5 |

TABLE 4-continued

|  | | | | | | | |
|---|---|---|---|---|---|---|---|
|  | 2-23 | 73 | 0.8 | 100 | 265 | 73 | 0.8 |
|  | 2-24 | 77 | 0.5 | 100 | 265 | 77 | 0.6 |
| COMPARATIVE | 2-25 | 13 | 13 | 10 | 50 | 13 | 13 |
| EXAMPLE | 2-26 | 25 | 12 | 10 | 54 | 25 | 12 |
| EXAMPLE | 2-27 | 53 | 2.5 | 10 | 54 | 53 | 2.5 |
| OF | 2-28 | 73 | 0.6 | 10 | 54 | 73 | 0.6 |
| PRESENT | 2-29 | 95 | 0.1 | 10 | 54 | 95 | 0.1 |
| INVENTION | 2-30 | 74 | 0.8 | 10 | 54 | 74 | 0.8 |
|  | 2-31 | 31 | 9 | 80 | 280 | 30 | 9 |
|  | 2-32 | 32 | 10 | 80 | 280 | 30 | 12 |
|  | 2-33 | 41 | 6 | 80 | 280 | 36 | 9 |
|  | 2-34 | 52 | 2.8 | 80 | 280 | 46 | 6 |
|  | 2-35 | 58 | 2.1 | 80 | 280 | 50 | 2.9 |
|  | 2-36 | 63 | 1.6 | 80 | 280 | 54 | 2.9 |

TABLE 5

|  | | BASE METAL PLATE | | | | | METAL LAYER | |
|---|---|---|---|---|---|---|---|---|
|  | CONDITION No. | COMPO-SITION | BLASTING | REDUCTION RATE (%) | DISLOCATION DENSITY (m/m$^3$) | THICKNESS (μm) | ELEMENT | THICKNESS (μm) |
| COMPARATIVE | 2-37 | A | WITH | 70 | 8 × 10$^{15}$ | 350 | NONE | |
| EXAMPLE | 2-38 | A | WITH | 70 | 8 × 10$^{15}$ | 350 | Ga | 18 |
| EXAMPLE | 2-39 | A | WITH | 70 | 8 × 10$^{15}$ | 350 | Ga | 18 |
| OF | 2-40 | A | WITH | 70 | 8 × 10$^{15}$ | 350 | Ga | 18 |
| PRESENT | 2-41 | A | WITH | 70 | 8 × 10$^{15}$ | 350 | Ga | 18 |
| INVENTION | 2-42 | A | WITH | 70 | 8 × 10$^{15}$ | 350 | Ga | 18 |
| COMPARATIVE | 2-43 | B | WITH | 78 | 7 × 10$^{18}$ | 240 | NONE | |
| EXAMPLE | 2-44 | B | WITH | 78 | 7 × 10$^{18}$ | 240 | Ge | 11 |
| EXAMPLE | 2-45 | B | WITH | 78 | 7 × 10$^{18}$ | 240 | Ge | 11 |
| OF | 2-46 | B | WITH | 78 | 7 × 10$^{18}$ | 240 | Ge | 11 |
| PRESENT | 2-47 | B | WITH | 78 | 7 × 10$^{18}$ | 240 | Ge | 11 |
| INVENTION | 2-48 | B | WITH | 78 | 7 × 10$^{18}$ | 240 | Ge | 11 |
| COMPARATIVE | 2-49 | C | WITH | 50 | 1 × 10$^{17}$ | 500 | NONE | |
| EXAMPLE | 2-50 | C | WITH | 50 | 1 × 10$^{17}$ | 500 | Mo | 8 |
| EXAMPLE | 2-51 | C | WITH | 50 | 1 × 10$^{17}$ | 500 | Mo | 8 |
| OF | 2-52 | C | WITH | 50 | 1 × 10$^{17}$ | 500 | Mo | 8 |
| PRESENT | 2-53 | C | WITH | 50 | 1 × 10$^{17}$ | 500 | Mo | 8 |
| INVENTION | 2-54 | C | WITH | 50 | 1 × 10$^{17}$ | 500 | Mo | 8 |
| COMPARATIVE | 2-55 | D | WITH | 90 | 3 × 10$^{16}$ | 150 | NONE | |
| EXAMPLE | 2-56 | D | WITH | 90 | 3 × 10$^{16}$ | 150 | V | 6 |
| EXAMPLE | 2-57 | D | WITH | 90 | 3 × 10$^{16}$ | 150 | V | 6 |
| OF | 2-58 | D | WITH | 90 | 3 × 10$^{16}$ | 150 | V | 6 |
| PRESENT | 2-59 | D | WITH | 90 | 3 × 10$^{16}$ | 150 | V | 6 |
| INVENTION | 2-60 | D | WITH | 90 | 3 × 10$^{16}$ | 150 | V | 6 |
| COMPARATIVE | 2-61 | E | WITH | 95 | 6 × 10$^{16}$ | 100 | NONE | |
| EXAMPLE | 2-62 | E | WITH | 95 | 6 × 10$^{16}$ | 100 | Cr | 5 |
| EXAMPLE | 2-63 | E | WITH | 95 | 6 × 10$^{16}$ | 100 | Cr | 5 |
| OF | 2-64 | E | WITH | 95 | 6 × 10$^{16}$ | 100 | Cr | 5 |
| PRESENT | 2-65 | E | WITH | 95 | 6 × 10$^{16}$ | 100 | Cr | 5 |
| INVENTION | 2-66 | E | WITH | 95 | 6 × 10$^{16}$ | 100 | Cr | 5 |
| COMPARATIVE | 2-67 | F | WITH | 80 | 2 × 10$^{15}$ | 200 | NONE | |
| EXAMPLE | 2-68 | F | WITH | 80 | 2 × 10$^{15}$ | 200 | As | 11 |
| EXAMPLE | 2-69 | F | WITH | 80 | 2 × 10$^{15}$ | 200 | As | 11 |
| OF | 2-70 | F | WITH | 80 | 2 × 10$^{15}$ | 200 | As | 11 |
| PRESENT | 2-71 | F | WITH | 80 | 2 × 10$^{15}$ | 200 | AS | 11 |
| INVENTION | 2-72 | F | WITH | 80 | 2 × 10$^{15}$ | 200 | As | 11 |
|  | 2-73 | F | WITH | 80 | 2 × 10$^{15}$ | 200 | As | 11 |

|  | | FIRST SAMPLE | | | | SECOND SAMPLE | |
|---|---|---|---|---|---|---|---|
|  | CONDITION No. | HETING RATE (° C./s) | MEASURED TEMPERATURE (° C.) | ACCUMULATION DEGREE OF {200} PLANE (%) | ACCUMULATION DEGREE OF {222} PLANE (%) | KEEPING TEMPERATURE (° C.) | KEEPING TIME (s) |
| COMPARATIVE | 2-37 | 50 | 910 | 19 | 13 | 1000 | 120 |
| EXAMPLE | 2-38 | 50 | 900 | 21 | 13 | 900 | 120 |
| EXAMPLE | 2-39 | 50 | 910 | 34 | 8 | 1000 | 120 |
| OF | 2-40 | 50 | 910 | 34 | 8 | 1100 | 120 |
| PRESENT | 2-41 | 50 | 910 | 34 | 8 | 1250 | 120 |
| INVENTION | 2-42 | 50 | 910 | 34 | 8 | 1350 | 120 |
| COMPARATIVE | 2-43 | 30 | 911 | 19 | 13 | 1000 | 25 |

TABLE 5-continued

| | No. | | | | | | |
|---|---|---|---|---|---|---|---|
| EXAMPLE | 2-44 | 30 | 900 | 23 | 11 | 900 | 25 |
| EXAMPLE | 2-45 | 30 | 911 | 41 | 6.3 | 1000 | 25 |
| OF | 2-46 | 30 | 911 | 41 | 6.3 | 1100 | 25 |
| PRESENT | 2-47 | 30 | 911 | 41 | 6.3 | 1250 | 25 |
| INVENTION | 2-48 | 30 | 911 | 41 | 6.3 | 1350 | 25 |
| COMPARATIVE | 2-49 | 10 | 916 | 18 | 15 | 1000 | 360 |
| EXAMPLE | 2-50 | 10 | 900 | 24 | 12 | 900 | 360 |
| EXAMPLE | 2-51 | 10 | 916 | 45 | 5.2 | 1000 | 360 |
| OF | 2-52 | 10 | 916 | 45 | 5.2 | 1100 | 360 |
| PRESENT | 2-53 | 10 | 916 | 45 | 5.2 | 1250 | 350 |
| INVENTION | 2-54 | 10 | 916 | 45 | 5.2 | 1350 | 350 |
| COMPARATIVE | 2-55 | 1 | 922 | 17 | 14 | 1000 | 1800 |
| EXAMPLE | 2-56 | 1 | 900 | 23 | 11 | 900 | 1800 |
| EXAMPLE | 2-57 | 1 | 922 | 42 | 6.2 | 1000 | 1800 |
| OF | 2-58 | 1 | 922 | 42 | 6.2 | 1100 | 1800 |
| PRESENT | 2-59 | 1 | 922 | 42 | 6.2 | 1250 | 1800 |
| INVENTION | 2-60 | 1 | 922 | 42 | 6.2 | 1350 | 1800 |
| COMPARATIVE | 2-61 | 5 | 914 | 16 | 14 | 1000 | 720 |
| EXAMPLE | 2-62 | 5 | 900 | 23 | 11 | 900 | 720 |
| EXAMPLE | 2-63 | 5 | 914 | 48 | 5.6 | 1000 | 720 |
| OF | 2-64 | 5 | 914 | 48 | 5.6 | 1100 | 720 |
| PRESENT | 2-65 | 5 | 914 | 48 | 5.6 | 1250 | 720 |
| INVENTION | 2-66 | 5 | 814 | 48 | 5.6 | 1350 | 720 |
| COMPARATIVE | 2-67 | 0.1 | 872 | 14 | 12 | 950 | 30 |
| EXAMPLE | 2-68 | 0.1 | 850 | 22 | 13 | 850 | 30 |
| EXAMPLE | 2-69 | 0.1 | 872 | 32 | 9.4 | 950 | 30 |
| OF | 2-70 | 0.1 | 872 | 32 | 9.4 | 1050 | 30 |
| PRESENT | 2-71 | 0.1 | 872 | 32 | 9.4 | 1150 | 30 |
| INVENTION | 2-72 | 0.1 | 872 | 32 | 9.4 | 1250 | 30 |
| | 2-73 | 0.1 | 872 | 32 | 9.4 | 1350 | 30 |

| | | SECOND SAMPLE | | THIRD SAMPLE | | | |
|---|---|---|---|---|---|---|---|
| | CONDITION No. | ACCUMULATION DEGREE OF {200} PLANE (%) | ACCUMULATION DEGREE OF {222} PLANE (%) | COOLING RATE (° C./s) | DISTANCE (μm) | ACCUMULATION DEGREE OF {200} PLANE (%) | ACCUMULATION DEGREE OF {222} PLANE (%) |
| COMPARATIVE | 2-37 | 13 | 13 | 50 | 175 | 13 | 13 |
| EXAMPLE | 2-38 | 22 | 12 | 50 | 176 | 22 | 12 |
| EXAMPLE | 2-39 | 45 | 4.8 | 50 | 176 | 45 | 4.8 |
| OF | 2-40 | 52 | 2.8 | 50 | 176 | 52 | 2.8 |
| PRESENT | 2-41 | 68 | 1.9 | 50 | 176 | 68 | 1.9 |
| INVENTION | 2-42 | 65 | 2.1 | 50 | 176 | 65 | 0.6 |
| COMPARATIVE | 2-43 | 13 | 13 | 100 | 120 | 13 | 13 |
| EXAMPLE | 2-44 | 23 | 11 | 100 | 125 | 23 | 11 |
| EXAMPLE | 2-45 | 51 | 2.9 | 100 | 125 | 51 | 2.9 |
| OF | 2-46 | 63 | 2.2 | 100 | 125 | 63 | 2.2 |
| PRESENT | 2-47 | 78 | 0.8 | 100 | 125 | 78 | 0.8 |
| INVENTION | 2-48 | 69 | 1.8 | 100 | 125 | 69 | 1.8 |
| COMPARATIVE | 2-49 | 13 | 13 | 150 | 250 | 13 | 13 |
| EXAMPLE | 2-50 | 25 | 11 | 150 | 251 | 25 | 11 |
| EXAMPLE | 2-51 | 55 | 2.4 | 150 | 251 | 55 | 2.4 |
| OF | 2-52 | 68 | 1.8 | 150 | 251 | 68 | 1.8 |
| PRESENT | 2-53 | 84 | 0.6 | 150 | 251 | 84 | 0.6 |
| INVENTION | 2-54 | 73 | 1.4 | 150 | 251 | 73 | 1.4 |
| COMPARATIVE | 2-55 | 13 | 13 | 80 | 75 | 13 | 13 |
| EXAMPLE | 2-56 | 26 | 10 | 80 | 75 | 26 | 10 |
| EXAMPLE | 2-57 | 51 | 2.7 | 80 | 75 | 51 | 2.7 |
| OF | 2-58 | 59 | 2.3 | 80 | 75 | 50 | 2.3 |
| PRESENT | 2-59 | 71 | 1.2 | 80 | 75 | 71 | 1.2 |
| INVENTION | 2-60 | 60 | 2.4 | 80 | 75 | 00 | 2.4 |
| COMPARATIVE | 2-61 | 13 | 13 | 10 | 50 | 13 | 13 |
| EXAMPLE | 2-62 | 25 | 10 | 10 | 53 | 25 | 10 |
| EXAMPLE | 2-63 | 59 | 2.2 | 10 | 53 | 59 | 2.2 |
| OF | 2-64 | 65 | 1.6 | 10 | 53 | 65 | 1.0 |
| PRESENT | 2-65 | 78 | 0.9 | 10 | 53 | 78 | 0.9 |
| INVENTION | 2-66 | 70 | 1.6 | 10 | 53 | 70 | 1.6 |
| COMPARATIVE | 2-67 | 13 | 13 | 1 | 100 | 13 | 13 |
| EXAMPLE | 2-68 | 23 | 11 | 1 | 101 | 23 | 11 |
| EXAMPLE | 2-69 | 39 | 8.4 | 1 | 101 | 39 | 8.4 |
| OF | 2-70 | 44 | 5.4 | 1 | 101 | 44 | 5.4 |
| PRESENT | 2-71 | 56 | 2.6 | 1 | 101 | 56 | 2.6 |
| INVENTION | 2-72 | 73 | 1.5 | 1 | 101 | 73 | 1.5 |
| | 2-73 | 70 | 1.6 | 1 | 101 | 70 | 1.6 |

Further, an alloying ratio of the metal layer and a ratio of an α single phase region in each Fe-based metal plate were measured as in the first experiment. Here, in finding the alloying ratio, a region where the Fe content was 0.5 mass % or less and the content of ferrite former was 99.5% or more was regarded as an alloy layer. Further, in finding the ratio of the α single phase region, an alloy region was decided as described in the following. In the conditions No. 2-2 to No. 2-12 using Si as the metal layers, a region where the Si content was 1.9 mass % or more was regarded as the alloy region. In the conditions No. 2-14 to No. 2-24 using Sn as the metal layers, a region where the Sn content was 3.0 mass % or more was regarded as the alloy region. In the conditions No. 2-26 to No. 2-36 using Ti as the metal layers, a region where the Ti content was 1.2 mass % or more was regarded as the alloy region. In the conditions No. 2-38 to No. 2-42 using Ga as the metal layers, a region where the Ga content was 4.1 mass % or more was regarded as the alloy region. In the conditions No. 2-44 to No. 2-48 using Ge as the metal layers, a region where the Ge content was 6.4 mass % or more was regarded as the alloy region. In the conditions No. 2-50 to No. 2-54 using Mo as the metal layers, a region where the Mo content was 3.8 mass % or more was regarded as the alloy region. In the conditions No. 2-56 to No. 2-60 using V as the metal layers, a region where the V content was 1.8 mass % or more was regarded as the alloy region. In the conditions No. 2-62 to No. 2-66 using Cr as the metal layers, a region where the Cr content was 13.0 mass % or more was regarded as the alloy region. In the conditions No. 2-68 to No. 2-73 using As as the metal layers, a region where the As content was 3.4 mass % or more was regarded as the alloy region. Results of these are listed in Table 6 and Table 7.

Further, as in the first experiment, magnetic flux density B50 and saturation magnetic flux density Bs were measured and a ratio B50/Bs of the magnetic flux density B50 to the saturation magnetic flux density Bs was calculated. Results of these are listed in Table 6 and Table 7.

TABLE 6

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs |
|---|---|---|---|---|---|---|---|---|
| COMPARATIVE | 2-1 | — | 0 | 13 | 13 | 1.70 | 2.16 | 0.79 |
| EXAMPLE | 2-2 | 69 | 0.9 | 23 | 11 | 1.55 | 1.96 | 0.79 |
| EXAMPLE | 2-3 | 100 | 8.4 | 49 | 3.9 | 1.75 | 1.96 | 0.89 |
| OF | 2-4 | 100 | 16 | 60 | 1.9 | 1.77 | 1.96 | 0.90 |
| PRESENT | 2-5 | 100 | 36 | 75 | 0.5 | 1.83 | 1.96 | 0.93 |
| INVENTION | 2-6 | 100 | 47 | 74 | 0.6 | 1.82 | 1.96 | 0.93 |
| | 2-7 | 100 | 38 | 30 | 12 | 1.71 | 1.99 | 0.86 |
| | 2-8 | 100 | 38 | 31 | 10 | 1.73 | 1.99 | 0.87 |
| | 2-9 | 100 | 37 | 41 | 5.8 | 1.77 | 1.99 | 0.89 |
| | 2-10 | 100 | 38 | 72 | 0.9 | 1.83 | 1.99 | 0.92 |
| | 2-11 | 100 | 37 | 75 | 0.8 | 1.85 | 1.99 | 0.93 |
| | 2-12 | 100 | 38 | 92 | 0.1 | 1.91 | 1.99 | 0.96 |
| COMPARATIVE | 2-13 | — | 0 | 13 | 13 | 1.67 | 2.16 | 0.77 |
| EXAMPLE | 2-14 | 75 | 0.4 | 25 | 12 | 1.53 | 1.94 | 0.79 |
| EXAMPLE | 2-15 | 100 | 4.7 | 53 | 2.5 | 1.75 | 1.94 | 0.90 |
| OF | 2-16 | 100 | 11 | 73 | 0.6 | 1.77 | 1.94 | 0.91 |
| PRESENT | 2-17 | 100 | 26 | 95 | 0.1 | 1.90 | 1.94 | 0.98 |
| INVENTION | 2-18 | 100 | 31 | 74 | 0.8 | 1.77 | 1.94 | 0.91 |
| | 2-19 | 100 | 19 | 30 | 10 | 1.69 | 1.96 | 0.86 |
| | 2-20 | 100 | 19 | 35 | 9 | 1.71 | 1.96 | 0.87 |
| | 2-21 | 100 | 18 | 43 | 5.4 | 1.74 | 1.96 | 0.89 |
| | 2-22 | 100 | 20 | 69 | 1.5 | 1.78 | 1.96 | 0.91 |
| | 2-23 | 100 | 20 | 73 | 0.8 | 1.80 | 1.96 | 0.92 |
| | 2-24 | 100 | 19 | 77 | 0.6 | 1.82 | 1.96 | 0.93 |
| COMPARATIVE | 2-25 | — | 0 | 13 | 13 | 1.68 | 2.16 | 0.78 |
| EXAMPLE | 2-26 | 75 | 0.4 | 25 | 12 | 1.55 | 1.96 | 0.79 |
| EXAMPLE | 2-27 | 100 | 4.7 | 53 | 2.5 | 1.76 | 1.96 | 0.90 |
| OF | 2-28 | 100 | 11 | 73 | 0.6 | 1.81 | 1.96 | 0.92 |
| PRESENT | 2-29 | 100 | 26 | 97 | 0.1 | 1.91 | 1.96 | 0.97 |
| INVENTION | 2-30 | 100 | 31 | 74 | 0.8 | 1.82 | 1.96 | 0.93 |
| | 2-31 | 100 | 19 | 31 | 9 | 1.74 | 2.05 | 0.85 |
| | 2-32 | 100 | 19 | 32 | 10 | 1.76 | 2.05 | 0.86 |
| | 2-33 | 100 | 18 | 41 | 6 | 1.80 | 2.05 | 0.88 |
| | 2-34 | 100 | 20 | 52 | 2.8 | 1.85 | 2.05 | 0.90 |
| | 2-35 | 100 | 20 | 58 | 2.1 | 1.87 | 2.05 | 0.91 |
| | 2-36 | 100 | 19 | 63 | 1.6 | 1.89 | 2.05 | 0.92 |

TABLE 7

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs |
|---|---|---|---|---|---|---|---|---|
| COMPARATIVE | 2-37 | — | 0 | 13 | 13 | 1.70 | 2.16 | 0.79 |
| EXAMPLE | 2-38 | 87 | 0.8 | 22 | 12 | 1.56 | 1.98 | 0.79 |
| EXAMPLE | 2-39 | 100 | 3.6 | 45 | 4.8 | 1.76 | 1.98 | 0.89 |
| OF | 2-40 | 100 | 8.9 | 52 | 2.8 | 1.78 | 1.98 | 0.90 |

TABLE 7-continued

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs |
|---|---|---|---|---|---|---|---|---|
| PRESENT INVENTION | 2-41 | 100 | 19.5 | 68 | 1.9 | 1.84 | 1.98 | 0.93 |
| | 2-42 | 100 | 27.3 | 65 | 0.6 | 1.84 | 1.98 | 0.93 |
| COMPARATIVE EXAMPLE | 2-43 | — | 0 | 13 | 13 | 1.70 | 2.16 | 0.79 |
| | 2-44 | 68 | 0.9 | 22 | 12 | 1.59 | 2.01 | 0.79 |
| EXAMPLE OF PRESENT INVENTION | 2-45 | 95 | 7.5 | 51 | 2.9 | 1.79 | 2.01 | 0.89 |
| | 2-46 | 100 | 18.4 | 63 | 2.2 | 1.81 | 2.01 | 0.90 |
| | 2-47 | 100 | 31 | 78 | 0.8 | 1.87 | 2.01 | 0.93 |
| | 2-48 | 100 | 44 | 69 | 1.8 | 1.87 | 2.01 | 0.93 |
| COMPARATIVE EXAMPLE | 2-49 | — | 0 | 13 | 13 | 1.68 | 2.16 | 0.78 |
| | 2-50 | 47 | 0.3 | 25 | 11 | 1.63 | 2.06 | 0.79 |
| EXAMPLE OF PRESENT INVENTION | 2-51 | 98 | 2.8 | 55 | 2.4 | 1.85 | 2.06 | 0.90 |
| | 2-52 | 100 | 5.9 | 68 | 1.8 | 1.88 | 2.06 | 0.91 |
| | 2-53 | 100 | 8.4 | 84 | 0.6 | 1.92 | 2.06 | 0.93 |
| | 2-54 | 100 | 11.8 | 73 | 1.4 | 1.89 | 2.06 | 0.92 |
| COMPARATIVE EXAMPLE | 2-55 | — | 0 | 13 | 13 | 1.68 | 2.16 | 0.78 |
| | 2-56 | 78 | 0.8 | 26 | 10 | 1.63 | 2.01 | 0.81 |
| EXAMPLE OF PRESENT INVENTION | 2-57 | 100 | 3.5 | 51 | 2.7 | 1.81 | 2.01 | 0.90 |
| | 2-58 | 100 | 6.9 | 59 | 2.3 | 1.83 | 2.01 | 0.91 |
| | 2-59 | 100 | 9.5 | 71 | 1.2 | 1.84 | 2.01 | 0.92 |
| | 2-60 | 100 | 12.1 | 60 | 2.4 | 1.83 | 2.01 | 0.91 |
| COMPARATIVE EXAMPLE | 2-61 | — | 0 | 13 | 13 | 1.68 | 2.16 | 0.78 |
| | 2-62 | 37 | 0.9 | 25 | 10 | 1.53 | 1.98 | 0.78 |
| EXAMPLE OF PRESENT INVENTION | 2-63 | 100 | 8.6 | 59 | 2.2 | 1.76 | 1.96 | 0.90 |
| | 2-64 | 100 | 14.2 | 65 | 1.6 | 1.79 | 1.96 | 0.91 |
| | 2-65 | 100 | 25.7 | 78 | 0.9 | 1.82 | 1.96 | 0.93 |
| | 2-66 | 100 | 32.8 | 70 | 1.6 | 1.80 | 1.96 | 0.92 |
| COMPARATIVE EXAMPLE | 2-67 | — | 0 | 13 | 13 | 1.67 | 2.16 | 0.77 |
| | 2-68 | 45 | 0.8 | 23 | 11 | 1.54 | 1.98 | 0.78 |
| EXAMPLE OF PRESENT INVENTION | 2-69 | 88 | 6.7 | 39 | 8.4 | 1.72 | 1.98 | 0.87 |
| | 2-70 | 100 | 13.8 | 44 | 5.4 | 1.74 | 1.98 | 0.88 |
| | 2-71 | 100 | 28.4 | 56 | 2.6 | 1.80 | 1.98 | 0.91 |
| | 2-72 | 100 | 39.3 | 73 | 1.5 | 1.83 | 1.98 | 0.92 |
| | 2-73 | 100 | 47.5 | 70 | 1.6 | 1.79 | 1.98 | 0.90 |

As listed in Table 4 and Table 5, in examples of the present invention (conditions No. 2-3 to No. 2-12, No. 2-15 to No. 2-24, No. 2-27 to No. 2-36, No. 2-39 to No. 2-42, No. 2-45 to No. 2-48, No. 2-51 to No. 2-54, No. 2-57 to No. 2-60, No. 2-63 to No. 2-66, and No. 2-69 to No. 2-73), the accumulation degree of the {200} planes in the α phase was high at each of the stages of the heat treatment. Further, as listed in Table 6 and Table 7, in the examples of the present invention, the alloying ratio and the ratio of the α single phase region were high. As listed in Table 6 and Table 7, according to the examples of the present invention, the Fe-based metal plates in which the accumulation degree of the {200} planes in the α phase was not less than 30% nor more than 99% and the accumulation degree of the {222} planes in the α phase was not less than 0.01% nor more than 30% were obtained. Further, in the Fe-based metal plates of the examples of the present invention, the ratio B50/Bs was 0.85 or more. That is, according to the examples of the present invention, an excellent magnetic property was obtained.

On the other hand, in the conditions No. 2-1, No. 2-13, No. 2-25, No. 2-37, No. 2-43, No. 2-49, No. 2-55, No. 2-61, and No. 2-67 being comparative examples, since the metal layer was not formed, a high accumulation degree of the {200} planes in the α phase was not obtained and a good magnetic property was not obtained even though high-density dislocation existed in the base metal plate. In the conditions No. 2-2, No. 2-14, No. 2-26, No. 2-38, No. 2-44, No. 2-50, No. 2-56, No. 2-62, and No. 2-68 being comparative examples, since the heating temperature was lower than the A3 point, improvement in the accumulation degree of the {200} planes in the α phase owing to the γ-α transformation was not caused, and a good magnetic property was not obtained.

Third Experiment

In a third experiment, six kinds of base metal plates different in composition were used, and various kinds of materials were used as the metal layers, and correlations between 42 kinds of conditions (condition No. 3-1 to condition No. 3-42) and an accumulation degree of {200} planes and an accumulation degree of {222} planes were studied.

Components contained in six kinds of the base metal plates used in the third experiment are listed in Table 8. The balance of the base metal plates was Fe and inevitable impurities. Table 8 also lists actually measured values of A3 points of the base metal plates. The base metal plates were fabricated in such a manner that an ingot was produced by vacuum melting, followed by hot rolling and cold rolling. In the hot rolling, the ingot with a 230 mm thickness heated to 1000° C. was thinned to a 50 mm thickness, whereby a hot-rolled plate was obtained. Thereafter, plate materials different in thickness were cut out from the hot-rolled plate by machining, and the plate materials were subjected to the cold rolling with rolling reduction ratios listed in Table 9, and a shear strain was generated. To generate the shear strain, upper and lower reduction rolls are rotated at different speeds at the time of the cold rolling. Some of the base metal plates were also subjected to shot blasting as in the second embodiment. Whether the shot blasting was performed or not, the shear strain, and the thickness of each of the obtained base metal plates (cold-rolled plates) are listed in Table 9. Note that the shear strain was calculated from diameters of the reduction rolls and a difference in speed between the reduction rolls.

TABLE 8

| COMPOSITION OF BASE METAL PLATE | COMPONENT ELEMENT (mass %) | | | | | | | | | A3 POINT (° C.) |
|---|---|---|---|---|---|---|---|---|---|---|
| | C | Si | Mn | Al | P | N | S | O | OTHERS | |
| G | 0.001 | 0.14 | 0.23 | 0.001 | 0.0001 | 0.0002 | <0.0004 | 0.0002 | Cu: 0.01 | 898 |
| H | 0.0002 | 0.08 | 0.06 | 0.0015 | 0.0021 | 0.0004 | <0.0004 | 0.0003 | Ni: 0.15 | 887 |
| I | 0.03 | 0.09 | 0.09 | 0.0008 | 0.0025 | 0.0003 | <0.0004 | 0.0007 | Cu: 0.15 | 905 |
| J | 0.0001 | 0.07 | 0.12 | 0.15 | 0.0004 | 0.0002 | <0.0004 | 0.0005 | Ni: 0.5 | 868 |
| K | 0.0003 | 0.85 | 0.07 | 0.53 | 0.0003 | 0.0003 | <0.0004 | 0.0001 | | 921 |
| L | 0.0002 | 0.03 | 0.08 | 0.7 | 0.0003 | 0.0002 | <0.0004 | 0.0001 | | 925 |

Textures of the base metal plates at room temperature were observed, and it was found that their main phase was an α phase. Further, the accumulation degree of the {200} planes in the α phase and the accumulation degree of the {222} planes in the α phase were measured by the aforesaid method, it was found that, as rolled, the accumulation degree of the {200} planes in the α phase was within a 19% to 27% range and the accumulation degree of the {222}planes in the α phase was within a 18% to 25% range in each of the base metal plates.

Thereafter, metal layers were formed on a front surface and a rear surface of each of the base metal plates by an IP method, a hot dipping method, a sputtering method, or a rolling clad method, except in the conditions No. 3-13, No. 3-19, No. 3-25, No. 3-31, and No. 3-37. Thickness of each of the metal layers (total thickness on the both surfaces) is listed in Table 9. Al layers with a 0.7 μm thickness were formed by the IP method, Al layers with a 7 μm to 68 μm thickness were formed by the hot dipping method, and Al layers with a 205 μm or 410 μm thickness were formed by the rolling clad method. Sb layers and W layers were formed by the sputtering method, and Zn layers, Al—Si alloy layers, and Sn—Zn alloy layers were formed by the hot dipping method.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 9.

TABLE 9

| | CONDITION No. | BASE METAL PLATE | | | | | METAL LAYER | |
|---|---|---|---|---|---|---|---|---|
| | | COMPO-SITION | BLASTING | REDUCTION RATE (%) | SHEAR STRAIN | THICKNESS (μm) | ELEMENT | THICKNESS (μm) |
| COMPARATIVE | 3-1 | G | WITHOUT | 70 | 0 | 350 | Al | 24 |
| EXAMPLE | 3-2 | G | WITHOUT | 70 | 0.1 | 350 | Al | 24 |
| EXAMPLE | 3-3 | G | WITHOUT | 70 | 0.2 | 350 | Al | 24 |
| OF | 3-4 | G | WITHOUT | 70 | 0.4 | 350 | Al | 24 |
| PRESENT | 3-5 | G | WITHOUT | 70 | 0.6 | 350 | Al | 24 |
| INVENTION | 3-6 | G | WITHOUT | 70 | 0.8 | 350 | Al | 24 |
| | 3-7 | G | WITH | 55 | 0.4 | 10 | Al | 0.7 |
| | 3-8 | G | WITH | 55 | 0.4 | 100 | Al | 7 |
| | 3-9 | G | WITH | 55 | 0.4 | 500 | Al | 34 |
| | 3-10 | G | WITH | 55 | 0.4 | 1000 | Al | 68 |
| | 3-11 | G | WITH | 55 | 0.4 | 3000 | Al | 205 |
| | 3-12 | G | WITH | 55 | 0.4 | 6000 | Al | 410 |
| COMPARATIVE | 3-13 | H | WITHOUT | 75 | 0.5 | 200 | NONE | |
| EXAMPLE | 3-14 | H | WITHOUT | 75 | 0.5 | 200 | Sb | 6 |
| EXAMPLE | 3-15 | H | WITHOUT | 75 | 0.5 | 200 | Sb | 6 |
| OF | 3-16 | H | WITHOUT | 75 | 0.5 | 200 | Sb | 6 |
| PRESENT | 3-17 | H | WITHOUT | 75 | 0.5 | 200 | Sb | 6 |
| INVENTION | 3-18 | H | WITHOUT | 75 | 0.5 | 200 | Sb | 6 |
| COMPARATIVE | 3-19 | I | WITHOUT | 85 | 0.6 | 150 | NONE | |
| EXAMPLE | 3-20 | I | WITHOUT | 85 | 0.6 | 150 | W | 2 |
| EXAMPLE | 3-21 | I | WITHOUT | 85 | 0.6 | 150 | W | 2 |
| OF | 3-22 | I | WITHOUT | 85 | 0.6 | 150 | W | 2 |
| PRESENT | 3-23 | I | WITHOUT | 85 | 0.6 | 150 | W | 2 |
| INVENTION | 3-24 | I | WITHOUT | 85 | 0.6 | 150 | W | 2 |
| COMPARATIVE | 3-25 | J | WITH | 70 | 0.2 | 700 | NONE | |
| EXAMPLE | 3-26 | J | WITH | 70 | 0.2 | 700 | Zn | 44 |
| EXAMPLE | 3-27 | J | WITH | 70 | 0.2 | 700 | Zn | 44 |
| OF | 3-28 | J | WITH | 70 | 0.2 | 700 | Zn | 44 |
| PRESENT | 3-29 | J | WITH | 70 | 0.2 | 700 | Zn | 44 |
| INVENTION | 3-30 | J | WITH | 70 | 0.2 | 700 | Zn | 44 |
| COMPARATIVE | 3-31 | K | WITH | 65 | 0.1 | 300 | NONE | |
| EXAMPLE | 3-32 | K | WITH | 65 | 0.1 | 300 | 90%Al + 10%Si | 40 |
| EXAMPLE | 3-33 | K | WITH | 65 | 0.1 | 300 | 90%Al + 10%Si | 40 |
| OF | 3-34 | K | WITH | 65 | 0.1 | 300 | 90%Al + 10%Si | 40 |
| PRESENT | 3-35 | K | WITH | 65 | 0.1 | 300 | 90%Al + 10%Si | 40 |
| INVENTION | 3-36 | K | WITH | 65 | 0.1 | 300 | 90%Al + 10%Si | 40 |
| COMPARATIVE | 3-37 | L | WITH | 60 | 0.2 | 500 | NONE | |

TABLE 9-continued

| | | | | | | | | |
|---|---|---|---|---|---|---|---|---|
| EXAMPLE | 3-38 | L | WITH | 60 | 0.2 | 500 | 92%Sn + 8%Zn | 26 |
| EXAMPLE | 3-39 | L | WITH | 60 | 0.2 | 500 | 92%Sn + 8%Zn | 26 |
| OF | 3-40 | L | WITH | 60 | 0.2 | 500 | 92%Sn + 8%Zn | 26 |
| PRESENT | 3-41 | L | WITH | 60 | 0.2 | 500 | 92%Sn + 8%Zn | 26 |
| INVENTION | 3-42 | L | WITH | 60 | 0.2 | 500 | 92%Sn + 8%Zn | 26 |

| | | | FIRST SAMPLE | | | | |
|---|---|---|---|---|---|---|---|
| | | | | | | SECOND SAMPLE | |
| | | | | ACCUMULATION | ACCUMULATION | | |
| | CONDITION No. | HETING RATE (° C./s) | MEASURED TEMPERATURE (° C.) | DEGREE OF {200} PLANE (%) | DEGREE OF {222} PLANE (%) | KEEPING TEMPERATURE (° C.) | KEEPING TIME (s) |
| COMPARATIVE | 3-1 | 1 | 898 | 16 | 14 | 980 | 3600 |
| EXAMPLE | 3-2 | 1 | 898 | 22 | 10 | 980 | 3600 |
| EXAMPLE | 3-3 | 1 | 898 | 27 | 9 | 980 | 3600 |
| OF | 3-4 | 1 | 898 | 39 | 7.5 | 980 | 3600 |
| PRESENT | 3-5 | 1 | 898 | 42 | 6.4 | 980 | 3600 |
| INVENTION | 3-6 | 1 | 898 | 44 | 5.9 | 980 | 3600 |
| | 3-7 | 0.01 | 898 | 34 | 7.7 | 1000 | 7200 |
| | 3-8 | 0.01 | 898 | 39 | 7.6 | 1000 | 7200 |
| | 3-9 | 0.01 | 898 | 41 | 6.3 | 1000 | 7200 |
| | 3-10 | 0.01 | 898 | 42 | 5.9 | 1000 | 7200 |
| | 3-11 | 0.01 | 898 | 42 | 5.6 | 1000 | 7200 |
| | 3-12 | 0.01 | 898 | 41 | 5.7 | 1000 | 7200 |
| COMPARATIVE | 3-13 | 0.1 | 887 | 18 | 15 | 950 | 600 |
| EXAMPLE | 3-14 | 0.1 | 850 | 23 | 11 | 850 | 600 |
| EXAMPLE | 3-15 | 0.1 | 887 | 39 | 7.8 | 950 | 600 |
| OF | 3-16 | 0.1 | 887 | 39 | 7.8 | 1050 | 600 |
| PRESENT | 3-17 | 0.1 | 887 | 39 | 7.8 | 1150 | 600 |
| INVENTION | 3-18 | 0.1 | 887 | 39 | 7.8 | 1250 | 600 |
| COMPARATIVE | 3-19 | 0.2 | 905 | 17 | 13 | 1000 | 60 |
| EXAMPLE | 3-20 | 0.2 | 880 | 24 | 10 | 880 | 60 |
| EXAMPLE | 3-21 | 0.2 | 905 | 44 | 6.2 | 1000 | 60 |
| OF | 3-22 | 0.2 | 905 | 44 | 6.2 | 1100 | 60 |
| PRESENT | 3-23 | 0.2 | 905 | 44 | 6.2 | 1250 | 60 |
| INVENTION | 3-24 | 0.2 | 905 | 44 | 6.2 | 1350 | 60 |
| COMPARATIVE | 3-25 | 2 | 868 | 18 | 12 | 900 | 10 |
| EXAMPLE | 3-26 | 2 | 850 | 22 | 12 | 850 | 10 |
| EXAMPLE | 3-27 | 2 | 868 | 36 | 8.2 | 900 | 10 |
| OF | 3-28 | 2 | 868 | 36 | 8.2 | 1000 | 10 |
| PRESENT | 3-29 | 2 | 868 | 36 | 8.2 | 1100 | 10 |
| INVENTION | 3-30 | 2 | 868 | 36 | 8.2 | 1200 | 10 |
| COMPARATIVE | 3-31 | 0.1 | 921 | 14 | 12 | 1000 | 100 |
| EXAMPLE | 3-32 | 0.1 | 900 | 23 | 13 | 900 | 100 |
| EXAMPLE | 3-33 | 0.1 | 921 | 38 | 7.3 | 1000 | 100 |
| OF | 3-34 | 0.1 | 921 | 38 | 7.3 | 1100 | 100 |
| PRESENT | 3-35 | 0.1 | 921 | 38 | 7.3 | 1200 | 100 |
| INVENTION | 3-36 | 0.1 | 921 | 38 | 7.3 | 1300 | 100 |
| COMPARATIVE | 3-37 | 1 | 925 | 15 | 11 | 1000 | 0 |
| EXAMPLE | 3-38 | 1 | 900 | 24 | 12 | 900 | 0 |
| EXAMPLE | 3-39 | 1 | 925 | 41 | 7.1 | 1000 | 0 |
| OF | 3-40 | 1 | 925 | 41 | 7.1 | 1100 | 0 |
| PRESENT | 3-41 | 1 | 925 | 41 | 7.1 | 1200 | 0 |
| INVENTION | 3-42 | 1 | 925 | 41 | 7.1 | 1300 | 0 |

| | | SECOND SAMPLE | | THIRD SAMPLE | | | |
|---|---|---|---|---|---|---|---|
| | CONDITION No. | ACCUMULATION DEGREE OF {200} PLANE (%) | ACCUMULATION DEGREE OF {222} PLANE (%) | COOLING RATE (° C./s) | DISTANCE (μm) | ACCUMULATION DEGREE OF {200} PLANE (%) | ACCUMULATION DEGREE OF {222} PLANE (%) |
| COMPARATIVE | 3-1 | 13 | 13 | 50 | 183 | 13 | 13 |
| EXAMPLE | 3-2 | 23 | 10 | 50 | 183 | 23 | 10 |
| EXAMPLE | 3-3 | 36 | 6.8 | 50 | 183 | 36 | 6.8 |
| OF | 3-4 | 52 | 2.7 | 50 | 183 | 52 | 2.7 |
| PRESENT | 3-5 | 68 | 1.9 | 50 | 183 | 68 | 1.9 |
| INVENTION | 3-6 | 70 | 1.5 | 50 | 183 | 70 | 1.5 |
| | 3-7 | 42 | 6.7 | 1 | 5 | 42 | 6.7 |
| | 3-8 | 50 | 3.1 | 1 | 53 | 50 | 3.1 |
| | 3-9 | 53 | 2.6 | 1 | 265 | 53 | 2.6 |
| | 3-10 | 55 | 2.1 | 1 | 350 | 52 | 3.4 |
| | 3-11 | 56 | 1.9 | 1 | 420 | 45 | 6.1 |
| | 3-12 | 54 | 2.3 | 1 | 450 | 35 | 7.6 |
| COMPARATIVE | 3-13 | 13 | 13 | 0.1 | 100 | 13 | 13 |
| EXAMPLE | 3-14 | 26 | 10 | 0.1 | 100 | 26 | 10 |
| EXAMPLE | 3-15 | 47 | 5.3 | 0.1 | 100 | 47 | 5.3 |
| OF | 3-16 | 51 | 3.3 | 0.1 | 100 | 51 | 3.3 |

TABLE 9-continued

| | CONDITION No. | | | | | |
|---|---|---|---|---|---|---|---|
| PRESENT INVENTION | 3-17 | 64 | 2.3 | 0.1 | 100 | 64 | 2.3 |
| PRESENT INVENTION | 3-18 | 73 | 1.1 | 0.1 | 100 | 73 | 1.1 |
| COMPARATIVE EXAMPLE | 3-19 | 13 | 13 | 5 | 75 | 13 | 13 |
| EXAMPLE | 3-20 | 27 | 9 | 5 | 76 | 27 | 9 |
| EXAMPLE | 3-21 | 54 | 2.6 | 5 | 76 | 54 | 2.6 |
| OF | 3-22 | 68 | 2.1 | 5 | 76 | 68 | 2.1 |
| PRESENT | 3-23 | 78 | 0.8 | 5 | 76 | 78 | 0.8 |
| INVENTION | 3-24 | 67 | 2.3 | 5 | 76 | 67 | 2.3 |
| COMPARATIVE | 3-25 | 13 | 13 | 0.5 | 300 | 13 | 13 |
| EXAMPLE | 3-26 | 24 | 10 | 0.5 | 300 | 24 | 10 |
| EXAMPLE | 3-27 | 41 | 6.8 | 0.5 | 300 | 41 | 6.8 |
| OF | 3-28 | 49 | 5.4 | 0.5 | 300 | 49 | 5.4 |
| PRESENT | 3-29 | 54 | 3.1 | 0.5 | 300 | 54 | 3.1 |
| INVENTION | 3-30 | 58 | 2.7 | 0.5 | 300 | 58 | 2.7 |
| COMPARATIVE | 3-31 | 13 | 13 | 10 | 150 | 13 | 13 |
| EXAMPLE | 3-32 | 25 | 10 | 10 | 160 | 25 | 10 |
| EXAMPLE | 3-33 | 47 | 5.9 | 10 | 160 | 47 | 5.9 |
| OF | 3-34 | 59 | 2.8 | 10 | 160 | 59 | 2.8 |
| PRESENT | 3-35 | 71 | 1.5 | 10 | 160 | 71 | 1.5 |
| INVENTION | 3-36 | 63 | 2.5 | 10 | 160 | 63 | 2.5 |
| COMPARATIVE | 3-37 | 13 | 13 | 500 | 250 | 13 | 13 |
| EXAMPLE | 3-38 | 25 | 11 | 500 | 270 | 25 | 11 |
| EXAMPLE | 3-39 | 43 | 6.3 | 500 | 270 | 43 | 6.3 |
| OF | 3-40 | 52 | 3.2 | 500 | 270 | 52 | 3.2 |
| PRESENT | 3-41 | 52 | 2.8 | 500 | 270 | 62 | 2.8 |
| INVENTION | 3-42 | 58 | 3 | 500 | 270 | 58 | 3 |

Further, an alloying ratio of the metal layer and a ratio of an α single phase region in each Fe-based metal plates were measured as in the first experiment. Here, in finding the alloying ratio, a region where the Fe content was 0.5 mass % or less and the content of ferrite former was 99.5% or more was regarded as an alloy layer. Further, in finding the ratio of the α single phase region, the alloy region was decided as described in the following. In the conditions No. 3-1 to No. 3-12 using Al as the metal layers, a region where the Al content was 0.9 mass % or more was regarded as the alloy region. In the conditions No. 3-14 to No. 3-18 using Sb as the metal layers, a region where the Sb content was 3.6 mass % or more was regarded as the alloy region. In the conditions No. 3-20 to No. 3-24 using W as the metal layers, a region where the W content was 6.6 mass % or more was regarded as the alloy region. In the conditions No. 3-26 to No. 3-30 using Zn as the metal layers, a region where the Zn content was 7.2 mass % or more was regarded as the alloy region. In the conditions No. 3-32 to No. 3-36 using an Al—Si alloy as the metal layers, a region where the Al content was 0.9 mass % or more and the Si content was 0.2 mass % or more was regarded as the alloy region. In the conditions No. 3-38 to No. 3-42 using a Sn—Zn alloy as the metal layers, a region where the Sn content was 2.9 mass % or more and the Zn content was 0.6 mass % or more was regarded as the alloy region. Results of these are listed in Table 10.

Further, as in the first experiment, magnetic flux density B50 and saturation magnetic flux density Bs were measured and a ratio B50/Bs of the magnetic flux density B50 to the saturation magnetic flux density Bs was calculated. Results of these are listed in Table 10.

TABLE 10

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs |
|---|---|---|---|---|---|---|---|---|
| COMPARATIVE EXAMPLE | 3-1 | 13 | 13 | 13 | 13 | 1.70 | 2.16 | 0.79 |
| EXAMPLE | 3-2 | 23 | 10 | 23 | 10 | 1.62 | 2.05 | 0.79 |
| EXAMPLE | 3-3 | 36 | 6.8 | 36 | 6.8 | 1.82 | 2.05 | 0.89 |
| OF | 3-4 | 52 | 2.7 | 52 | 2.7 | 1.85 | 2.05 | 0.90 |
| PRESENT | 3-5 | 68 | 1.9 | 68 | 1.9 | 1.89 | 2.05 | 0.92 |
| INVENTION | 3-6 | 70 | 1.5 | 70 | 1.5 | 1.91 | 2.05 | 0.93 |
| | 3-7 | 100 | 100 | 42 | 6.7 | 1.80 | 2.05 | 0.88 |
| | 3-8 | 100 | 100 | 50 | 3.1 | 1.85 | 2.05 | 0.90 |
| | 3-9 | 100 | 25 | 53 | 2.6 | 1.87 | 2.05 | 0.91 |
| | 3-10 | 100 | 10.8 | 55 | 2.1 | 1.87 | 2.05 | 0.91 |
| | 3-11 | 95 | 3.8 | 56 | 1.9 | 1.85 | 2.05 | 0.90 |
| | 3-12 | 75 | 2.1 | 54 | 2.3 | 1.80 | 2.05 | 0.88 |
| COMPARATIVE | 3-13 | — | 0 | 13 | 13 | 1.65 | 2.16 | 0.76 |
| EXAMPLE | 3-14 | 76 | 0.2 | 26 | 10 | 1.62 | 2.04 | 0.79 |
| EXAMPLE | 3-15 | 100 | 1.7 | 47 | 5.3 | 1.81 | 2.04 | 0.89 |
| OF | 3-16 | 100 | 3.8 | 51 | 3.3 | 1.84 | 2.04 | 0.90 |
| PRESENT | 3-17 | 100 | 7.5 | 64 | 2.3 | 1.86 | 2.04 | 0.91 |
| INVENTION | 3-18 | 100 | 8.4 | 73 | 1.1 | 1.88 | 2.04 | 0.92 |
| COMPARATIVE | 3-19 | — | 0 | 13 | 13 | 1.67 | 2.16 | 0.77 |
| EXAMPLE | 3-20 | 57 | 0.4 | 27 | 9 | 1.58 | 2.02 | 0.78 |
| EXAMPLE | 3-21 | 86 | 2.6 | 54 | 2.6 | 1.81 | 2.02 | 0.90 |
| OF | 3-22 | 100 | 6.8 | 68 | 2.1 | 1.83 | 2.02 | 0.91 |
| PRESENT | 3-23 | 100 | 10.1 | 78 | 0.8 | 1.87 | 2.02 | 0.93 |

TABLE 10-continued

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs |
|---|---|---|---|---|---|---|---|---|
| INVENTION | 3-24 | 100 | 13.9 | 67 | 2.3 | 1.84 | 2.02 | 0.91 |
| COMPARATIVE | 3-25 | — | 0 | 13 | 13 | 1.67 | 2.16 | 0.77 |
| EXAMPLE | 3-26 | 24 | 0.6 | 24 | 10 | 1.46 | 1.90 | 0.77 |
| EXAMPLE | 3-27 | 64 | 2.7 | 41 | 6.8 | 1.65 | 1.90 | 0.87 |
| OF | 3-28 | 89 | 5.8 | 49 | 5.4 | 1.67 | 1.90 | 0.88 |
| PRESENT | 3-29 | 100 | 12.7 | 54 | 3.1 | 1.71 | 1.90 | 0.90 |
| INVENTION | 3-30 | 100 | 19.5 | 58 | 2.7 | 1.73 | 1.90 | 0.91 |
| COMPARATIVE | 3-31 | — | 0 | 13 | 13 | 1.67 | 2.16 | 0.77 |
| EXAMPLE | 3-32 | 37 | 0.9 | 25 | 10 | 1.52 | 1.95 | 0.78 |
| EXAMPLE | 3-33 | 84 | 3.9 | 47 | 5.9 | 1.72 | 1.95 | 0.88 |
| OF | 3-34 | 100 | 8.5 | 59 | 2.8 | 1.78 | 1.95 | 0.91 |
| PRESENT | 3-35 | 100 | 14.6 | 71 | 1.5 | 1.82 | 1.95 | 0.93 |
| INVENTION | 3-36 | 100 | 21.7 | 63 | 2.5 | 1.80 | 1.95 | 0.92 |
| COMPARATIVE | 3-37 | — | 0 | 13 | 13 | 1.66 | 2.16 | 0.77 |
| EXAMPLE | 3-38 | 21 | 0.7 | 25 | 11 | 1.51 | 1.94 | 0.78 |
| EXAMPLE | 3-39 | 63 | 2.7 | 43 | 6.3 | 1.71 | 1.94 | 0.88 |
| OF | 3-40 | 88 | 5.6 | 52 | 3.2 | 1.75 | 1.94 | 0.90 |
| PRESENT | 3-41 | 100 | 10.6 | 62 | 2.8 | 1.77 | 1.94 | 0.61 |
| INVENTION | 3-42 | 100 | 17.8 | 58 | 3 | 1.76 | 1.94 | 0.91 |

As listed in Table 9, in examples of the present invention (conditions No. 3-3 to No. 3-12, No. 3-15 to No. 3-18, No. 3-21 to No. 3-24, No. 3-27 to No. 3-30, No. 3-33 to No. 3-36, and No. 3-39 to No. 3-42), the accumulation degree of the {200} planes in the α phase was high at each of the stages of the heat treatment. Further, as listed in Table 10, in the examples of the present invention, the alloying ratio and the ratio of the α single phase region were high. As listed in Table 10, according to the examples of the present invention, the Fe-based metal plates in which the accumulation degree of the {200} planes in the α phase was not less than 30% nor more than 99% and the accumulation degree of the {222} planes in the α phase was not less than 0.01% nor more than 30% were obtained. Further, in the Fe-based metal plates of the examples of the present invention, the ratio B50/Bs was 0.85 or more. That is, according to the examples of the present invention, an excellent magnetic property was obtained.

On the other hand, in the conditions No. 3-1 and No. 3-2 being comparative examples, even though the metal layers were formed, a shear strain and a rolling reduction ratio were small, and they did not satisfy the requirement that "after the heating to the A3 point, the accumulation degree of the {200} planes in the α phase is 25% or more and the accumulation degree of the {222} planes in the α phase is 40% or less", and therefore a high accumulation degree of the {200} planes in the α phase was not obtained and a good magnetic property was not obtained. In the conditions No. 3-13, No. 3-19, No. 3-25, No. 3-31, and No. 3-37 being comparative examples, since the metal layer was not formed, a high accumulation degree of the {200} planes in the α phase was not obtained and a good magnetic property was not obtained even though a large shear strain existed. In the conditions No. 3-14, No. 3-20, No. 3-26, No. 3-32, and No. 3-38 being comparative examples, since the heating temperature was lower than the A3 point, improvement in the accumulation degree of the {200} planes in the α phase owing to the γ-α transformation was not caused, and a good magnetic property was not obtained.

Fourth Experiment

In a fourth experiment, correlations between an accumulation degree of {200} planes and an accumulation degree of {222} planes and core loss in 42 kinds of manufacturing conditions (condition No. 4-1 to condition No. 4-42) were studied.

Base metal plates (silicon steel plates) used in the fourth experiment contained components of the composition N listed in Table 11 and inevitable impurities, with the balance being Fe. The base metal plates were fabricated in such a manner that an ingot was produced by vacuum melting, followed by hot rolling and cold rolling. In the hot rolling, the ingot with a 230 mm thickness heated to 1200° C. was thinned to a 10.0 mm thickness, a 5.0 mm thickness, a 4.0 mm thickness, and a 2.0 mm thickness, whereby four kinds of hot-rolled plates were obtained. An actually measured value of the A3 point at which the base metal plates (silicon steel plates) used in the fourth experiment transformed to a γ single layer was 1010° C.

TABLE 11

| COMPOSITION | COMPONENT ELEMENT (mass %) | | | | | | | | | A3 POINT (° C.) |
|---|---|---|---|---|---|---|---|---|---|---|
| | C | Si | Mn | Al | P | N | S | O | OTHERS | |
| N | 0.0002 | 1.4 | 0.005 | 0.1 | 0.0004 | 0.005 | <0.0004 | 0.003 | | 1010 |
| O | 0.0002 | 1.1 | 0.1 | 0.3 | 0.0004 | 0.005 | <0.0004 | 0.003 | | 1005 |
| P | 0.0002 | 1.3 | 0.2 | 0.2 | 0.0004 | 0.005 | <0.0004 | 0.003 | | 1010 |
| Q | 0.0002 | 0.9 | 0.15 | 0.6 | 0.0004 | 0.004 | <0.0004 | 0.003 | | 1020 |
| R | 0.0003 | 1.0 | 0.15 | 0.4 | 0.0003 | 0.004 | <0.0004 | 0.003 | | 1010 |
| S | 0.0002 | 1.5 | 0.08 | 0.5 | 0.0003 | 0.004 | <0.0004 | 0.003 | | 1080 |
| T | 0.0003 | 0.005 | 0.12 | 0.6 | 0.0004 | 0.004 | <0.0004 | 0.003 | | 1020 |
| U | 0.0003 | 0.6 | 0.1 | 0.65 | 0.0004 | 0.004 | <0.0004 | 0.003 | Cr: 2% | 1000 |

TABLE 11-continued

| COMPOSITION | COMPONENT ELEMENT (mass %) | | | | | | | | | A3 POINT (°C.) |
|---|---|---|---|---|---|---|---|---|---|---|
| | C | Si | Mn | Al | P | N | S | O | OTHERS | |
| V | 0.0003 | 0.8 | 0.1 | 0.5 | 0.0004 | 0.004 | <0.0004 | 0.003 | Mo: 1% | 1000 |
| W | 0.0003 | 0.2 | 0.05 | 0.7 | 0.0004 | 0.004 | <0.0004 | 0.003 | V: 0.5% | 1010 |

The cold rolling was performed under the following conditions. In the conditions No. 4-1 to 4-7, the hot-rolled plates with a 2.0 mm thickness were pickled to remove scales, and thereafter were rolled to a 0.1 mm thickness. A rolling reduction ratio at this time was 95%. In the conditions No. 4-8 to 4-14, the hot-rolled plates with a 4.0 mm thickness were pickled to remove scales, and thereafter were rolled to a 0.1 mm thickness. A rolling reduction ratio at this time was 97.5%. In the conditions No. 4-15 to 4-21, the hot-rolled steel plates with a 2.0 mm thickness were subjected to shot blasting as hard surface machining on both surfaces, and thereafter were rolled to a 0.1 mm thickness. A rolling reduction ratio at this time was 95%. In the shot blasting, iron beads with a 1 mm to 3 mm diameter were made to continuously collide with the both surfaces of the base metal plates for 10 seconds each. In the conditions No. 4-22 to 4-28, the hot-rolled plates with a 5.0 mm thickness were pickled to remove scales and thereafter were rolled to a 0.25 mm thickness. A rolling reduction ratio at this time was 95%. In the conditions No. 4-29 to 4-35, the hot-rolled plates with a 10.0 mm thickness were pickled to remove scales, and thereafter were rolled to a 0.25 mm thickness. A rolling reduction ratio at this time was 97.5%. In the conditions No. 4-36 to 4-42, the hot-rolled plates with a 5.0 mm thickness were subjected to shot blasting as hard surface machining on both surfaces and thereafter were cold-rolled to a 0.25 mm thickness. A rolling reduction ratio at this time was 95%. In this shot blasting, iron beads with a 1 mm to 3 mm diameter were made to continuously collide with the both surfaces of the base metal plates for ten seconds each.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 12.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, and it was found that, as rolled, the accumulation degree of the {200} planes in the α phase was within a 17% to 24% range and the accumulation degree of the {222} planes in the α phase was within a 17% to 24% range in each of the base metal plates.

Thereafter, Al layers as the metal layers were formed on the front surface and the rear surface of each of the base metal plates by a vapor deposition method, except in the conditions No. 4-1, No. 4-8, No. 4-15, No. 4-22, No. 4-29, and No. 4-36. Thickness of each of the Al layers (total thickness on the both surfaces) is listed in Table 12.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 12.

TABLE 12

| | CONDITION No. | BASE METAL PLATE | | | | | METAL LAYER | |
|---|---|---|---|---|---|---|---|---|
| | | COMPO-SITION | BLASTING | REDUCTION RATE (%) | DISLOCATION DENSTTY (m/m³) | THICKNESS (μm) | ELEMENT | THICKNESS (μm) |
| COMPARATIVE EXAMPLE | 4-1 | N | WITHOUT | 95 | 1 × 10$^{15}$ | 100 | NONE | |
| EXAMPLE | 4-2 | N | WITHOUT | 95 | 1 × 10$^{15}$ | 100 | Al | 9 |
| OF | 4-3 | N | WITHOUT | 95 | 1 × 10$^{15}$ | 100 | Al | 9 |
| PRESENT | 4-4 | N | WITHOUT | 95 | 1 × 10$^{15}$ | 100 | Al | 9 |
| INVENTION | 4-5 | N | WITHOUT | 95 | 1 × 10$^{15}$ | 100 | Al | 9 |
| | 4-6 | N | WITHOUT | 95 | 1 × 10$^{15}$ | 100 | Al | 9 |
| | 4-7 | N | WITHOUT | 95 | 1 × 10$^{15}$ | 100 | Al | 9 |
| COMPARATIVE EXAMPLE | 4-8 | N | WITHOUT | 97.5 | 1 × 10$^{16}$ | 100 | NONE | |
| EXAMPLE | 4-9 | N | WITHOUT | 97.5 | 1 × 10$^{16}$ | 100 | Al | 9 |
| OF | 4-10 | N | WITHOUT | 97.5 | 1 × 10$^{16}$ | 100 | Al | 9 |
| PRESENT | 4-11 | N | WITHOUT | 97.5 | 1 × 10$^{16}$ | 100 | Al | 9 |
| INVENTION | 4-12 | N | WITHOUT | 97.5 | 1 × 10$^{16}$ | 100 | Al | 9 |
| | 4-13 | N | WITHOUT | 97.5 | 1 × 10$^{16}$ | 100 | Al | 9 |
| | 4-14 | N | WITHOUT | 97.5 | 1 × 10$^{16}$ | 100 | Al | 9 |
| COMPARATIVE EXAMPLE | 4-15 | N | WITH | 95 | 8 × 10$^{16}$ | 100 | NONE | |
| EXAMPLE | 4-18 | N | WITH | 95 | 8 × 10$^{16}$ | 100 | Al | 9 |
| OF | 4-17 | N | WITH | 95 | 8 × 10$^{16}$ | 100 | Al | 9 |
| PRESENT | 4-18 | N | WITH | 95 | 8 × 10$^{16}$ | 100 | Al | 9 |
| INVENTION | 4-19 | N | WITH | 95 | 8 × 10$^{16}$ | 100 | Al | 9 |
| | 4-20 | N | WITH | 95 | 8 × 10$^{16}$ | 100 | Al | 9 |

TABLE 12-continued

|  |  |  |  |  |  |  |  |  |
|---|---|---|---|---|---|---|---|---|
|  | 4-21 | N | WITH | 95 | $8 \times 10^{16}$ | 100 | Al | 9 |
| COMPARATIVE EXAMPLE | 4-22 | N | WITHOUT | 95 | $1 \times 10^{15}$ | 250 |  | NONE |
| EXAMPLE OF PRESENT INVENTION | 4-23 | N | WITHOUT | 95 | $1 \times 10^{15}$ | 250 | Al | 22 |
|  | 4-24 | N | WITHOUT | 95 | $1 \times 10^{15}$ | 250 | Al | 22 |
|  | 4-25 | N | WITHOUT | 95 | $1 \times 10^{15}$ | 250 | Al | 22 |
|  | 4-26 | N | WITHOUT | 95 | $1 \times 10^{15}$ | 250 | Al | 22 |
|  | 4-27 | N | WITHOUT | 95 | $1 \times 10^{15}$ | 250 | Al | 22 |
|  | 4-28 | N | WITHOUT | 95 | $1 \times 10^{15}$ | 250 | Al | 22 |
| COMPARATIVE EXAMPLE | 4-29 | N | WITHOUT | 97.5 | $1 \times 10^{15}$ | 250 |  | NONE |
| EXAMPLE OF PRESENT INVENTION | 4-30 | N | WITHOUT | 97.5 | $1 \times 10^{16}$ | 250 | Al | 22 |
|  | 4-31 | N | WITHOUT | 97.5 | $1 \times 10^{16}$ | 250 | Al | 22 |
|  | 4-32 | N | WITHOUT | 97.5 | $1 \times 10^{16}$ | 250 | Al | 22 |
|  | 4-33 | N | WITHOUT | 97.5 | $1 \times 10^{16}$ | 250 | Al | 22 |
|  | 4-34 | N | WITHOUT | 97.5 | $1 \times 10^{16}$ | 250 | Al | 22 |
|  | 4-35 | N | WITHOUT | 97.5 | $1 \times 10^{16}$ | 250 | Al | 22 |
| COMPARATIVE EXAMPLE | 4-36 | N | WITH | 95 | $8 \times 10^{16}$ | 250 |  | NONE |
| EXAMPLE OF PRESENT INVENTION | 4-37 | N | WITH | 95 | $8 \times 10^{16}$ | 250 | Al | 22 |
|  | 4-38 | N | WITH | 95 | $8 \times 10^{16}$ | 250 | Al | 22 |
|  | 4-39 | N | WITH | 95 | $8 \times 10^{16}$ | 250 | Al | 22 |
|  | 4-40 | N | WITH | 95 | $8 \times 10^{16}$ | 250 | Al | 22 |
|  | 4-41 | N | WITH | 95 | $8 \times 10^{16}$ | 250 | Al | 22 |
|  | 4-42 | N | WITH | 95 | $8 \times 10^{16}$ | 250 | Al | 22 |

|  |  | FIRST SAMPLE | | | | SECOND SAMPLE | |
|---|---|---|---|---|---|---|---|
|  | CONDITION No. | HETING RATE (° C./s) | MEASURED TEMPERATURE (° C.) | ACCUMULATION DEGREE OF {200} PLANE (%) | ACCUMULATION DEGREE OF {22} PLANE (%) | KEEPING TEMPERATURE (° C.) | KEEPING TIME (s) |
| COMPARATIVE EXAMPLE | 4-1 | 10 | 1010 | 16 | 14 | 1050 | 2 |
| EXAMPLE OF PRESENT INVENTION | 4-2 | 10 | 1010 | 26 | 14 | 1010 | 2 |
|  | 4-3 | 10 | 1010 | 26 | 14 | 1050 | 2 |
|  | 4-4 | 10 | 1010 | 26 | 14 | 1050 | 5 |
|  | 4-5 | 10 | 1010 | 26 | 14 | 1050 | 30 |
|  | 4-6 | 10 | 1010 | 26 | 14 | 1050 | 120 |
|  | 4-7 | 10 | 1010 | 26 | 14 | 1050 | 360 |
| COMPARATIVE EXAMPLE | 4-8 | 10 | 1010 | 16 | 14 | 1050 | 2 |
| EXAMPLE OF PRESENT INVENTION | 4-9 | 10 | 1010 | 40 | 3.8 | 1010 | 2 |
|  | 4-10 | 10 | 1010 | 40 | 3.8 | 1050 | 2 |
|  | 4-11 | 10 | 1010 | 40 | 3.8 | 1050 | 5 |
|  | 4-12 | 10 | 1010 | 40 | 3.8 | 1050 | 30 |
|  | 4-13 | 10 | 1010 | 40 | 3.8 | 1050 | 120 |
|  | 4-14 | 10 | 1010 | 40 | 3.8 | 1050 | 360 |
| COMPARATIVE EXAMPLE | 4-15 | 10 | 1010 | 15 | 13 | 1050 | 2 |
| EXAMPLE OF PRESENT INVENTION | 4-18 | 10 | 1010 | 59 | 2.9 | 1050 | 2 |
|  | 4-17 | 10 | 1010 | 59 | 2.9 | 1050 | 2 |
|  | 4-18 | 10 | 1010 | 59 | 2.9 | 1050 | 5 |
|  | 4-19 | 10 | 1010 | 59 | 2.9 | 1050 | 30 |
|  | 4-20 | 10 | 1010 | 59 | 2.9 | 1050 | 120 |
|  | 4-21 | 10 | 1010 | 59 | 2.9 | 1050 | 360 |
| COMPARATIVE EXAMPLE | 4-22 | 10 | 1010 | 16 | 14 | 1010 | 2 |
| EXAMPLE OF PRESENT INVENTION | 4-23 | 10 | 1010 | 26 | 14 | 1010 | 2 |
|  | 4-24 | 10 | 1010 | 27 | 13 | 1100 | 3 |
|  | 4-25 | 10 | 1010 | 27 | 13 | 1100 | 7 |
|  | 4-26 | 10 | 1010 | 27 | 13 | 1100 | 35 |
|  | 4-27 | 10 | 1010 | 27 | 13 | 1100 | 140 |
|  | 4-28 | 10 | 1010 | 27 | 13 | 1100 | 420 |
| COMPARATIVE EXAMPLE | 4-29 | 10 | 1010 | 16 | 14 | 1010 | 2 |
| EXAMPLE OF PRESENT INVENTION | 4-30 | 10 | 1010 | 40 | 3.8 | 1010 | 2 |
|  | 4-31 | 10 | 1010 | 42 | 3.2 | 1100 | 3 |
|  | 4-32 | 10 | 1010 | 42 | 3.2 | 1100 | 7 |
|  | 4-33 | 10 | 1010 | 42 | 3.2 | 1100 | 35 |
|  | 4-34 | 10 | 1010 | 42 | 3.2 | 1100 | 140 |
|  | 4-35 | 10 | 1010 | 42 | 3.2 | 1100 | 420 |

TABLE 12-continued

| | Condition No. | | | | | | |
|---|---|---|---|---|---|---|---|
| COMPARATIVE EXAMPLE | 4-36 | 10 | 1010 | 15 | 13 | 1010 | 2 |
| EXAMPLE OF PRESENT INVENTION | 4-37 | 10 | 1010 | 59 | 2.9 | 1050 | 2 |
| | 4-38 | 10 | 1010 | 58 | 2.8 | 1100 | 3 |
| | 4-39 | 10 | 1010 | 58 | 2.8 | 1100 | 7 |
| | 4-40 | 10 | 1010 | 58 | 2.8 | 1100 | 35 |
| | 4-41 | 10 | 1010 | 58 | 2.8 | 1100 | 140 |
| | 4-42 | 10 | 1010 | 58 | 2.8 | 1100 | 420 |

| | | SECOND SAMPLE | | THIRD SAMPLE | | | |
|---|---|---|---|---|---|---|---|
| | CONDITION No. | ACCUMULATION DEGREE OF {200} PLANE (%) | ACCUMULATION DEGREE OF {222} PLANE (%) | COOLING RATE (° C./s) | DISTANCE (μm) | ACCUMULATION DEGREE OF {200} PLANE (%) | ACCUMULATION DEGREE OF {222} PLANE (%) |
| COMPARATIVE EXAMPLE | 4-1 | 13 | 13 | 100 | 50 | 13 | 13 |
| EXAMPLE OF PRESENT INVENTION | 4-2 | 30 | 11 | 100 | 54 | 30 | 11 |
| | 4-3 | 31 | 10 | 100 | 54 | 31 | 10 |
| | 4-4 | 31 | 10 | 100 | 54 | 31 | 10 |
| | 4-5 | 31 | 10 | 100 | 54 | 31 | 10 |
| | 4-6 | 31 | 10 | 100 | 54 | 31 | 10 |
| | 4-7 | 31 | 10 | 100 | 54 | 31 | 10 |
| COMPARATIVE EXAMPLE | 4-8 | 13 | 13 | 100 | 50 | 13 | 13 |
| EXAMPLE OF PRESENT INVENTION | 4-9 | 45 | 5.2 | 100 | 54 | 45 | 5.2 |
| | 4-10 | 53 | 2.7 | 100 | 54 | 53 | 2.8 |
| | 4-11 | 53 | 2.7 | 100 | 54 | 53 | 2.8 |
| | 4-12 | 53 | 2.7 | 100 | 54 | 53 | 2.8 |
| | 4-13 | 53 | 2.7 | 100 | 54 | 53 | 2.8 |
| | 4-14 | 53 | 2.7 | 100 | 54 | 53 | 2.8 |
| COMPARATIVE EXAMPLE | 4-15 | 13 | 13 | 100 | 50 | 13 | 13 |
| EXAMPLE OF PRESENT INVENTION | 4-16 | 62 | 2.1 | 100 | 54 | 62 | 2.1 |
| | 4-17 | 75 | 1.3 | 100 | 54 | 75 | 1.3 |
| | 4-18 | 75 | 1.3 | 100 | 54 | 75 | 1.3 |
| | 4-19 | 75 | 1.3 | 100 | 54 | 75 | 1.3 |
| | 4-20 | 75 | 1.3 | 100 | 54 | 75 | 1.3 |
| | 4-21 | 75 | 1.3 | 100 | 54 | 75 | 1.3 |
| COMPARATIVE EXAMPLE | 4-22 | 13 | 13 | 100 | 125 | 13 | 13 |
| EXAMPLE OF PRESENT INVENTION | 4-23 | 30 | 11 | 100 | 136 | 30 | 11 |
| | 4-24 | 32 | 9 | 100 | 136 | 32 | 9 |
| | 4-25 | 32 | 9 | 100 | 136 | 32 | 9 |
| | 4-26 | 32 | 9 | 100 | 136 | 32 | 9 |
| | 4-27 | 32 | 9 | 100 | 135 | 32 | 9 |
| | 4-28 | 32 | 9 | 100 | 136 | 32 | 9 |
| COMPARATIVE EXAMPLE | 4-29 | 13 | 13 | 100 | 125 | 13 | 13 |
| EXAMPLE OF PRESENT INVENTION | 4-30 | 44 | 4.8 | 100 | 136 | 44 | 4.8 |
| | 4-31 | 56 | 2.1 | 100 | 136 | 56 | 2.1 |
| | 4-32 | 56 | 2.1 | 100 | 136 | 56 | 2.1 |
| | 4-33 | 56 | 2.1 | 100 | 136 | 56 | 2.1 |
| | 4-34 | 56 | 2.1 | 100 | 136 | 56 | 2.1 |
| | 4-35 | 56 | 2.1 | 100 | 136 | 56 | 2.1 |
| COMPARATIVE EXAMPLE | 4-36 | 13 | 13 | 100 | 125 | 13 | 13 |
| EXAMPLE OF PRESENT INVENTION | 4-37 | 61 | 2.3 | 100 | 136 | 61 | 2.3 |
| | 4-38 | 82 | 0.8 | 100 | 136 | 82 | 0.8 |
| | 4-39 | 82 | 0.8 | 100 | 136 | 82 | 0.8 |
| | 4-40 | 82 | 0.8 | 108 | 136 | 82 | 0.8 |
| | 4-41 | 82 | 0.8 | 100 | 136 | 82 | 0.8 |
| | 4-42 | 82 | 0.8 | 100 | 138 | 82 | 0.8 |

Further, an alloying ratio of the metal layer and a ratio of an α single phase region in each Fe-based metal plate were measured as in the first experiment. Here, in finding the alloying ratio, a region where the Fe content was 0.5 mass % or less and the content of ferrite former was 99.5 mass % or more was regarded as an alloy layer. Further, a region where the Al content was 0.9 mass % or more was regarded as the α single phase region, and a ratio of the α single phase region was found from the aforesaid expression (4). Results of these are listed in Table 13.

Further, as in the first experiment, magnetic flux density B50 and saturation magnetic flux density Bs were measured and a ratio B50/Bs of the magnetic flux density B50 to the saturation magnetic flux density Bs was calculated. Further, core loss W10/1k (W10/100) at a 1000 Hz frequency when the magnetic flux density was 1.0 T was measured. Results of these are listed in Table 13.

4-37 to No. 4-42), the accumulation degree of the {200} planes in the α phase was within the ranges of the present invention at the respective stages of the heat treatment. Further, as listed in Table 13, in the examples of the present invention, the alloying ratio and the ratio of the α single phase region were within the desirable ranges of the present invention. As listed in Table 13, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumulation degree of the {200} planes was 30% or more, not only the magnetic flux density B50 but also the core loss W10/1k maintained a higher property level. Further, it could be con-

TABLE 13

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs | W10/1k (W/kg) |
|---|---|---|---|---|---|---|---|---|---|
| COMPARATIVE EXAMPLE | 4-1 | 0 | 0 | 13 | 13 | 1.60 | 2.05 | 0.78 | 92 |
| EXAMPLE OF PRESENT INVENTION | 4-2 | 9 | 0.1 | 30 | 11 | 1.74 | 2.05 | 0.85 | 65 |
| | 4-3 | 82 | 1.5 | 31 | 10 | 1.74 | 2.05 | 0.85 | 57 |
| | 4-4 | 95 | 8.2 | 30 | 10 | 1.74 | 2.05 | 0.85 | 44 |
| | 4-5 | 100 | 35 | 30 | 10 | 1.74 | 2.05 | 0.85 | 37 |
| | 4-6 | 100 | 73 | 30 | 10 | 1.74 | 2.05 | 0.85 | 43 |
| | 4-7 | 100 | 87 | 30 | 10 | 1.74 | 2.05 | 0.85 | 58 |
| COMPARATIVE EXAMPLE | 4-8 | 0 | 0 | 13 | 13 | 1.60 | 2.05 | 0.78 | 90 |
| EXAMPLE OF PRESENT INVENTION | 4-9 | 10 | 0.3 | 45 | 5.2 | 1.78 | 2.05 | 0.87 | 63 |
| | 4-10 | 64 | 2.6 | 53 | 2.7 | 1.85 | 2.05 | 0.90 | 57 |
| | 4-11 | 94 | 7.8 | 53 | 2.7 | 1.87 | 2.05 | 0.91 | 42 |
| | 4-12 | 100 | 42 | 53 | 2.7 | 1.85 | 2.05 | 0.90 | 33 |
| | 4-13 | 100 | 71 | 53 | 2.7 | 1.85 | 2.05 | 0.90 | 38 |
| | 4-14 | 100 | 95 | 53 | 2.7 | 1.87 | 2.05 | 0.91 | 53 |
| COMPARATIVE EXAMPLE | 4-15 | 0 | 0 | 13 | 13 | 1.62 | 2.05 | 0.79 | 92 |
| EXAMPLE OF PRESENT INVENTION | 4-16 | 8 | 0.2 | 62 | 2.1 | 1.89 | 2.05 | 0.92 | 62 |
| | 4-17 | 67 | 1.2 | 75 | 1.3 | 1.95 | 2.05 | 0.95 | 48 |
| | 4-18 | 89 | 5.9 | 75 | 1.4 | 1.93 | 2.05 | 0.94 | 41 |
| | 4-19 | 100 | 37 | 75 | 1.3 | 1.95 | 2.05 | 0.95 | 28 |
| | 4-20 | 100 | 72 | 76 | 1.4 | 1.97 | 2.05 | 0.96 | 33 |
| | 4-21 | 100 | 87 | 75 | 1.7 | 1.95 | 2.05 | 0.95 | 48 |
| COMPARATIVE EXAMPLE | 4-22 | 0 | 0 | 13 | 13 | 1.60 | 2.05 | 0.78 | 98 |
| EXAMPLE OF PRESENT INVENTION | 4-23 | 7 | 0.5 | 30 | 11 | 1.74 | 2.05 | 0.85 | 63 |
| | 4-24 | 57 | 1.2 | 32 | 9 | 1.74 | 2.05 | 0.85 | 56 |
| | 4-25 | 87 | 6.7 | 32 | 9 | 1.74 | 2.05 | 0.85 | 45 |
| | 4-26 | 100 | 45 | 32 | 9 | 1.74 | 2.05 | 0.85 | 37 |
| | 4-27 | 100 | 72 | 32 | 9 | 1.74 | 2.05 | 0.85 | 42 |
| | 4-28 | 100 | 92 | 32 | 9 | 1.74 | 2.05 | 0.85 | 57 |
| COMPARATIVE EXAMPLE | 4-29 | 0 | 0 | 13 | 13 | 1.60 | 2.05 | 0.78 | 96 |
| EXAMPLE OF PRESENT INVENTION | 4-30 | 6 | 0.3 | 44 | 4.8 | 1.80 | 2.05 | 0.88 | 65 |
| | 4-31 | 54 | 1.3 | 56 | 2.1 | 1.87 | 2.05 | 0.91 | 52 |
| | 4-32 | 78 | 6.1 | 56 | 2.1 | 1.85 | 2.05 | 0.90 | 41 |
| | 4-33 | 100 | 38 | 56 | 2.2 | 1.87 | 2.05 | 0.91 | 32 |
| | 4-34 | 100 | 71 | 56 | 2.1 | 1.85 | 2.05 | 0.90 | 38 |
| | 4-35 | 100 | 91 | 56 | 2.2 | 1.87 | 2.05 | 0.91 | 54 |
| COMPARATIVE EXAMPLE | 4-36 | 0 | 0 | 13 | 13 | 1.62 | 2.05 | 0.79 | 101 |
| EXAMPLE OF PRESENT INVENTION | 4-37 | 8 | 0.2 | 61 | 2.3 | 1.91 | 2.05 | 0.93 | 61 |
| | 4-38 | 70 | 2.3 | 82 | 0.8 | 1.95 | 2.05 | 0.95 | 46 |
| | 4-39 | 91 | 7.1 | 82 | 0.8 | 1.95 | 2.05 | 0.95 | 40 |
| | 4-40 | 100 | 41 | 82 | 0.8 | 1.97 | 2.05 | 0.96 | 26 |
| | 4-41 | 100 | 76 | 82 | 0.8 | 1.95 | 2.05 | 0.95 | 32 |
| | 4-42 | 100 | 100 | 82 | 0.8 | 1.97 | 2.05 | 0.96 | 48 |

As listed in Table 12, in examples of the present invention (conditions No. 4-2 to No. 4-7, No. 4-9 to No. 4-14, No. 4-16 to No. 4-21, No. 4-23 to No. 4-28, No. 4-30 to No. 4-35, No. firmed that the core loss W10/1k has a still better property level when the ratio of the α single phase region is not less than 5% nor more than 80%.

Fifth Experiment

In a fifth experiment, correlations between an accumulation degree of {200} planes and an accumulation degree of {222} planes and core loss in 42 kinds of manufacturing conditions (condition No. 5-1 to condition No. 5-42) were studied.

Base metal plates (silicon steel plates) used in the fifth experiment contained components of the composition O listed in Table 11 and inevitable impurities, with the balance being Fe. An actually measured value of the A3 point at which the base metal plates used in the fifth experiment transformed to a γ single phase was 1005° C. The base metal plates were fabricated in the same manner as that in the fourth experiment. In the condition No. 5-1 to the condition No. 5-42, cold rolling was performed in the same manners as those in the condition No. 4-1 to the condition No. 4-42 respectively.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 14.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, and it was found that, as rolled, the accumulation degree of the {200} planes in the α phase was within a 17% to 24% range and the accumulation degree of the {222} planes in the α phase was within a 17% to 24% range in each of the base metal plates.

Thereafter, Si layers as the metal layers were formed on a front surface and a rear surface of each of the base metal plates by a vapor deposition method, except in the conditions No. 5-1, No. 5-8, No. 5-15, No. 5-22, No. 5-29, and No. 5-36. Thickness of each of the Si layers (total thickness on the both surfaces) is listed in Table 14.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 14.

TABLE 14

| | CONDITION No. | COMPO-SITION | BLASTING | BASE METAL PLATE REDUCTION RATE (%) | DISLOCATION DENSITY (m/m³) | THICKNESS (μm) | METAL LAYER ELEMENT | THICKNESS (μm) |
|---|---|---|---|---|---|---|---|---|
| COMPARATIVE EXAMPLE | 5-1 | O | WITHOUT | 95 | $1 \times 10^{15}$ | 100 | NONE | |
| EXAMPLE | 5-2 | O | WITHOUT | 95 | $1 \times 10^{15}$ | 100 | Si | 10 |
| OF | 5-3 | O | WITHOUT | 95 | $1 \times 10^{15}$ | 100 | Si | 10 |
| PRESENT | 5-4 | O | WITHOUT | 95 | $1 \times 10^{15}$ | 100 | Si | 10 |
| INVENTION | 5-5 | O | WITHOUT | 95 | $1 \times 10^{15}$ | 100 | Si | 10 |
| | 5-6 | O | WITHOUT | 95 | $1 \times 10^{15}$ | 100 | Si | 10 |
| | 5-7 | O | WITHOUT | 95 | $1 \times 10^{15}$ | 100 | Si | 10 |
| COMPARATIVE EXAMPLE | 5-8 | O | WITHOUT | 97.5 | $1 \times 10^{15}$ | 100 | NONE | |
| EXAMPLE | 5-9 | O | WITHOUT | 97.5 | $1 \times 10^{15}$ | 100 | Si | 10 |
| OF | 5-10 | O | WITHOUT | 97.5 | $1 \times 10^{15}$ | 100 | Si | 10 |
| PRESENT | 5-11 | O | WITHOUT | 97.5 | $1 \times 10^{15}$ | 100 | Si | 10 |
| INVENTION | 5-12 | O | WITHOUT | 97.5 | $1 \times 10^{15}$ | 100 | Si | 10 |
| | 5-13 | O | WITHOUT | 97.5 | $1 \times 10^{15}$ | 100 | Si | 10 |
| | 5-14 | O | WITHOUT | 97.5 | $1 \times 10^{15}$ | 100 | Si | 10 |
| COMPARATIVE EXAMPLE | 5-15 | O | WITH | 95 | $8 \times 10^{15}$ | 100 | NONE | |
| EXAMPLE | 5-16 | O | WITH | 95 | $8 \times 10^{15}$ | 100 | Si | 10 |
| OF | 5-17 | O | WITH | 95 | $8 \times 10^{15}$ | 100 | Si | 10 |
| PRESENT | 5-18 | O | WITH | 95 | $8 \times 10^{15}$ | 100 | Si | 10 |
| INVENTION | 5-19 | O | WITH | 95 | $8 \times 10^{15}$ | 100 | Si | 10 |
| | 5-20 | O | WITH | 95 | $8 \times 10^{15}$ | 100 | Si | 10 |
| | 5-21 | O | WITH | 95 | $8 \times 10^{15}$ | 100 | Si | 10 |
| COMPARATIVE EXAMPLE | 5-22 | O | WITHOUT | 95 | $1 \times 10^{15}$ | 250 | NONE | |
| EXAMPLE | 5-23 | O | WITHOUT | 95 | $1 \times 10^{15}$ | 250 | Si | 25 |
| OF | 5-24 | O | WITHOUT | 95 | $1 \times 10^{15}$ | 250 | Si | 25 |
| PRESENT | 5-25 | O | WITHOUT | 95 | $1 \times 10^{15}$ | 250 | Si | 25 |
| INVENTION | 5-26 | O | WITHOUT | 95 | $1 \times 10^{15}$ | 250 | Si | 25 |
| | 5-27 | O | WITHOUT | 95 | $1 \times 10^{15}$ | 250 | Si | 25 |
| | 5-28 | O | WITHOUT | 95 | $1 \times 10^{15}$ | 250 | Si | 25 |
| COMPARATIVE EXAMPLE | 5-29 | O | WITHOUT | 97.5 | $1 \times 10^{16}$ | 250 | NONE | |
| EXAMPLE | 5-30 | O | WITHOUT | 97.5 | $1 \times 10^{16}$ | 250 | Si | 25 |
| OF | 5-31 | O | WITHOUT | 97.5 | $1 \times 10^{16}$ | 250 | Si | 25 |
| PRESENT | 5-32 | O | WITHOUT | 97.5 | $1 \times 10^{16}$ | 250 | Si | 25 |
| INVENTION | 5-33 | O | WITHOUT | 97.5 | $1 \times 10^{16}$ | 250 | Si | 25 |
| | 5-34 | O | WITHOUT | 97.5 | $1 \times 10^{16}$ | 250 | Si | 25 |
| | 5-35 | O | WITHOUT | 97.5 | $1 \times 10^{16}$ | 250 | Si | 25 |

TABLE 14-continued

| | | | | | | | | |
|---|---|---|---|---|---|---|---|---|
| COMPARATIVE EXAMPLE | 5-36 | O | WITH | 95 | $8 \times 10^{16}$ | 250 | NONE | |
| EXAMPLE OF PRESENT INVENTION | 5-37 | O | WITH | 95 | $8 \times 10^{16}$ | 250 | Si | 25 |
| | 5-38 | O | WITH | 95 | $8 \times 10^{16}$ | 250 | Si | 25 |
| | 5-39 | O | WITH | 85 | $8 \times 10^{16}$ | 250 | Si | 25 |
| | 5-40 | O | WITH | 95 | $8 \times 10^{16}$ | 250 | Si | 25 |
| | 5-41 | O | WITH | 95 | $8 \times 10^{16}$ | 250 | Si | 25 |
| | 5-42 | O | WITH | 95 | $8 \times 10^{16}$ | 250 | Si | 25 |

| | | FIRST SAMPLE | | | | SECOND SAMPLE | |
|---|---|---|---|---|---|---|---|
| | CONDITION No. | HETING RATE (° C./s) | MEASURED TEMPERATURE (° C.) | ACCUMULATION DEGREE OF {200} PLANE (%) | ACCUMULATION DEGREE OF {222} PLANE (%) | KEEPING TEMPERATURE (° C.) | KEEPING TIME (s) |
| COMPARATIVE EXAMPLE | 5-1 | 20 | 1005 | 15 | 14 | 1050 | 2 |
| EXAMPLE OF PRESENT INVENTION | 5-2 | 20 | 1005 | 25 | 15 | 1005 | 2 |
| | 5-3 | 20 | 1005 | 25 | 15 | 1050 | 2 |
| | 5-4 | 20 | 1005 | 25 | 15 | 1050 | 5 |
| | 5-5 | 20 | 1005 | 25 | 15 | 1050 | 30 |
| | 5-6 | 20 | 1005 | 25 | 15 | 1050 | 120 |
| | 5-7 | 20 | 1005 | 25 | 15 | 1050 | 360 |
| COMPARATIVE EXAMPLE | 5-8 | 20 | 1005 | 17 | 13 | 1050 | 2 |
| EXAMPLE OF PRESENT INVENTION | 5-9 | 20 | 1005 | 38 | 4.1 | 1005 | 2 |
| | 5-10 | 20 | 1005 | 38 | 4.1 | 1050 | 2 |
| | 5-11 | 20 | 1005 | 38 | 4.1 | 1050 | 5 |
| | 5-12 | 20 | 1005 | 38 | 4.1 | 1050 | 30 |
| | 5-13 | 20 | 1005 | 38 | 4.1 | 1050 | 120 |
| | 5-14 | 20 | 1005 | 38 | 4.1 | 1050 | 360 |
| COMPARATIVE EXAMPLE | 5-15 | 20 | 1005 | 15 | 13 | 1050 | 2 |
| EXAMPLE OF PRESENT INVENTION | 5-16 | 20 | 1005 | 56 | 2.8 | 1005 | 2 |
| | 5-17 | 20 | 1005 | 56 | 2.8 | 1050 | 2 |
| | 5-18 | 20 | 1005 | 56 | 2.8 | 1050 | 5 |
| | 5-19 | 20 | 1005 | 56 | 2.8 | 1050 | 30 |
| | 5-20 | 20 | 1005 | 56 | 2.8 | 1050 | 120 |
| | 5-21 | 20 | 1005 | 56 | 2.8 | 1050 | 360 |
| COMPARATIVE EXAMPLE | 5-22 | 20 | 1005 | 16 | 14 | 1100 | 2 |
| EXAMPLE OF PRESENT INVENTION | 5-23 | 20 | 1005 | 26 | 14 | 1005 | 2 |
| | 5-24 | 20 | 1005 | 26 | 14 | 1100 | 3 |
| | 5-25 | 20 | 1005 | 26 | 14 | 1100 | 7 |
| | 5-26 | 20 | 1005 | 26 | 14 | 1100 | 35 |
| | 5-27 | 20 | 1005 | 26 | 14 | 1100 | 140 |
| | 5-28 | 20 | 1005 | 26 | 14 | 1100 | 420 |
| COMPARATIVE EXAMPLE | 5-29 | 20 | 1005 | 17 | 13 | 1100 | 2 |
| EXAMPLE OF PRESENT INVENTION | 5-30 | 20 | 1005 | 39 | 3.8 | 1005 | 2 |
| | 5-31 | 20 | 1005 | 39 | 3.8 | 1100 | 3 |
| | 5-32 | 20 | 1005 | 39 | 3.8 | 1100 | 7 |
| | 5-33 | 20 | 1005 | 39 | 3.8 | 1100 | 35 |
| | 5-34 | 20 | 1005 | 39 | 3.8 | 1100 | 140 |
| | 5-35 | 20 | 1005 | 39 | 3.8 | 1100 | 420 |
| COMPARATIVE EXAMPLE | 5-36 | 10 | 1005 | 17 | 14 | 1100 | 2 |
| EXAMPLE OF PRESENT INVENTION | 5-37 | 20 | 1005 | 54 | 2.7 | 1005 | 2 |
| | 5-38 | 20 | 1005 | 54 | 2.7 | 1100 | 3 |
| | 5-39 | 20 | 1005 | 54 | 2.7 | 1100 | 7 |
| | 5-40 | 20 | 1005 | 54 | 2.7 | 1100 | 35 |
| | 5-41 | 20 | 1005 | 54 | 2.7 | 1100 | 140 |
| | 5-42 | 20 | 1005 | 54 | 2.7 | 1100 | 420 |

| | | SECOND SAMPLE | | | | THIRD SAMPLE | |
|---|---|---|---|---|---|---|---|
| | CONDITION No. | ACCUMULATION DEGREE OF {200} PLANE (%) | ACCUMULATION DEGREE OF {222} PLANE (%) | COOLING RATE (° C./s) | DISTANCE (μm) | ACCUMULATION DEGREE OF {200} PLANE (%) | ACCUMULATION DEGREE OF {222} PLANE (%) |
| COMPARATIVE EXAMPLE | 5-1 | 13 | 13 | 100 | 50 | 13 | 13 |
| EXAMPLE | 5-2 | 31 | 12 | 100 | 54 | 31 | 12 |

TABLE 14-continued

| | | | | | | | |
|---|---|---|---|---|---|---|---|
| OF | 5-3 | 32 | 9 | 20 | 54 | 32 | 9 |
| PRESENT | 5-4 | 32 | 9 | 20 | 54 | 32 | 9 |
| INVENTION | 5-5 | 32 | 9 | 20 | 54 | 32 | 9 |
| | 5-6 | 32 | 9 | 20 | 54 | 32 | 9 |
| | 5-7 | 32 | 9 | 20 | 54 | 32 | 9 |
| COMPARATIVE EXAMPLE | 5-8 | 13 | 13 | 100 | 50 | 13 | 13 |
| EXAMPLE | 5-9 | 43 | 5.7 | 100 | 54 | 43 | 5.7 |
| OF | 5-10 | 55 | 2.1 | 20 | 54 | 55 | 2.1 |
| PRESENT | 5-11 | 55 | 2.1 | 20 | 54 | 55 | 2.1 |
| INVENTION | 5-12 | 55 | 2.1 | 20 | 54 | 55 | 2.1 |
| | 5-13 | 55 | 2.1 | 20 | 54 | 55 | 2.1 |
| | 5-14 | 55 | 2.1 | 20 | 54 | 55 | 2.1 |
| COMPARATIVE EXAMPLE | 5-15 | 13 | 13 | 100 | 50 | 13 | 13 |
| EXAMPLE | 5-16 | 58 | 2.4 | 100 | 54 | 58 | 2.4 |
| OF | 5-17 | 78 | 1.1 | 20 | 54 | 78 | 1.1 |
| PRESENT | 5-18 | 78 | 1.1 | 20 | 54 | 78 | 1.1 |
| INVENTION | 5-19 | 78 | 1.1 | 20 | 54 | 78 | 1.1 |
| | 5-20 | 78 | 1.1 | 20 | 54 | 78 | 1.1 |
| | 5-21 | 78 | 1.1 | 20 | 54 | 78 | 1.1 |
| COMPARATIVE EXAMPLE | 5-22 | 13 | 13 | 100 | 125 | 13 | 13 |
| EXAMPLE | 5-23 | 30 | 12 | 100 | 136 | 30 | 12 |
| OF | 5-24 | 31 | 10 | 20 | 136 | 31 | 10 |
| PRESENT | 5-25 | 31 | 10 | 20 | 136 | 31 | 10 |
| INVENTION | 5-26 | 31 | 10 | 20 | 136 | 31 | 10 |
| | 5-27 | 31 | 10 | 20 | 136 | 31 | 10 |
| | 5-28 | 31 | 10 | 20 | 136 | 31 | 10 |
| COMPARATIVE EXAMPLE | 5-29 | 13 | 13 | 100 | 125 | 13 | 13 |
| EXAMPLE | 5-30 | 42 | 5 | 100 | 136 | 42 | 5 |
| OF | 5-31 | 58 | 1.9 | 20 | 136 | 58 | 1.9 |
| PRESENT | 5-32 | 58 | 1.9 | 20 | 136 | 58 | 1.9 |
| INVENTION | 5-33 | 58 | 1.9 | 20 | 136 | 58 | 1.9 |
| | 5-34 | 58 | 1.9 | 20 | 136 | 58 | 1.9 |
| | 5-35 | 58 | 1.9 | 20 | 136 | 58 | 1.9 |
| COMPARATIVE EXAMPLE | 5-36 | 13 | 13 | 100 | 125 | 13 | 13 |
| EXAMPLE | 5-37 | 52 | 2.1 | 100 | 136 | 62 | 2.1 |
| OF | 5-38 | 87 | 0.3 | 20 | 136 | 87 | 0.3 |
| PRESENT | 5-39 | 87 | 0.3 | 20 | 136 | 87 | 0.3 |
| INVENTION | 5-40 | 87 | 0.3 | 20 | 136 | 87 | 0.3 |
| | 5-41 | 87 | 0.3 | 20 | 136 | 87 | 0.3 |
| | 5-42 | 87 | 0.3 | 20 | 136 | 87 | 0.3 |

Further, an alloying ratio of the metal layer and a ratio of an α single phase region in each Fe-based metal plate were measured as in the first experiment. Here, in finding the alloying ratio, a region where the Fe content was 0.5 mass % or less and the content of ferrite former was 99.5 mass % or more was regarded as an alloy layer. Further, a region where the Si content was 1.9 mass % or more was regarded as the α single phase region, and a ratio of the α single phase region was found from the aforesaid expression (4). Results of these are listed in Table 15.

Further, as in the first experiment, magnetic flux density B50 and saturation magnetic flux density Bs were measured and a ratio B50/Bs of the magnetic flux density B50 to the saturation magnetic flux density Bs was calculated. Further, core loss W10/1k (W10/1000) at a 1000 Hz frequency when the magnetic flux density was 1.0 T was measured. Results of these are listed in Table 15.

TABLE 15

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs | W10/1k (W/kg) |
|---|---|---|---|---|---|---|---|---|---|
| COMPARATIVE EXAMPLE | 5-1 | 0 | 0 | 13 | 13 | 1.61 | 2.07 | 0.78 | 93 |
| EXAMPLE | 5-2 | 8 | 0.2 | 31 | 12 | 1.76 | 2.07 | 0.85 | 64 |
| OF | 5-3 | 67 | 2.1 | 32 | 9 | 1.78 | 2.07 | 0.86 | 59 |
| PRESENT | 5-4 | 89 | 7.6 | 32 | 9 | 1.78 | 2.07 | 0.86 | 45 |
| INVENTION | 5-5 | 100 | 40 | 32 | 9 | 1.78 | 2.07 | 0.86 | 38 |
| | 5-6 | 100 | 71 | 32 | 9 | 1.78 | 2.07 | 0.86 | 42 |
| | 5-7 | 100 | 95 | 32 | 9 | 1.78 | 2.07 | 0.86 | 59 |
| COMPARATIVE EXAMPLE | 5-8 | 0 | 0 | 13 | 13 | 1.61 | 2.07 | 0.78 | 91 |
| EXAMPLE | 5-9 | 10 | 0.3 | 43 | 5.7 | 1.80 | 2.07 | 0.87 | 62 |

TABLE 15-continued

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs | W10/1k (W/kg) |
|---|---|---|---|---|---|---|---|---|---|
| OF | 5-10 | 51 | 1.2 | 55 | 2.1 | 1.88 | 2.07 | 0.91 | 53 |
| PRESENT | 5-11 | 82 | 5.9 | 55 | 2.1 | 1.88 | 2.07 | 0.91 | 41 |
| INVENTION | 5-12 | 100 | 38 | 55 | 2.1 | 1.88 | 2.07 | 0.91 | 32 |
| | 5-13 | 100 | 72 | 55 | 2.1 | 1.88 | 2.07 | 0.91 | 35 |
| | 5-14 | 100 | 89 | 55 | 2.1 | 1.88 | 2.07 | 0.91 | 53 |
| COMPARATIVE EXAMPLE | 5-15 | 0 | 0 | 13 | 13 | 1.64 | 2.07 | 0.79 | 94 |
| EXAMPLE | 5-16 | 8 | 0.2 | 58 | 2.4 | 1.90 | 2.07 | 0.92 | 61 |
| OF | 5-17 | 72 | 2.3 | 78 | 1.1 | 1.99 | 2.07 | 0.96 | 47 |
| PRESENT | 5-18 | 87 | 6.8 | 78 | 1.1 | 1.99 | 2.07 | 0.96 | 40 |
| INVENTION | 5-19 | 100 | 42 | 78 | 1.1 | 1.99 | 2.07 | 0.96 | 29 |
| | 5-20 | 100 | 62 | 78 | 1.1 | 1.99 | 2.07 | 0.96 | 32 |
| | 5-21 | 100 | 90 | 78 | 1.1 | 1.99 | 2.07 | 0.96 | 48 |
| COMPARATIVE EXAMPLE | 5-22 | 0 | 0 | 13 | 13 | 1.61 | 2.07 | 0.78 | 102 |
| EXAMPLE | 5-23 | 7 | 0.5 | 30 | 12 | 1.76 | 2.07 | 0.85 | 61 |
| OF | 5-24 | 62 | 1.6 | 31 | 10 | 1.78 | 2.07 | 0.86 | 59 |
| PRESENT | 5-25 | 86 | 7.1 | 31 | 10 | 1.78 | 2.07 | 0.86 | 43 |
| INVENTION | 5-26 | 100 | 32 | 31 | 10 | 1.78 | 2.07 | 0.86 | 36 |
| | 5-27 | 100 | 63 | 31 | 10 | 1.78 | 2.07 | 0.86 | 41 |
| | 5-28 | 100 | 100 | 31 | 10 | 1.78 | 2.07 | 0.86 | 57 |
| COMPARATIVE EXAMPLE | 5-29 | 0 | 0 | 13 | 13 | 1.61 | 2.07 | 0.78 | 97 |
| EXAMPLE | 5-30 | 6 | 0.3 | 42 | 5 | 1.82 | 2.07 | 0.88 | 62 |
| OF | 5-31 | 46 | 1.1 | 58 | 1.9 | 1.86 | 2.07 | 0.90 | 53 |
| PRESENT | 5-32 | 82 | 8.3 | 58 | 1.9 | 1.86 | 2.07 | 0.90 | 41 |
| INVENTION | 5-33 | 100 | 43 | 58 | 1.9 | 1.86 | 2.07 | 0.90 | 33 |
| | 5-34 | 100 | 72 | 58 | 1.9 | 1.86 | 2.07 | 0.90 | 37 |
| | 5-35 | 100 | 98 | 58 | 1.9 | 1.86 | 2.07 | 0.90 | 54 |
| COMPARATIVE EXAMPLE | 5-36 | 0 | 0 | 13 | 13 | 1.64 | 2.07 | 0.79 | 98 |
| EXAMPLE | 5-37 | 8 | 0.2 | 62 | 2.1 | 1.93 | 2.07 | 0.93 | 64 |
| OF | 5-38 | 69 | 3.2 | 87 | 0.3 | 1.99 | 2.07 | 0.96 | 46 |
| PRESENT | 5-39 | 89 | 8.1 | 87 | 0.3 | 1.99 | 2.07 | 0.96 | 40 |
| INVENTION | 5-40 | 100 | 45 | 87 | 0.3 | 1.99 | 2.07 | 0.96 | 27 |
| | 5-41 | 100 | 68 | 87 | 0.3 | 1.99 | 2.07 | 0.96 | 34 |
| | 5-42 | 100 | 92 | 87 | 0.3 | 1.99 | 2.07 | 0.96 | 46 |

As listed in Table 14, in examples of the present invention (conditions No. 5-2 to No. 5-7, No. 5-9 to No. 5-14, No. 5-16 to No. 5-21, No. 5-23 to No. 5-28, No. 5-30 to No. 5-35, No. 5-37 to No. 5-42), the accumulation degree of the {200} planes in the α phase was within the ranges of the present invention at the respective stages of the heat treatment. Further, as listed in Table 15, in the examples of the present invention, the alloying ratio and the ratio of the α single phase region were within the desirable ranges of the present invention. As listed in Table 15, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumulation degree of the {200} planes was 30% or more, not only the magnetic flux density B50 but also the core loss W10/1k maintained a higher property level. Further, it could be confirmed that the core loss W10/1k has a still better property level when the ratio of the α single phase region is not less than 5% nor more than 80%.

Sixth Experiment

In a sixth experiment, correlations between an accumulation degree of {200} planes and an accumulation degree of {222} planes and core loss in 42 kinds of manufacturing conditions (condition No. 6-1 to condition No. 6-42) were studied.

Base metal plates (silicon steel plates) used in the sixth experiment contained components of the composition P listed in Table 11 and inevitable impurities, with the balance being Fe. An actually measured value of the A3 point at which the base metal plates used in the sixth experiment transformed to a γ single phase was 1010° C. The base metal plates were fabricated in the same manner as that in the fourth experiment. In the condition No. 6-1 to the condition No. 6-42, cold rolling was performed in the same manners as those in the condition No. 4-1 to the condition No. 4-42 respectively.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 16.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, and it was found that, as rolled, the accumulation degree of the {200} planes in the α phase was within a 17% to 24% range and the accumulation degree of the {222} planes in the α phase was within a 17% to 24% range in each of the base metal plates.

Thereafter, Sn layers as the metal layers were formed on a front surface and a rear surface of each of the base metal plates by an electroplating method, except in the conditions No. 6-1, No. 6-8, No. 6-15, No. 6-22, No. 6-29, and No. 6-36. Thickness of each of the Sn layers (total thickness on the both surfaces) is listed in Table 16.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 16.

TABLE 16

|  | CONDITION No. | BASE METAL PLATE ||||| METAL LAYER ||
|  |  | COMPO- SITION | BLASTING | REDUCTION RATE (%) | DISLOCATION DENSITY (m/m$^3$) | THICKNESS (μm) | ELEMENT | THICKNESS (μm) |
|---|---|---|---|---|---|---|---|---|
| COMPARATIVE EXAMPLE | 6-1 | P | WITHOUT | 95 | 1 × 10$^{15}$ | 100 | NONE |  |
| EXAMPLE | 6-2 | P | WITHOUT | 95 | 1 × 10$^{15}$ | 100 | Sn | 3.2 |
| OF | 6-3 | P | WITHOUT | 95 | 1 × 10$^{15}$ | 100 | Sn | 3.2 |
| PRESENT | 6-4 | P | WITHOUT | 95 | 1 × 10$^{15}$ | 100 | Sn | 3.2 |
| INVENTION | 6-5 | P | WITHOUT | 95 | 1 × 10$^{15}$ | 100 | Sn | 3.2 |
|  | 6-6 | P | WITHOUT | 95 | 1 × 10$^{15}$ | 100 | Sn | 3.2 |
|  | 6-7 | P | WITHOUT | 95 | 1 × 10$^{15}$ | 100 | Sn | 3.2 |
| COMPARATIVE EXAMPLE | 6-8 | P | WITHOUT | 97.5 | 1 × 10$^{15}$ | 100 | NONE |  |
| EXAMPLE | 6-9 | P | WITHOUT | 97.5 | 1 × 10$^{16}$ | 100 | Sn | 3.2 |
| OF | 6-10 | P | WITHOUT | 97.5 | 1 × 10$^{16}$ | 100 | Sn | 3.2 |
| PRESENT | 6-11 | P | WITHOUT | 97.5 | 1 × 10$^{16}$ | 100 | Sn | 3.2 |
| INVENTION | 6-12 | P | WITHOUT | 97.5 | 1 × 10$^{16}$ | 100 | Sn | 3.2 |
|  | 6-13 | P | WITHOUT | 97.5 | 1 × 10$^{16}$ | 100 | Sn | 3.2 |
|  | 6-14 | P | WITHOUT | 97.5 | 1 × 10$^{16}$ | 100 | Sn | 3.2 |
| COMPARATIVE EXAMPLE | 6-15 | P | WITH | 95 | 8 × 10$^{16}$ | 100 | NONE |  |
| EXAMPLE | 6-16 | P | WITH | 95 | 8 × 10$^{16}$ | 100 | Sn | 3.2 |
| OF | 6-17 | P | WITH | 95 | 8 × 10$^{16}$ | 100 | Sn | 3.2 |
| PRESENT | 6-18 | P | WITH | 95 | 8 × 10$^{16}$ | 100 | Sn | 3.2 |
| INVENTION | 6-19 | P | WITH | 95 | 8 × 10$^{16}$ | 100 | Sn | 3.2 |
|  | 6-20 | P | WITH | 95 | 8 × 10$^{16}$ | 100 | Sn | 3.2 |
|  | 6-21 | P | WITH | 95 | 8 × 10$^{16}$ | 100 | Sn | 3.2 |
| COMPARATIVE EXAMPLE | 6-22 | P | WITHOUT | 95 | 1 × 10$^{15}$ | 250 | NONE |  |
| EXAMPLE | 6-23 | P | WITHOUT | 95 | 1 × 10$^{15}$ | 250 | Sn | 8 |
| OF | 6-24 | P | WITHOUT | 65 | 1 × 10$^{15}$ | 250 | Sn | 8 |
| PRESENT | 6-25 | P | WITHOUT | 95 | 1 × 10$^{15}$ | 250 | Sn | 8 |
| INVENTION | 6-26 | P | WITHOUT | 95 | 1 × 10$^{15}$ | 250 | Sn | 8 |
|  | 6-27 | P | WITHOUT | 95 | 1 × 10$^{15}$ | 250 | Sn | 8 |
|  | 6-28 | P | WITHOUT | 95 | 1 × 10$^{15}$ | 250 | Sn | 8 |
| COMPARATIVE EXAMPLE | 6-29 | P | WITHOUT | 97.5 | 1 × 10$^{15}$ | 250 | NONE |  |
| EXAMPLE | 6-30 | P | WITHOUT | 97.5 | 1 × 10$^{15}$ | 250 | Sn | 8 |
| OF | 6-31 | P | WITHOUT | 97.5 | 1 × 10$^{15}$ | 250 | Sn | 8 |
| PRESENT | 6-32 | P | WITHOUT | 97.5 | 1 × 10$^{15}$ | 250 | Sn | 8 |
| INVENTION | 6-33 | P | WITHOUT | 97.5 | 1 × 10$^{15}$ | 250 | Sn | 8 |
|  | 6-34 | P | WITHOUT | 97.5 | 1 × 10$^{15}$ | 250 | Sn | 8 |
|  | 6-35 | P | WITHOUT | 97.5 | 1 × 10$^{15}$ | 250 | Sn | 8 |
| COMPARATIVE EXAMPLE | 6-36 | P | WITH | 95 | 8 × 10$^{15}$ | 250 | NONE |  |
| EXAMPLE | 6-37 | P | WITH | 95 | 8 × 10$^{18}$ | 250 | Sn | 8 |
| OF | 6-38 | P | WITH | 95 | 8 × 10$^{18}$ | 250 | Sn | 8 |
| PRESENT | 6-39 | P | WITH | 95 | 8 × 10$^{18}$ | 250 | Sn | 8 |
| INVENTION | 6-40 | P | WITH | 95 | 8 × 10$^{18}$ | 250 | Sn | 8 |
|  | 6-41 | P | WITH | 95 | 8 × 10$^{18}$ | 250 | Sn | 8 |
|  | 6-42 | P | WITH | 95 | 8 × 10$^{18}$ | 250 | Sn | 8 |

|  | CONDITION No. | FIRST SAMPLE |||| SECOND SAMPLE ||
|  |  | HETING RATE (° C./s) | MEASURED TEMPERATURE (° C.) | ACCUMULATION DEGREE OF {200} PLANE (%) | ACCUMULATION DEGREE OF {222} PLANE (%) | KEEPING TEMPERATURE (° C.) | KEEPING TIME (s) |
|---|---|---|---|---|---|---|---|
| COMPARATIVE EXAMPLE | 6-1 | 10 | 1010 | 18 | 13 | 1050 | 2 |
| EXAMPLE | 6-2 | 10 | 1010 | 26 | 14 | 1010 | 2 |
| OF | 6-3 | 10 | 1010 | 26 | 14 | 1050 | 2 |

TABLE 16-continued

|  | | | | | | | |
|---|---|---|---|---|---|---|---|
| PRESENT INVENTION | 6-4 | 10 | 1010 | 26 | 14 | 1050 | 5 |
|  | 6-5 | 10 | 1010 | 26 | 14 | 1050 | 30 |
|  | 6-6 | 10 | 1010 | 26 | 14 | 1050 | 120 |
|  | 6-7 | 10 | 1010 | 26 | 14 | 1050 | 360 |
| COMPARATIVE EXAMPLE | 6-8 | 10 | 1010 | 18 | 13 | 1050 | 2 |
| EXAMPLE | 6-9 | 10 | 1010 | 35 | 5 | 1010 | 2 |
| OF | 6-10 | 10 | 1010 | 35 | 5 | 1050 | 2 |
| PRESENT | 6-11 | 10 | 1010 | 35 | 5 | 1050 | 5 |
| INVENTION | 6-12 | 10 | 1010 | 35 | 5 | 1050 | 30 |
|  | 6-13 | 10 | 1010 | 35 | 5 | 1050 | 120 |
|  | 6-14 | 10 | 1010 | 35 | 5 | 1050 | 360 |
| COMPARATIVE EXAMPLE | 6-15 | 10 | 1010 | 18 | 13 | 1050 | 2 |
| EXAMPLE | 6-16 | 10 | 1010 | 60 | 2.5 | 1010 | 2 |
| OF | 6-17 | 10 | 1010 | 60 | 2.5 | 1050 | 2 |
| PRESENT | 6-18 | 10 | 1010 | 60 | 2.5 | 1050 | 5 |
| INVENTION | 6-19 | 10 | 1010 | 60 | 2.5 | 1050 | 30 |
|  | 6-20 | 10 | 1010 | 60 | 2.5 | 1050 | 120 |
|  | 6-21 | 10 | 1010 | 60 | 2.5 | 1050 | 360 |
| COMPARATIVE EXAMPLE | 6-22 | 10 | 1010 | 18 | 13 | 1100 | 2 |
| EXAMPLE | 6-23 | 10 | 1010 | 25 | 16 | 1010 | 2 |
| OF | 6-24 | 10 | 1010 | 25 | 16 | 1100 | 3 |
| PRESENT | 6-25 | 10 | 1010 | 25 | 16 | 1100 | 7 |
| INVENTION | 6-26 | 10 | 1010 | 25 | 16 | 1100 | 35 |
|  | 6-27 | 10 | 1010 | 25 | 16 | 1100 | 140 |
|  | 6-28 | 10 | 1010 | 25 | 16 | 1100 | 420 |
| COMPARATIVE EXAMPLE | 6-29 | 10 | 1010 | 18 | 13 | 1100 | 2 |
| EXAMPLE | 6-30 | 10 | 1010 | 37 | 4.1 | 1010 | 2 |
| OF | 6-31 | 10 | 1010 | 37 | 4.1 | 1100 | 3 |
| PRESENT | 6-32 | 10 | 1010 | 37 | 4.1 | 1100 | 7 |
| INVENTION | 6-33 | 10 | 1010 | 37 | 4.1 | 1100 | 35 |
|  | 6-34 | 10 | 1010 | 37 | 4.1 | 1100 | 140 |
|  | 6-35 | 10 | 1010 | 37 | 4.1 | 1100 | 420 |
| COMPARATIVE EXAMPLE | 6-36 | 10 | 1010 | 18 | 13 | 1100 | 2 |
| EXAMPLE | 6-37 | 10 | 1010 | 57 | 2.5 | 1010 | 2 |
| OF | 6-38 | 10 | 1010 | 57 | 2.5 | 1100 | 3 |
| PRESENT | 6-39 | 10 | 1010 | 57 | 2.5 | 1100 | 7 |
| INVENTION | 6-40 | 10 | 1010 | 57 | 2.5 | 1100 | 35 |
|  | 6-41 | 10 | 1010 | 57 | 2.5 | 1100 | 140 |
|  | 6-42 | 10 | 1010 | 57 | 2.5 | 1100 | 420 |

|  | | SECOND SAMPLE | | THIRD SAMPLE | | | |
|---|---|---|---|---|---|---|---|
|  | CONDITION No. | ACCUMULATION DEGREE OF [200] PLANE (%) | ACCUMULATION DEGREE OF [222] PLANE (%) | COOLING RATE (° C./s) | DISTANCE (μm) | ACCUMULATION DEGREE OF [200] PLANE (%) | ACCUMULATION DEGREE OF {222} PLANE (%) |
| COMPARATIVE EXAMPLE | 6-1 | 13 | 13 | 5 | 50 | 13 | 13 |
| EXAMPLE | 6-2 | 30 | 10 | 5 | 54 | 30 | 10 |
| OF | 6-3 | 33 | 8 | 5 | 54 | 33 | 8 |
| PRESENT | 6-4 | 33 | 8 | 5 | 54 | 33 | 8 |
| INVENTION | 6-5 | 33 | 8 | 5 | 54 | 33 | 8 |
|  | 6-6 | 33 | 8 | 5 | 54 | 33 | 8 |
|  | 6-7 | 33 | 8 | 5 | 54 | 33 | 8 |
| COMPARATIVE EXAMPLE | 6-8 | 13 | 13 | 5 | 54 | 13 | 13 |
| EXAMPLE | 6-9 | 43 | 42 | 5 | 54 | 43 | 4.2 |
| OF | 6-10 | 54 | 1.8 | 5 | 54 | 54 | 1.8 |
| PRESENT | 6-11 | 54 | 1.8 | 5 | 54 | 54 | 1.8 |
| INVENTION | 6-12 | 54 | 1.8 | 5 | 54 | 54 | 1.8 |
|  | 6-13 | 54 | 1.8 | 5 | 54 | 54 | 1.8 |
|  | 6-14 | 54 | 1.8 | 5 | 54 | 54 | 1.8 |
| COMPARATIVE EXAMPLE | 6-15 | 13 | 13 | 5 | 50 | 13 | 13 |
| EXAMPLE | 6-16 | 64 | 2.2 | 5 | 54 | 64 | 22 |
| OF | 6-17 | 80 | 0.9 | 5 | 54 | 80 | 0.9 |
| PRESENT | 6-18 | 80 | 0.9 | 5 | 54 | 80 | 0.9 |
| INVENTION | 6-19 | 80 | 0.9 | 5 | 54 | 80 | 0.9 |
|  | 6-20 | 80 | 0.9 | 5 | 54 | 80 | 0.9 |
|  | 6-21 | 60 | 0.9 | 5 | 54 | 80 | 0.9 |
| COMPARATIVE EXAMPLE | 6-22 | 13 | 13 | 5 | 125 | 13 | 13 |
| EXAMPLE | 6-23 | 30 | 10 | 5 | 138 | 30 | 10 |
| OF | 6-24 | 31 | 9 | 5 | 136 | 31 | 9 |

TABLE 16-continued

| | CONDITION No. | | | | | | |
|---|---|---|---|---|---|---|---|
| PRESENT INVENTION | 6-25 | 31 | 9 | 5 | 138 | 31 | 9 |
| | 6-26 | 31 | 9 | 5 | 136 | 31 | 9 |
| | 6-27 | 31 | 9 | 5 | 136 | 31 | 9 |
| | 6-28 | 31 | 9 | 5 | 136 | 31 | 9 |
| COMPARATIVE EXAMPLE | 6-29 | 13 | 13 | 5 | 125 | 13 | 13 |
| EXAMPLE OF PRESENT INVENTION | 6-30 | 42 | 4.9 | 5 | 136 | 42 | 4.9 |
| | 6-31 | 55 | 2.3 | 5 | 136 | 55 | 2.3 |
| | 6-32 | 55 | 2.3 | 5 | 136 | 55 | 2.3 |
| | 6-33 | 55 | 2.3 | 5 | 136 | 55 | 2.3 |
| | 6-34 | 55 | 2.3 | 5 | 136 | 55 | 2.3 |
| | 6-35 | 55 | 2.3 | 5 | 136 | 55 | 2.3 |
| COMPARATIVE EXAMPLE | 6-36 | 13 | 13 | 5 | 125 | 13 | 13 |
| EXAMPLE OF PRESENT INVENTION | 6-37 | 62 | 2.1 | 5 | 136 | 62 | 2.1 |
| | 6-38 | 74 | 0.3 | 5 | 136 | 74 | 0.3 |
| | 6-39 | 74 | 0.3 | 5 | 136 | 74 | 0.3 |
| | 6-40 | 74 | 0.3 | 5 | 136 | 74 | 0.3 |
| | 6-41 | 74 | 0.3 | 5 | 136 | 74 | 0.3 |
| | 6-42 | 74 | 0.3 | 5 | 136 | 74 | 0.3 |

Further, an alloying ratio of the metal layer and a ratio of an α single phase region in each Fe-based metal plate were measured as in the first experiment. Here, in finding the alloying ratio, a region where the Fe content was 0.5 mass % or less and the content of ferrite former was 99.5 mass % or more was regarded as an alloy layer. Further, a region where the Sn content was 3.0 mass % or more was regarded as the α single phase region, and a ratio of the α single phase region was found from the aforesaid expression (4). Results of these are listed in Table 17.

Further, as in the first experiment, magnetic flux density B50 and saturation magnetic flux density Bs were measured and a ratio B50/Bs of the magnetic flux density B50 to the saturation magnetic flux density Bs was calculated. Further, core loss W10/1k (W10/1000) at a 1000 Hz frequency when the magnetic flux density was 1.0 T was measured. Results of these are listed in Table 17.

TABLE 17

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs | W10/1K (W/kg) |
|---|---|---|---|---|---|---|---|---|---|
| COMPARATIVE EXAMPLE | 6-1 | 0 | 0 | 13 | 13 | 1.61 | 2.06 | 0.78 | 91 |
| EXAMPLE OF PRESENT INVENTION | 6-2 | 6 | 0.2 | 30 | 10 | 1.75 | 2.06 | 0.85 | 64 |
| | 6-3 | 43 | 1.8 | 33 | 8 | 1.75 | 2.06 | 0.85 | 56 |
| | 6-4 | 78 | 6.2 | 33 | 8 | 1.75 | 2.06 | 0.85 | 43 |
| | 6-5 | 100 | 38 | 33 | 8 | 1.75 | 2.06 | 0.85 | 38 |
| | 6-6 | 100 | 68 | 33 | 8 | 1.75 | 2.06 | 0.85 | 43 |
| | 6-7 | 100 | 87 | 33 | 8 | 1.75 | 2.06 | 0.85 | 58 |
| COMPARATIVE EXAMPLE | 6-8 | 0 | 0 | 13 | 13 | 1.61 | 2.06 | 0.78 | 92 |
| EXAMPLE OF PRESENT INVENTION | 6-9 | 7 | 0.1 | 43 | 4.2 | 1.79 | 2.06 | 0.87 | 61 |
| | 6-10 | 65 | 2.4 | 54 | 1.8 | 1.85 | 2.06 | 0.90 | 52 |
| | 6-11 | 85 | 5.9 | 54 | 1.8 | 1.85 | 2.06 | 0.90 | 43 |
| | 6-12 | 100 | 46 | 54 | 1.8 | 1.85 | 2.06 | 0.90 | 32 |
| | 6-13 | 100 | 72 | 54 | 1.8 | 1.85 | 2.06 | 0.90 | 35 |
| | 6-14 | 100 | 90 | 54 | 1.8 | 1.85 | 2.06 | 0.90 | 52 |
| COMPARATIVE EXAMPLE | 6-15 | 0 | 0 | 13 | 13 | 1.63 | 2.06 | 0.79 | 93 |
| EXAMPLE OF PRESENT INVENTION | 6-16 | 6 | 0.2 | 64 | 2.2 | 1.90 | 2.06 | 0.92 | 61 |
| | 6-17 | 76 | 3.5 | 80 | 0.9 | 1.98 | 2.06 | 0.96 | 46 |
| | 6-18 | 92 | 8.2 | 80 | 0.9 | 1.98 | 2.06 | 0.96 | 40 |
| | 6-19 | 100 | 38 | 80 | 0.9 | 1.98 | 2.06 | 0.96 | 28 |
| | 6-20 | 100 | 69 | 80 | 0.9 | 1.98 | 2.06 | 0.96 | 32 |
| | 6-21 | 100 | 85 | 80 | 0.9 | 1.98 | 2.06 | 0.96 | 48 |
| COMPARATIVE EXAMPLE | 6-22 | 0 | 0 | 13 | 13 | 1.61 | 2.06 | 0.78 | 98 |
| EXAMPLE OF | 6-23 | 5 | 0.1 | 30 | 10 | 1.75 | 2.06 | 0.85 | 64 |
| | 6-24 | 68 | 2.2 | 31 | 9 | 1.73 | 2.06 | 0.84 | 59 |

TABLE 17-continued

|  | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs | W10/1K (W/kg) |
|---|---|---|---|---|---|---|---|---|---|
| PRESENT | 6-25 | 84 | 6.4 | 31 | 9 | 1.73 | 2.06 | 0.84 | 44 |
| INVENTION | 6-26 | 100 | 35 | 31 | 9 | 1.73 | 2.06 | 0.84 | 39 |
|  | 6-27 | 100 | 71 | 31 | 9 | 1.73 | 2.06 | 0.84 | 43 |
|  | 6-28 | 100 | 95 | 31 | 9 | 1.73 | 2.06 | 0.84 | 59 |
| COMPARATIVE EXAMPLE | 6-29 | 0 | 0 | 13 | 13 | 1.61 | 2.06 | 0.78 | 103 |
| EXAMPLE | 6-30 | 5 | 2 | 42 | 4.9 | 1.81 | 2.06 | 0.88 | 64 |
| OF | 6-31 | 48 | 1.5 | 55 | 2.3 | 1.87 | 2.06 | 0.91 | 52 |
| PRESENT | 6-32 | 77 | 6.2 | 55 | 2.3 | 1.87 | 2.06 | 0.91 | 41 |
| INVENTION | 6-33 | 100 | 40 | 55 | 2.3 | 1.87 | 2.06 | 0.91 | 34 |
|  | 6-34 | 100 | 71 | 55 | 2.3 | 1.87 | 2.06 | 0.91 | 38 |
|  | 6-35 | 100 | 93 | 55 | 2.3 | 1.87 | 2.06 | 0.91 | 54 |
| COMPARATIVE EXAMPLE | 6-36 | 0 | 0 | 13 | 13 | 1.63 | 2.06 | 0.79 | 98 |
| EXAMPLE | 6-37 | 7 | 0.2 | 62 | 2.1 | 1.92 | 2.06 | 0.93 | 63 |
| OF | 6-38 | 57 | 1.9 | 74 | 0.3 | 1.96 | 2.06 | 0.95 | 46 |
| PRESENT | 6-39 | 79 | 7.6 | 74 | 0.3 | 1.96 | 2.06 | 0.95 | 42 |
| INVENTION | 6-40 | 100 | 43 | 74 | 0.3 | 1.96 | 2.06 | 0.95 | 29 |
|  | 6-41 | 100 | 74 | 74 | 0.3 | 1.96 | 2.06 | 0.95 | 32 |
|  | 6-42 | 100 | 86 | 74 | 0.3 | 1.96 | 2.06 | 0.95 | 47 |

As listed in Table 16, in examples of the present invention (conditions No. 6-2 to No 6-7, No. 6-9 to No. 6-14, No. 6-16 to No. 6-21, No. 6-23 to No. 6-28, No. 6-30 to No. 6-35, No. 6-37 to No. 6-42), the accumulation degree of the {200} planes in the α phase was within the ranges of the present invention at the respective stages of the heat treatment. Further, as listed in Table 17, in the examples of the present invention, the alloying ratio and the ratio of the α single phase region were within the desirable ranges of the present invention. As listed in Table 17, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumulation degree of the {200} planes was 30% or more, not only the magnetic flux density B50 but also the core loss W10/1k maintained a higher property level. Further, it could be confirmed that the core loss W10/1k has a still better property level when the ratio of the α single phase region is not less than 5% nor more than 80%.

Seventh Experiment

In a seventh experiment, correlations between an accumulation degree of {200} planes and an accumulation degree of {222} planes and core loss in 42 kinds of manufacturing conditions (condition No. 7-1 to condition No. 7-42) were studied.

Base metal plates (silicon steel plates) used in the seventh experiment contained components of the composition Q listed in Table 11 and inevitable impurities, with the balance being Fe. An actually measured value of the A3 point at which the base metal plates used in the seventh experiment transformed to a γ single phase was 1020° C. The base metal plates were fabricated in the same manner as that in the fourth experiment. In the condition No. 7-1 to the condition No. 7-42, cold rolling was performed in the same manners as those in the condition No. 4-1 to the condition No. 4-42 respectively.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 18.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, and it was found that, as rolled, the accumulation degree of the {200} planes in the α phase was within a 17% to 24% range and the accumulation degree of the {222} planes in the α phase was within a 17% to 24% range in each of the base metal plates.

Thereafter, Mo layers as the metal layers were formed on a front surface and a rear surface of each of the base metal plates by a sputtering method, except in the conditions No. 7-1, No. 7-8, No. 7-15, No. 7-22, No. 7-29, and No. 7-36. Thickness of each of the Mo layers (total thickness on the both surfaces) is listed in Table 18.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 18.

TABLE 18

| | | BASE METAL PLATE | | | | | METAL LAYER | |
|---|---|---|---|---|---|---|---|---|
| | CONDITION No. | COMPO-SITION | BLASTING | REDUCTION RATE (%) | DISLOCATION DENSITY (m/m³) | THICKNESS (μm) | ELEMENT | THICKNESS (μm) |
| COMPARATIVE EXAMPLE | 7-1 | Q | WITHOUT | 95 | $1 \times 10^{15}$ | 100 | NONE | |
| EXAMPLE OF PRESENT INVENTION | 7-2 | Q | WITHOUT | 95 | $1 \times 10^{15}$ | 100 | Mo | 2.4 |
| | 7-3 | Q | WITHOUT | 95 | $1 \times 10^{15}$ | 100 | Mo | 2.4 |
| | 7-4 | Q | WITHOUT | 95 | $1 \times 10^{15}$ | 100 | Mo | 2.4 |
| | 7-5 | Q | WITHOUT | 95 | $1 \times 10^{15}$ | 100 | Mo | 2.4 |
| | 7-6 | Q | WITHOUT | 95 | $1 \times 10^{15}$ | 100 | Mo | 2.4 |
| | 7-7 | Q | WITHOUT | 95 | $1 \times 10^{15}$ | 100 | Mo | 2.4 |
| COMPARATIVE EXAMPLE | 7-8 | Q | WITHOUT | 97.5 | $1 \times 10^{16}$ | 100 | NONE | |
| EXAMPLE OF PRESENT INVENTION | 7-9 | Q | WITHOUT | 97.5 | $1 \times 10^{16}$ | 100 | Mo | 2.4 |
| | 7-10 | Q | WITHOUT | 97.5 | $1 \times 10^{16}$ | 100 | Mo | 2.4 |
| | 7-11 | Q | WITHOUT | 97.5 | $1 \times 10^{16}$ | 100 | Mo | 2.4 |
| | 7-12 | Q | WITHOUT | 97.5 | $1 \times 10^{16}$ | 100 | Mo | 2.4 |
| | 7-13 | Q | WITHOUT | 97.5 | $1 \times 10^{16}$ | 100 | Mo | 2.4 |
| | 7-14 | Q | WITHOUT | 97.5 | $1 \times 10^{16}$ | 100 | Mo | 2.4 |
| COMPARATIVE EXAMPLE | 7-15 | Q | WITH | 95 | $8 \times 10^{16}$ | 100 | NONE | |
| EXAMPLE OF PRESENT INVENTION | 7-16 | Q | WITH | 95 | $8 \times 10^{16}$ | 100 | Mo | 2.4 |
| | 7-17 | Q | WITH | 95 | $8 \times 10^{16}$ | 100 | Mo | 2.4 |
| | 7-18 | Q | WITH | 95 | $8 \times 10^{16}$ | 100 | Mo | 2.4 |
| | 7-19 | Q | WITH | 95 | $8 \times 10^{16}$ | 100 | Mo | 2.4 |
| | 7-20 | Q | WITH | 95 | $8 \times 10^{16}$ | 100 | Mo | 2.4 |
| | 7-21 | Q | WITH | 95 | $8 \times 10^{16}$ | 100 | Mo | 2.4 |
| COMPARATIVE EXAMPLE | 7-22 | Q | WITHOUT | 95 | $1 \times 10^{15}$ | 250 | NONE | |
| EXAMPLE OF PRESENT INVENTION | 7-23 | Q | WITHOUT | 95 | $1 \times 10^{15}$ | 250 | Mo | 6 |
| | 7-24 | Q | WITHOUT | 95 | $1 \times 10^{15}$ | 250 | Mo | 6 |
| | 7-25 | Q | WITHOUT | 95 | $1 \times 10^{15}$ | 250 | Mo | 6 |
| | 7-26 | Q | WITHOUT | 95 | $1 \times 10^{15}$ | 250 | Mo | 6 |
| | 7-27 | Q | WITHOUT | 95 | $1 \times 10^{15}$ | 250 | Mo | 6 |
| | 7-28 | Q | WITHOUT | 95 | $1 \times 10^{15}$ | 250 | Mo | 6 |
| COMPARATIVE EXAMPLE | 7-29 | Q | WITHOUT | 97.5 | $1 \times 10^{16}$ | 250 | NONE | |
| EXAMPLE OF PRESENT INVENTION | 7-30 | Q | WITHOUT | 97.5 | $1 \times 10^{15}$ | 250 | Mo | 6 |
| | 7-31 | Q | WITHOUT | 97.5 | $1 \times 10^{15}$ | 250 | Mo | 6 |
| | 7-32 | Q | WITHOUT | 97.5 | $1 \times 10^{15}$ | 250 | Mo | 6 |
| | 7-33 | Q | WITHOUT | 97.5 | $1 \times 10^{16}$ | 250 | Mo | 6 |
| | 7-34 | Q | WITHOUT | 97.5 | $1 \times 10^{16}$ | 250 | Mo | 6 |
| | 7-35 | Q | WITHOUT | 97.5 | $1 \times 10^{16}$ | 250 | Mo | 6 |
| COMPARATIVE EXAMPLE | 7-36 | Q | WITH | 95 | $8 \times 10^{16}$ | 250 | NONE | |
| EXAMPLE OF PRESENT INVENTION | 7-37 | Q | WITH | 95 | $8 \times 10^{16}$ | 250 | Mo | 6 |
| | 7-38 | Q | WITH | 95 | $8 \times 10^{15}$ | 250 | Mo | 6 |
| | 7-39 | Q | WITH | 95 | $8 \times 10^{16}$ | 250 | Mo | 6 |
| | 7-40 | Q | WITH | 95 | $8 \times 10^{16}$ | 250 | Mo | 6 |
| | 7-41 | Q | WITH | 95 | $8 \times 10^{16}$ | 250 | Mo | 6 |
| | 7-42 | Q | WITH | 95 | $8 \times 10^{16}$ | 250 | Mo | 6 |

| | | FIRST SAMPLE | | | | SECOND SAMPLE | |
|---|---|---|---|---|---|---|---|
| | CONDITION No. | HETING RATE (°C./s) | MEASURED TEMPERATURE (°C.) | ACCUMULATION DEGREE OF [200] PLANE (%) | ACCUMULATION DEGREE OF [222] PLANE (%) | KEEPING TEMPERATURE (°C.) | KEEPING TIME (s) |
| COMPARATIVE EXAMPLE | 7-1 | 5 | 1020 | 17 | 14 | 1100 | 2 |
| EXAMPLE OF PRESENT INVENTION | 7-2 | 5 | 1020 | 27 | 13 | 1020 | 2 |
| | 7-3 | 5 | 1020 | 27 | 13 | 1100 | 2 |
| | 7-4 | 5 | 1020 | 27 | 13 | 1100 | 5 |
| | 7-5 | 5 | 1020 | 27 | 13 | 1100 | 30 |
| | 7-6 | 5 | 1020 | 27 | 13 | 1100 | 120 |
| | 7-7 | 5 | 1020 | 27 | 13 | 1100 | 360 |
| COMPARATIVE EXAMPLE | 7-8 | 5 | 1010 | 17 | 14 | 1100 | 2 |
| EXAMPLE OF PRESENT INVENTION | 7-9 | 5 | 1020 | 32 | 7 | 1020 | 2 |
| | 7-10 | 5 | 1020 | 32 | 7 | 1100 | 2 |
| | 7-11 | 5 | 1020 | 32 | 7 | 1100 | 5 |
| | 7-12 | 5 | 1020 | 32 | 7 | 1100 | 30 |
| | 7-13 | 5 | 1020 | 32 | 7 | 1100 | 120 |
| | 7-14 | 5 | 1020 | 32 | 7 | 1100 | 360 |

TABLE 18-continued

| | Condition No. | | | | | | |
|---|---|---|---|---|---|---|---|
| COMPARATIVE EXAMPLE | 7-15 | 5 | 1010 | 17 | 13 | 1100 | 2 |
| EXAMPLE | 7-16 | 5 | 1020 | 53 | 3.8 | 1020 | 2 |
| OF | 7-17 | 5 | 1020 | 53 | 3.8 | 1100 | 2 |
| PRESENT | 7-18 | 5 | 1020 | 53 | 3.8 | 1100 | 5 |
| INVENTION | 7-19 | 5 | 1020 | 53 | 3.8 | 1100 | 30 |
| | 7-20 | 5 | 1020 | 53 | 3.8 | 1100 | 120 |
| | 7-21 | 5 | 1020 | 53 | 3.8 | 1100 | 360 |
| COMPARATIVE EXAMPLE | 7-22 | 5 | 1010 | 18 | 13 | 1150 | 2 |
| EXAMPLE | 7-23 | 5 | 1020 | 26 | 12 | 1020 | 2 |
| OF | 7-24 | 5 | 1020 | 26 | 12 | 1150 | 3 |
| PRESENT | 7-25 | 5 | 1020 | 26 | 12 | 1150 | 7 |
| INVENTION | 7-26 | 5 | 1020 | 26 | 12 | 1150 | 35 |
| | 7-27 | 5 | 1020 | 26 | 12 | 1150 | 140 |
| | 7-28 | 5 | 1020 | 26 | 12 | 1150 | 420 |
| COMPARATIVE EXAMPLE | 7-29 | 5 | 1020 | 18 | 13 | 1150 | 2 |
| EXAMPLE | 7-30 | 5 | 1020 | 35 | 6 | 1020 | 2 |
| OF | 7-31 | 5 | 1020 | 35 | 6 | 1150 | 3 |
| PRESENT | 7-32 | 5 | 1020 | 35 | 6 | 1150 | 7 |
| INVENTION | 7-33 | 5 | 1020 | 35 | 6 | 1150 | 35 |
| | 7-34 | 5 | 1020 | 35 | 6 | 1150 | 140 |
| | 7-35 | 5 | 1020 | 35 | 6 | 1150 | 420 |
| COMPARATIVE EXAMPLE | 7-36 | 5 | 1020 | 18 | 14 | 1150 | 2 |
| EXAMPLE | 7-37 | 5 | 1020 | 54 | 3.1 | 1020 | 2 |
| OF | 7-38 | 5 | 1020 | 54 | 3.1 | 1150 | 3 |
| PRESENT | 7-39 | 5 | 1020 | 54 | 3.1 | 1150 | 7 |
| INVENTION | 7-40 | 5 | 1020 | 54 | 3.1 | 1150 | 35 |
| | 7-41 | 5 | 1020 | 54 | 3.1 | 1150 | 140 |
| | 7-42 | 5 | 1020 | 54 | 3.1 | 1150 | 420 |

| | | SECOND SAMPLE | | THIRD SAMPLE | | | |
|---|---|---|---|---|---|---|---|
| | CONDITION No. | ACCUMULATION DEGREE OF [200] PLANE (%) | ACCUMULATION DEGREE OF [222] PLANE (%) | COOLING RATE (° C./s) | DISTANCE (μm) | ACCUMULATION DEGREE OF [200] PLANE (%) | ACCUMULATION DEGREE OF [222] PLANE (%) |
| COMPARATIVE EXAMPLE | 7-1 | 13 | 13 | 10 | 50 | 13 | 13 |
| EXAMPLE | 7-2 | 30 | 10 | 10 | 54 | 30 | 10 |
| OF | 7-3 | 30 | 10 | 10 | 54 | 30 | 10 |
| PRESENT | 7-4 | 30 | 10 | 10 | 54 | 30 | 10 |
| INVENTION | 7-5 | 30 | 10 | 10 | 54 | 30 | 10 |
| | 7-6 | 30 | 10 | 10 | 54 | 30 | 10 |
| | 7-7 | 30 | 10 | 10 | 54 | 30 | 10 |
| COMPARATIVE EXAMPLE | 7-8 | 13 | 13 | 10 | 50 | 13 | 13 |
| EXAMPLE | 7-9 | 41 | 5.8 | 10 | 54 | 41 | 5.8 |
| OF | 7-10 | 52 | 2.2 | 10 | 54 | 52 | 2.2 |
| PRESENT | 7-11 | 52 | 2.2 | 10 | 54 | 52 | 2.2 |
| INVENTION | 7-12 | 52 | 2.2 | 10 | 54 | 52 | 2.2 |
| | 7-13 | 52 | 2.2 | 10 | 54 | 52 | 2.2 |
| | 7-14 | 52 | 2.2 | 10 | 54 | 52 | 2.2 |
| COMPARATIVE EXAMPLE | 7-15 | 13 | 13 | 10 | 50 | 13 | 13 |
| EXAMPLE | 7-16 | 60 | 2.5 | 10 | 54 | 60 | 2.5 |
| OF | 7-17 | 76 | 1.3 | 10 | 54 | 76 | 1.3 |
| PRESENT | 7-18 | 76 | 1.3 | 10 | 54 | 76 | 1.3 |
| INVENTION | 7-19 | 76 | 1.3 | 10 | 54 | 76 | 1.3 |
| | 7-20 | 76 | 1.3 | 10 | 54 | 76 | 1.3 |
| | 7-21 | 76 | 1.3 | 10 | 54 | 76 | 1.3 |
| COMPARATIVE EXAMPLE | 7-22 | 13 | 13 | 10 | 125 | 13 | 13 |
| EXAMPLE | 7-23 | 30 | 11 | 10 | 136 | 30 | 11 |
| OF | 7-24 | 32 | 8 | 10 | 136 | 32 | 8 |
| PRESENT | 7-25 | 32 | 8 | 10 | 136 | 32 | 8 |
| INVENTION | 7-26 | 32 | 8 | 10 | 136 | 32 | 8 |
| | 7-27 | 32 | 8 | 10 | 136 | 32 | 8 |
| | 7-28 | 32 | 8 | 10 | 136 | 32 | 8 |
| COMPARATIVE EXAMPLE | 7-29 | 13 | 13 | 10 | 125 | 13 | 13 |
| EXAMPLE | 7-30 | 43 | 45 | 10 | 135 | 43 | 4.5 |
| OF | 7-31 | 53 | 2.4 | 10 | 136 | 53 | 2.4 |
| PRESENT | 7-32 | 53 | 2.4 | 10 | 136 | 53 | 2.4 |
| INVENTION | 7-33 | 53 | 2.4 | 10 | 136 | 53 | 2.4 |
| | 7-34 | 53 | 2.4 | 10 | 136 | 53 | 2.4 |
| | 7-35 | 53 | 2.4 | 10 | 136 | 53 | 2.4 |

TABLE 18-continued

| | | | | | | | |
|---|---|---|---|---|---|---|---|
| COMPARATIVE EXAMPLE | 7-36 | 13 | 13 | 10 | 125 | 13 | 13 |
| EXAMPLE OF PRESENT INVENTION | 7-37 | 59 | 3.5 | 10 | 136 | 59 | 3.5 |
| | 7-38 | 70 | 0.4 | 10 | 136 | 70 | 0.4 |
| | 7-39 | 70 | 0.4 | 10 | 136 | 70 | 0.4 |
| | 7-40 | 70 | 0.4 | 10 | 136 | 70 | 0.4 |
| | 7-41 | 70 | 0.4 | 10 | 136 | 70 | 0.4 |
| | 7-42 | 70 | 0.4 | 10 | 136 | 70 | 0.4 |

Further, an alloying ratio of the metal layer and a ratio of an α single phase region in each of the Fe-based metal plates were measured as in the first experiment. Here, in finding the alloying ratio, a region where the Fe content was 0.5 mass % or less and the content of ferrite former was 99.5 mass % or more was regarded as an alloy layer. Further, a region where the Mo content was 3.8 mass % or more was regarded as the α single phase region, and a ratio of the α single phase region was found from the aforesaid expression (4). Results of these are listed in Table 19.

Further, as in the first experiment, magnetic flux density B50 and saturation magnetic flux density Bs were measured and a ratio B50/Bs of the magnetic flux density B50 to the saturation magnetic flux density Bs was calculated. Further, core loss W10/1k (W10/1000) at a 1000 Hz frequency when the magnetic flux density was 1.0 T was measured. Results of these are listed in Table 19.

TABLE 19

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/ Bs | W10/1k (W/kg) |
|---|---|---|---|---|---|---|---|---|---|
| COMPARATIVE EXAMPLE | 7-1 | 0 | 0 | 13 | 13 | 1.60 | 2.05 | 0.78 | 91 |
| EXAMPLE OF PRESENT INVENTION | 7-2 | 8 | 0.2 | 30 | 10 | 1.74 | 2.05 | 0.85 | 62 |
| | 7-3 | 82 | 1.5 | 31 | 10 | 1.74 | 2.05 | 0.85 | 57 |
| | 7-4 | 95 | 8.2 | 30 | 10 | 1.74 | 2.05 | 0.85 | 44 |
| | 7-5 | 100 | 35 | 30 | 10 | 1.74 | 2.05 | 0.85 | 37 |
| | 7-6 | 100 | 73 | 30 | 10 | 1.74 | 2.05 | 0.85 | 43 |
| | 7-7 | 100 | 87 | 30 | 10 | 1.74 | 2.05 | 0.85 | 58 |
| COMPARATIVE EXAMPLE | 7-8 | 0 | 0 | 13 | 13 | 1.60 | 2.05 | 0.78 | 93 |
| EXAMPLE OF PRESENT INVENTION | 7-9 | 7 | 0.2 | 41 | 5.8 | 1.78 | 2.05 | 0.87 | 63 |
| | 7-10 | 64 | 2.6 | 53 | 2.7 | 1.85 | 2.05 | 0.90 | 57 |
| | 7-11 | 94 | 7.8 | 53 | 2.7 | 1.87 | 2.05 | 0.91 | 42 |
| | 7-12 | 100 | 42 | 53 | 2.7 | 1.85 | 2.05 | 0.90 | 33 |
| | 7-13 | 100 | 71 | 53 | 2.7 | 1.85 | 2.05 | 0.90 | 38 |
| | 7-14 | 100 | 95 | 53 | 2.7 | 1.87 | 2.05 | 0.91 | 53 |
| COMPARATIVE EXAMPLE | 7-15 | 0 | 0 | 13 | 13 | 1.62 | 2.05 | 0.79 | 93 |
| EXAMPLE OF PRESENT INVENTION | 7-16 | 7 | 0.3 | 60 | 2.5 | 1.91 | 2.05 | 0.93 | 61 |
| | 7-17 | 67 | 1.2 | 75 | 1.3 | 1.95 | 2.05 | 0.95 | 48 |
| | 7-18 | 89 | 5.9 | 75 | 1.4 | 1.93 | 2.05 | 0.94 | 41 |
| | 7-19 | 100 | 37 | 75 | 1.3 | 1.95 | 2.05 | 0.95 | 28 |
| | 7-20 | 100 | 72 | 76 | 1.4 | 1.97 | 2.05 | 0.96 | 33 |
| | 7-21 | 100 | 87 | 75 | 1.7 | 1.95 | 2.05 | 0.95 | 48 |
| COMPARATIVE EXAMPLE | 7-22 | 0 | 0 | 13 | 13 | 1.60 | 2.05 | 0.78 | 98 |
| EXAMPLE OF PRESENT INVENTION | 7-23 | 4 | 0.2 | 30 | 11 | 1.74 | 2.05 | 0.85 | 64 |
| | 7-24 | 57 | 1.2 | 32 | 9 | 1.74 | 2.05 | 0.85 | 56 |
| | 7-25 | 87 | 6.7 | 32 | 9 | 1.74 | 2.05 | 0.85 | 45 |
| | 7-26 | 100 | 45 | 32 | 9 | 1.74 | 2.05 | 0.85 | 37 |
| | 7-27 | 100 | 72 | 32 | 9 | 1.74 | 2.05 | 0.85 | 42 |
| | 7-28 | 100 | 92 | 32 | 9 | 1.74 | 2.05 | 0.85 | 57 |
| COMPARATIVE EXAMPLE | 7-29 | 0 | 0 | 13 | 13 | 1.60 | 2.05 | 0.78 | 100 |
| EXAMPLE OF PRESENT INVENTION | 7-30 | 8 | 0.2 | 43 | 4.5 | 1.78 | 2.05 | 0.87 | 64 |
| | 7-31 | 54 | 1.3 | 56 | 2.1 | 1.87 | 2.05 | 0.91 | 52 |
| | 7-32 | 78 | 6.1 | 56 | 2.1 | 1.85 | 2.05 | 0.90 | 41 |
| | 7-33 | 100 | 38 | 56 | 2.2 | 1.87 | 2.05 | 0.91 | 32 |
| | 7-34 | 100 | 71 | 56 | 2.1 | 1.85 | 2.05 | 0.90 | 38 |
| | 7-35 | 100 | 91 | 56 | 2.2 | 1.87 | 2.05 | 0.91 | 54 |
| COMPARATIVE EXAMPLE | 7-36 | 0 | 0 | 13 | 13 | 1.62 | 2.05 | 0.79 | 97 |
| EXAMPLE OF PRESENT INVENTION | 7-37 | 6 | 0.1 | 59 | 3.5 | 1.91 | 2.05 | 0.93 | 62 |
| | 7-38 | 70 | 2.3 | 82 | 0.8 | 1.95 | 2.05 | 0.95 | 46 |
| | 7-39 | 91 | 7.1 | 82 | 0.8 | 1.95 | 2.05 | 0.95 | 40 |
| | 7-40 | 100 | 41 | 82 | 0.8 | 1.97 | 2.05 | 0.96 | 26 |
| | 7-41 | 100 | 76 | 82 | 0.8 | 1.95 | 2.05 | 0.95 | 32 |
| | 7-42 | 100 | 100 | 82 | 0.8 | 1.97 | 2.05 | 0.96 | 48 |

As listed in Table 18, in examples of the present invention (conditions No. 7-2 to No. 7-7, No. 7-9 to No. 7-14, No. 7-16 to No. 7-21, No. 7-23 to No. 7-28, No. 7-30 to No. 7-35, No. 7-37 to No. 7-42), the accumulation degree of the {200} planes in the α phase was within the ranges of the present invention at the respective stages of the heat treatment. Further, as listed in Table 19, in the examples of the present invention, the alloying ratio and the ratio of the α single phase region were within the desirable ranges of the present invention. As listed in Table 19, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumulation degree of the {200} planes was 30% or more, not only the magnetic flux density B50 but also the core loss W10/1k maintained a higher property level. Further, it could be confirmed that the core loss W10/1k has a still better property level when the ratio of the α single phase region is not less than 5% nor more than 80%.

Eighth Experiment

In an eighth experiment, correlations between an accumulation degree of {200} planes and an accumulation degree of {222} planes and core loss in 42 kinds of manufacturing conditions (condition No. 8-1 to condition No. 8-42) were studied.

Base metal plates (silicon steel plates) used in the eighth experiment contained components of the composition R listed in Table 11 and inevitable impurities, with the balance being Fe. An actually measured value of the A3 point at which the base metal plates used in the eighth experiment transformed to a γ single phase was 1010° C. The base metal plates were fabricated in the same manner as that in the fourth experiment. In the condition No. 8-1 to the condition No. 8-42, cold rolling was performed in the same manners as those in the condition No. 4-1 to the condition No. 4-42 respectively.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 20.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, and it was found that, as rolled, the accumulation degree of the {200} planes in the α phase was within a 17% to 24% range and the accumulation degree of the {222} planes in the α phase was within a 17% to 24% range in each of the base metal plates.

Thereafter, V layers as the metal layers were formed on a front surface and a rear surface of each of the base metal plates by an sputtering method, except in the conditions No. 8-1, No. 8-8, No. 8-15, No. 8-22, No. 8-29, and No. 8-36. Thickness of each of the V layers (total thickness on the both surfaces) is listed in Table 20.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 20.

TABLE 20

| | CONDITION No. | BASE METAL PLATE | | | | | METAL LAYER | | | FIRST SAMPLE | | |
|---|---|---|---|---|---|---|---|---|---|---|---|---|
| | | COMPOSITION | BLASTING | REDUCTION RATE (%) | DISLOCATION DENSITY (m/m³) | THICKNESS (μm) | ELEMENT | THICKNESS (μm) | HEATING RATE (°C/s) | MEASURED TEMPERATURE (°C) | ACCUMULATION DEGREE OF {200} PLANE (%) | |
| COMPARATIVE EXAMPLE | 8-1 | R | WITHOUT | 95 | 1 × 10¹⁵ | 100 | | NONE | 50 | 1010 | 17 | |
| EXAMPLE OF PRESENT INVENTION | 8-2 | R | WITHOUT | 95 | 1 × 10¹⁵ | 100 | V | 4 | 50 | 1010 | 25 | |
| | 8-3 | R | WITHOUT | 95 | 1 × 10¹⁵ | 100 | V | 4 | 50 | 1010 | 25 | |
| | 8-4 | R | WITHOUT | 95 | 1 × 10¹⁵ | 100 | V | 4 | 50 | 1010 | 25 | |
| | 8-5 | R | WITHOUT | 95 | 1 × 10¹⁵ | 100 | V | 4 | 50 | 1010 | 25 | |
| | 8-6 | R | WITHOUT | 95 | 1 × 10¹⁵ | 100 | V | 4 | 50 | 1010 | 25 | |
| | 8-7 | R | WITHOUT | 95 | 1 × 10¹⁵ | 100 | | NONE | 50 | 1010 | 25 | |
| COMPARATIVE EXAMPLE | 8-8 | R | WITHOUT | 97.5 | 1 × 10¹⁶ | 100 | | NONE | 50 | 1010 | 17 | |
| EXAMPLE OF PRESENT INVENTION | 8-9 | R | WITHOUT | 97.5 | 1 × 10¹⁶ | 100 | V | 4 | 50 | 1010 | 31 | |
| | 8-10 | R | WITHOUT | 97.5 | 1 × 10¹⁶ | 100 | V | 4 | 50 | 1010 | 31 | |
| | 8-11 | R | WITHOUT | 97.5 | 1 × 10¹⁶ | 100 | V | 4 | 50 | 1010 | 31 | |
| | 8-12 | R | WITHOUT | 97.5 | 1 × 10¹⁶ | 100 | V | 4 | 50 | 1010 | 31 | |
| | 8-13 | R | WITHOUT | 97.5 | 1 × 10¹⁶ | 100 | V | 4 | 50 | 1010 | 31 | |
| | 8-14 | R | WITHOUT | 97.5 | 1 × 10¹⁶ | 100 | | NONE | 50 | 1010 | 31 | |
| COMPARATIVE EXAMPLE | 8-15 | R | WITH | 95 | 8 × 10¹⁶ | 100 | | NONE | 50 | 1010 | 17 | |
| EXAMPLE OF PRESENT INVENTION | 8-16 | R | WITH | 95 | 8 × 10¹⁶ | 100 | V | 4 | 50 | 1010 | 48 | |
| | 8-17 | R | WITH | 95 | 8 × 10¹⁶ | 100 | V | 4 | 50 | 1010 | 48 | |
| | 8-18 | R | WITH | 95 | 8 × 10¹⁶ | 100 | V | 4 | 50 | 1010 | 48 | |
| | 8-19 | R | WITH | 95 | 8 × 10¹⁶ | 100 | V | 4 | 50 | 1010 | 48 | |
| | 8-20 | R | WITH | 95 | 8 × 10¹⁶ | 100 | V | 4 | 50 | 1010 | 48 | |
| | 8-21 | R | WITH | 95 | 8 × 10¹⁶ | 100 | | NONE | 50 | 1010 | 48 | |
| COMPARATIVE EXAMPLE | 8-22 | R | WITHOUT | 95 | 1 × 10¹⁵ | 250 | | NONE | 50 | 1010 | 17 | |
| EXAMPLE OF PRESENT INVENTION | 8-23 | R | WITHOUT | 95 | 1 × 10¹⁵ | 250 | V | 10 | 50 | 1010 | 27 | |
| | 8-24 | R | WITHOUT | 95 | 1 × 10¹⁵ | 250 | V | 10 | 50 | 1010 | 27 | |
| | 8-25 | R | WITHOUT | 95 | 1 × 10¹⁵ | 250 | V | 10 | 50 | 1010 | 27 | |
| | 8-26 | R | WITHOUT | 95 | 1 × 10¹⁵ | 250 | V | 10 | 50 | 1010 | 27 | |
| | 8-27 | R | WITHOUT | 95 | 1 × 10¹⁵ | 250 | V | 10 | 50 | 1010 | 27 | |
| | 8-28 | R | WITHOUT | 95 | 1 × 10¹⁵ | 250 | | NONE | 50 | 1010 | 27 | |
| COMPARATIVE EXAMPLE | 8-29 | R | WITHOUT | 97.5 | 1 × 10¹⁶ | 250 | | NONE | 50 | 1010 | 18 | |
| EXAMPLE OF PRESENT INVENTION | 8-30 | R | WITHOUT | 97.5 | 1 × 10¹⁶ | 250 | V | 10 | 50 | 1010 | 33 | |
| | 8-31 | R | WITHOUT | 97.5 | 1 × 10¹⁶ | 250 | V | 10 | 50 | 1010 | 33 | |
| | 8-32 | R | WITHOUT | 97.5 | 1 × 10¹⁶ | 250 | V | 10 | 50 | 1010 | 33 | |
| | 8-33 | R | WITHOUT | 97.5 | 1 × 10¹⁶ | 250 | V | 10 | 50 | 1010 | 33 | |
| | 8-34 | R | WITHOUT | 97.5 | 1 × 10¹⁶ | 250 | V | 10 | 50 | 1010 | 33 | |
| | 8-35 | R | WITHOUT | 97.5 | 1 × 10¹⁶ | 250 | | NONE | 50 | 1010 | 33 | |
| COMPARATIVE EXAMPLE | 8-36 | R | WITH | 95 | 8 × 10¹⁶ | 250 | | NONE | 50 | 1010 | 17 | |

TABLE 20-continued

| | | | | | | | | | | |
|---|---|---|---|---|---|---|---|---|---|---|
| EXAMPLE OF PRESENT INVENTION | 8-37 | R | WITH | 95 | 8 × 10¹⁶ | 250 | V | 10 | 50 | 1010 | 53 |
| | 8-38 | R | WITH | 95 | 8 × 10¹⁶ | 250 | V | 10 | 50 | 1010 | 53 |
| | 8-39 | R | WITH | 95 | 8 × 10¹⁶ | 250 | V | 10 | 50 | 1010 | 53 |
| | 8-40 | R | WITH | 95 | 8 × 10¹⁶ | 250 | V | 10 | 50 | 1010 | 53 |
| | 8-41 | R | WITH | 95 | 8 × 10¹⁶ | 250 | V | 10 | 50 | 1010 | 53 |
| | 8-42 | R | WITH | 95 | 8 × 10¹⁶ | 250 | V | 10 | 50 | 1010 | 53 |

| | | FIRST SAMPLE | | | SECOND SAMPLE | | | | THIRD SAMPLE | |
|---|---|---|---|---|---|---|---|---|---|---|
| | CONDITION No. | ACCUMULATION DEGREE OF {222} PLANE (%) | KEEPING TEMPERATURE (°C) | KEEPING TIME (s) | ACCUMULATION DEGREE OF {200} PLANE (%) | ACCUMULATION DEGREE OF {222} PLANE (%) | COOLING RATE (°C/s) | DISTANCE (μm) | ACCUMULATION DEGREE OF {200} PLANE (%) | ACCUMULATION DEGREE OF {222} PLANE (%) |
| COMPARATIVE EXAMPLE | 8-1 | 13 | 1050 | 2 | 13 | 13 | 10 | 50 | 13 | 13 |
| EXAMPLE OF PRESENT INVENTION | 8-2 | 16 | 1010 | 2 | 30 | 12 | 10 | 54 | 30 | 12 |
| | 8-3 | 16 | 1050 | 2 | 32 | 8 | 10 | 54 | 32 | 8 |
| | 8-4 | 16 | 1050 | 5 | 32 | 8 | 10 | 54 | 32 | 8 |
| | 8-5 | 16 | 1050 | 30 | 32 | 8 | 10 | 54 | 32 | 8 |
| | 8-6 | 16 | 1050 | 120 | 32 | 8 | 10 | 54 | 32 | 8 |
| | 8-7 | 16 | 1050 | 360 | 32 | 8 | 10 | 54 | 32 | 8 |
| COMPARATIVE EXAMPLE | 8-8 | 12 | 1050 | 2 | 13 | 13 | 10 | 50 | 13 | 13 |
| EXAMPLE OF PRESENT INVENTION | 8-9 | 6 | 1010 | 2 | 42 | 5.8 | 10 | 54 | 42 | 5.8 |
| | 8-10 | 6 | 1050 | 2 | 51 | 2.8 | 10 | 54 | 51 | 2.8 |
| | 8-11 | 6 | 1050 | 5 | 51 | 2.8 | 10 | 54 | 51 | 2.8 |
| | 8-12 | 6 | 1050 | 30 | 51 | 2.8 | 10 | 54 | 51 | 2.8 |
| | 8-13 | 6 | 1050 | 120 | 51 | 2.8 | 10 | 54 | 51 | 2.8 |
| | 8-14 | 6 | 1050 | 360 | 51 | 2.8 | 10 | 54 | 51 | 2.8 |
| COMPARATIVE EXAMPLE | 8-15 | 12 | 1050 | 2 | 13 | 13 | 10 | 50 | 13 | 13 |
| EXAMPLE OF PRESENT INVENTION | 8-16 | 4.8 | 1010 | 2 | 59 | 3.1 | 10 | 54 | 59 | 3.1 |
| | 8-17 | 4.8 | 1050 | 2 | 73 | 1.6 | 10 | 54 | 73 | 1.6 |
| | 8-18 | 4.8 | 1050 | 5 | 73 | 1.6 | 10 | 54 | 73 | 1.6 |
| | 8-19 | 4.8 | 1050 | 30 | 73 | 1.6 | 10 | 54 | 73 | 1.6 |
| | 8-20 | 4.8 | 1050 | 120 | 73 | 1.6 | 10 | 54 | 73 | 1.6 |
| | 8-21 | 4.8 | 1050 | 360 | 73 | 1.6 | 10 | 54 | 73 | 1.6 |
| COMPARATIVE EXAMPLE | 8-22 | 13 | 1050 | 2 | 13 | 13 | 10 | 125 | 13 | 13 |
| EXAMPLE OF PRESENT INVENTION | 8-23 | 11 | 1010 | 2 | 30 | 11 | 10 | 136 | 30 | 11 |
| | 8-24 | 11 | 1100 | 3 | 31 | 10 | 10 | 136 | 31 | 10 |
| | 8-25 | 11 | 1100 | 7 | 31 | 10 | 10 | 136 | 31 | 10 |
| | 8-26 | 11 | 1100 | 35 | 31 | 10 | 10 | 136 | 31 | 10 |
| | 8-27 | 11 | 1100 | 140 | 31 | 10 | 10 | 136 | 31 | 10 |
| | 8-28 | 11 | 1100 | 420 | 31 | 10 | 10 | 136 | 31 | 10 |
| COMPARATIVE EXAMPLE | 8-29 | 13 | 1100 | 2 | 13 | 13 | 10 | 125 | 13 | 13 |
| EXAMPLE OF PRESENT INVENTION | 8-30 | 7 | 1010 | 2 | 43 | 5.1 | 10 | 136 | 43 | 5.1 |
| | 8-31 | 7 | 1100 | 3 | 58 | 1.7 | 10 | 136 | 58 | 1.7 |
| | 8-32 | 7 | 1100 | 7 | 58 | 1.7 | 10 | 136 | 58 | 1.7 |
| | 8-33 | 7 | 1100 | 35 | 58 | 1.7 | 10 | 136 | 58 | 1.7 |
| | 8-34 | 7 | 1100 | 140 | 58 | 1.7 | 10 | 136 | 58 | 1.7 |

TABLE 20-continued

| | | | | | | | | | |
|---|---|---|---|---|---|---|---|---|---|
| COMPARATIVE EXAMPLE | 8-35 | 7 | 1100 | 420 | 58 | 1.7 | 10 | 136 | 58 | 1.7 |
| | 8-36 | 12 | 1100 | 2 | 13 | 13 | 10 | 125 | 13 | 13 |
| EXAMPLE OF PRESENT INVENTION | 8-37 | 3.9 | 1010 | 2 | 62 | 2.1 | 10 | 136 | 62 | 2.1 |
| | 8-38 | 3.9 | 1100 | 3 | 76 | 0.5 | 10 | 136 | 76 | 0.5 |
| | 8-39 | 3.9 | 1100 | 7 | 76 | 0.5 | 10 | 136 | 76 | 0.5 |
| | 8-40 | 3.9 | 1100 | 35 | 76 | 0.5 | 10 | 136 | 76 | 0.5 |
| | 8-41 | 3.9 | 1100 | 140 | 76 | 0.5 | 10 | 136 | 76 | 0.5 |
| | 8-42 | 3.9 | 1100 | 420 | 76 | 0.5 | 10 | 136 | 76 | 0.5 |

Further, an alloying ratio of the metal layer and a ratio of an α single phase region in each of the Fe-based metal plates were measured as in the first experiment. Here, in finding the alloying ratio, a region where the Fe content was 0.5 mass % or less and the content of ferrite former was 99.5 mass % or more was regarded as an alloy layer. Further, a region where the V content was 1.8 mass % or more was regarded as the α single phase region, and a ratio of the α single phase region was found from the aforesaid expression (4). Results of these are listed in Table 21.

Further, as in the first experiment, magnetic flux density B50 and saturation magnetic flux density Bs were measured and a ratio B50/Bs of the magnetic flux density B50 to the saturation magnetic flux density Bs was calculated. Further, core loss W10/1k (W10/1000) at a 1000 Hz frequency when the magnetic flux density was 1.0 T was measured. Results of these are listed in Table 21.

8-37 to No. 8-42), the accumulation degree of the {200} planes in the α phase was within the ranges of the present invention at the respective stages of the heat treatment. Further, as listed in Table 21, in the examples of the present invention, the alloying ratio and the ratio of the α single phase region were within the desirable ranges of the present invention. As listed in Table 21, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumulation degree of the {200} planes was 30% or more, not only

TABLE 21

|  | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs | W10/1k (W/kg) |
|---|---|---|---|---|---|---|---|---|---|
| COMPARATIVE EXAMPLE | 8-1 | 0 | 0 | 13 | 13 | 1.60 | 2.05 | 0.78 | 91 |
| EXAMPLE OF PRESENT INVENTION | 8-2 | 8 | 0.2 | 30 | 12 | 1.74 | 2.05 | 0.85 | 62 |
| | 8-3 | 82 | 1.5 | 31 | 10 | 1.74 | 2.05 | 0.85 | 57 |
| | 8-4 | 95 | 8.2 | 30 | 10 | 1.74 | 2.05 | 0.85 | 44 |
| | 8-5 | 100 | 35 | 30 | 10 | 1.74 | 2.05 | 0.85 | 37 |
| | 8-6 | 100 | 73 | 30 | 10 | 1.74 | 2.05 | 0.85 | 43 |
| | 8-7 | 100 | 87 | 30 | 10 | 1.74 | 2.05 | 0.85 | 58 |
| COMPARATIVE EXAMPLE | 8-8 | 0 | 0 | 13 | 13 | 1.60 | 2.05 | 0.78 | 93 |
| EXAMPLE OF PRESENT INVENTION | 8-9 | 6 | 0.2 | 42 | 5.8 | 1.76 | 2.05 | 0.86 | 61 |
| | 8-10 | 64 | 2.6 | 53 | 2.7 | 1.85 | 2.05 | 0.90 | 57 |
| | 8-11 | 94 | 7.8 | 53 | 2.7 | 1.87 | 2.05 | 0.91 | 42 |
| | 8-12 | 100 | 42 | 53 | 2.7 | 1.85 | 2.05 | 0.90 | 33 |
| | 8-13 | 100 | 71 | 53 | 2.7 | 1.85 | 2.05 | 0.90 | 38 |
| | 8-14 | 100 | 95 | 53 | 2.7 | 1.87 | 2.05 | 0.91 | 53 |
| COMPARATIVE EXAMPLE | 8-15 | 0 | 0 | 13 | 13 | 1.62 | 2.05 | 0.79 | 94 |
| EXAMPLE OF PRESENT INVENTION | 8-16 | 7 | 0.3 | 59 | 3.1 | 1.89 | 2.05 | 0.92 | 62 |
| | 8-17 | 67 | 1.2 | 75 | 1.3 | 1.95 | 2.05 | 0.95 | 48 |
| | 8-18 | 89 | 5.9 | 75 | 1.4 | 1.93 | 2.05 | 0.94 | 41 |
| | 8-19 | 100 | 37 | 75 | 1.3 | 1.95 | 2.05 | 0.95 | 28 |
| | 8-20 | 100 | 72 | 76 | 1.4 | 1.97 | 2.05 | 0.96 | 33 |
| | 8-21 | 100 | 87 | 75 | 1.7 | 1.95 | 2.05 | 0.95 | 48 |
| COMPARATIVE EXAMPLE | 8-22 | 0 | 0 | 13 | 13 | 1.60 | 2.05 | 0.78 | 103 |
| EXAMPLE OF PRESENT INVENTION | 8-23 | 5 | 0.1 | 30 | 11 | 1.74 | 2.05 | 0.85 | 63 |
| | 8-24 | 57 | 1.2 | 32 | 9 | 1.74 | 2.05 | 0.85 | 56 |
| | 8-25 | 87 | 6.7 | 32 | 9 | 1.74 | 2.05 | 0.85 | 45 |
| | 8-26 | 100 | 45 | 32 | 9 | 1.74 | 2.05 | 0.85 | 37 |
| | 8-27 | 100 | 74 | 32 | 9 | 1.74 | 2.05 | 0.85 | 42 |
| | 8-28 | 100 | 92 | 32 | 9 | 1.74 | 2.05 | 0.85 | 57 |
| COMPARATIVE EXAMPLE | 8-29 | 0 | 0 | 13 | 13 | 1.60 | 2.05 | 0.78 | 102 |
| EXAMPLE OF PRESENT INVENTION | 8-30 | 8 | 0.3 | 43 | 5.1 | 1.78 | 2.05 | 0.87 | 63 |
| | 8-31 | 54 | 1.3 | 56 | 2.1 | 1.87 | 2.05 | 0.91 | 52 |
| | 8-32 | 78 | 6.1 | 56 | 2.1 | 1.85 | 2.05 | 0.90 | 41 |
| | 8-33 | 100 | 38 | 56 | 2.2 | 1.87 | 2.05 | 0.91 | 32 |
| | 8-34 | 100 | 71 | 56 | 2.1 | 1.85 | 2.05 | 0.90 | 38 |
| | 8-35 | 100 | 91 | 56 | 2.2 | 1.87 | 2.05 | 0.91 | 54 |
| COMPARATIVE EXAMPLE | 8-36 | 0 | 0 | 13 | 13 | 1.62 | 2.05 | 0.79 | 99 |
| EXAMPLE OF PRESENT INVENTION | 8-37 | 5 | 0.1 | 62 | 2.1 | 1.89 | 2.05 | 0.92 | 62 |
| | 8-38 | 70 | 2.3 | 82 | 0.8 | 1.95 | 2.05 | 0.95 | 46 |
| | 8-39 | 91 | 7.1 | 82 | 0.8 | 1.95 | 2.05 | 0.95 | 40 |
| | 8-40 | 100 | 41 | 82 | 0.8 | 1.97 | 2.05 | 0.96 | 26 |
| | 8-41 | 100 | 76 | 82 | 0.8 | 1.95 | 2.05 | 0.95 | 32 |
| | 8-42 | 100 | 100 | 82 | 0.8 | 1.97 | 2.05 | 0.96 | 48 |

As listed in Table 20, in examples of the present invention (conditions No. 8-2 to No. 8-7, No. 8-9 to No. 8-14, No. 8-16 to No. 8-21, No. 8-23 to No. 8-28, No. 8-30 to No. 8-35, No. the magnetic flux density B50 but also the core loss W10/1k maintained a higher property level. Further, it could be confirmed that the core loss W10/1k has a still better property level when the ratio of the α single phase region is not less than 5% nor more than 80%.

Ninth Experiment

In a ninth experiment, correlations between an accumulation degree of {200} planes and an accumulation degree of {222} planes and core loss in 42 kinds of manufacturing conditions (condition No. 9-1 to condition No. 9-42) were studied.

Base metal plates (silicon steel plates) used in the ninth experiment contained components of the composition S listed in Table 11 and inevitable impurities, with the balance being Fe. An actually measured value of the A3 point at which the base metal plates used in the ninth experiment transformed to a γ single phase was 1080° C. The base metal plates were fabricated in the same manner as that in the fourth experiment. In the condition No. 9-1 to the condition No. 9-42, cold rolling was performed in the same manners as those in the condition No. 4-1 to the condition No. 4-42 respectively.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 22.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, and it was found that, as rolled, the accumulation degree of the {200} planes in the α phase was within a 17% to 24% range and the accumulation degree of the {222} planes in the α phase was within a 17% to 24% range in each of the base metal plates.

Thereafter, Cr layers as the metal layers were formed on a front surface and a rear surface of each of the base metal plates by an electroplating method, except in the conditions No. 9-1, No. 9-8, No. 9-15, No. 9-22, No. 9-29, and No. 9-36. Thickness of each of the Cr layers (total thickness on the both surfaces) is listed in Table 22.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 22.

TABLE 22

| | CONDITION No. | BASE METAL PLATE COMPOSITION | BLASTING | REDUCTION RATE (%) | DISLOCATION DENSITY (m/m³) | THICKNESS (μm) | METAL LAYER ELEMENT | THICKNESS (μm) | HEATING RATE (°C./s) | FIRST SAMPLE MEASURED TEMPERATURE (°C.) | ACCUMULATION DEGREE OF {200} PLANE (%) |
|---|---|---|---|---|---|---|---|---|---|---|---|
| COMPARATIVE EXAMPLE | 9-1 | S | WITHOUT | 95 | 1 × 10¹⁵ | 100 | NONE | | 50 | 1080 | 16 |
| EXAMPLE OF PRESENT INVENTION | 9-2 | S | WITHOUT | 95 | 1 × 10¹⁵ | 100 | Cr | 3 | 50 | 1080 | 27 |
| | 9-3 | S | WITHOUT | 95 | 1 × 10¹⁵ | 100 | Cr | 3 | 50 | 1080 | 27 |
| | 9-4 | S | WITHOUT | 95 | 1 × 10¹⁵ | 100 | Cr | 3 | 50 | 1080 | 27 |
| | 9-5 | S | WITHOUT | 95 | 1 × 10¹⁶ | 100 | Cr | 3 | 50 | 1080 | 27 |
| | 9-6 | S | WITHOUT | 95 | 1 × 10¹⁵ | 100 | Cr | 3 | 50 | 1080 | 27 |
| | 9-7 | S | WITHOUT | 95 | 1 × 10¹⁶ | 100 | Cr | 3 | 50 | 1080 | 27 |
| COMPARATIVE EXAMPLE | 9-8 | S | WITHOUT | 97.5 | 1 × 10¹⁶ | 100 | NONE | | 50 | 1080 | 16 |
| EXAMPLE OF PRESENT INVENTION | 9-9 | S | WITHOUT | 97.5 | 1 × 10¹⁶ | 100 | Cr | 3 | 50 | 1080 | 32 |
| | 9-10 | S | WITHOUT | 97.5 | 1 × 10¹⁶ | 100 | Cr | 3 | 50 | 1080 | 32 |
| | 9-11 | S | WITHOUT | 97.5 | 1 × 10¹⁶ | 100 | Cr | 3 | 50 | 1080 | 32 |
| | 9-12 | S | WITHOUT | 97.5 | 1 × 10¹⁶ | 100 | Cr | 3 | 50 | 1080 | 32 |
| | 9-13 | S | WITHOUT | 97.5 | 1 × 10¹⁶ | 100 | Cr | 3 | 50 | 1080 | 32 |
| | 9-14 | S | WITHOUT | 97.5 | 1 × 10¹⁶ | 100 | Cr | 3 | 50 | 1080 | 32 |
| COMPARATIVE EXAMPLE | 9-15 | S | WITH | 95 | 8 × 10¹⁶ | 100 | NONE | | 50 | 1080 | 16 |
| EXAMPLE OF PRESENT INVENTION | 9-16 | S | WITH | 95 | 8 × 10¹⁶ | 100 | Cr | 3 | 50 | 1080 | 58 |
| | 9-17 | S | WITH | 95 | 8 × 10¹⁶ | 100 | Cr | 3 | 50 | 1080 | 58 |
| | 9-18 | S | WITH | 95 | 8 × 10¹⁶ | 100 | Cr | 3 | 50 | 1080 | 58 |
| | 9-19 | S | WITH | 95 | 8 × 10¹⁶ | 100 | Cr | 3 | 50 | 1080 | 58 |
| | 9-20 | S | WITH | 95 | 8 × 10¹⁶ | 100 | Cr | 3 | 50 | 1080 | 58 |
| | 9-21 | S | WITH | 95 | 8 × 10¹⁶ | 100 | Cr | 3 | 50 | 1080 | 58 |
| COMPARATIVE EXAMPLE | 9-22 | S | WITHOUT | 95 | 1 × 10¹⁵ | 250 | NONE | | 50 | 1080 | 16 |
| EXAMPLE OF PRESENT INVENTION | 9-23 | S | WITHOUT | 95 | 1 × 10¹⁵ | 250 | Cr | 8 | 50 | 1080 | 25 |
| | 9-24 | S | WITHOUT | 95 | 1 × 10¹⁵ | 250 | Cr | 8 | 50 | 1080 | 25 |
| | 9-25 | S | WITHOUT | 95 | 1 × 10¹⁵ | 250 | Cr | 8 | 50 | 1080 | 25 |
| | 9-26 | S | WITHOUT | 95 | 1 × 10¹⁵ | 250 | Cr | 8 | 50 | 1080 | 25 |
| | 9-27 | S | WITHOUT | 95 | 1 × 10¹⁵ | 250 | Cr | 8 | 50 | 1080 | 25 |
| | 9-28 | S | WITHOUT | 95 | 1 × 10¹⁵ | 250 | Cr | 8 | 50 | 1080 | 25 |
| COMPARATIVE EXAMPLE | 9-29 | S | WITHOUT | 97.5 | 1 × 10¹⁶ | 250 | NONE | | 50 | 1080 | 16 |
| EXAMPLE OF PRESENT INVENTION | 9-30 | S | WITHOUT | 97.5 | 1 × 10¹⁶ | 250 | Cr | 8 | 50 | 1080 | 35 |
| | 9-31 | S | WITHOUT | 97.5 | 1 × 10¹⁶ | 250 | Cr | 8 | 50 | 1080 | 35 |
| | 9-32 | S | WITHOUT | 97.5 | 1 × 10¹⁶ | 250 | Cr | 8 | 50 | 1080 | 35 |
| | 9-33 | S | WITHOUT | 97.5 | 1 × 10¹⁶ | 250 | Cr | 8 | 50 | 1080 | 35 |
| | 9-34 | S | WITHOUT | 97.5 | 1 × 10¹⁶ | 250 | Cr | 8 | 50 | 1080 | 35 |
| | 9-35 | S | WITHOUT | 97.5 | 1 × 10¹⁶ | 250 | Cr | 8 | 50 | 1080 | 35 |
| COMPARATIVE EXAMPLE | 9-36 | S | WITH | 95 | 8 × 10¹⁶ | 250 | NONE | | 50 | 1080 | 16 |

TABLE 22-continued

| | CONDITION No. | FIRST SAMPLE ACCUMULATION DEGREE OF {222} PLANE (%) | KEEPING TEMPERATURE (° C.) | KEEPING TIME (s) | SECOND SAMPLE ACCUMULATION DEGREE OF {200} PLANE (%) | ACCUMULATION DEGREE OF {222} PLANE (%) | COOLING RATE (° C./s) | DISTANCE (μm) | THIRD SAMPLE ACCUMULATION DEGREE OF {200} PLANE (%) | ACCUMULATION DEGREE OF {222} PLANE (%) |
|---|---|---|---|---|---|---|---|---|---|---|
| EXAMPLE OF PRESENT INVENTION | 9-37 | S WITH | 95 | $8 \times 10^{16}$ | 250 | Cr | 1080 | 50 | 1080 | 52 |
| | 9-38 | S WITH | 95 | $8 \times 10^{16}$ | 250 | Cr | 1080 | 50 | 1080 | 52 |
| | 9-39 | S WITH | 95 | $8 \times 10^{16}$ | 250 | Cr | 1080 | 50 | 1080 | 52 |
| | 9-40 | S WITH | 95 | $8 \times 10^{16}$ | 250 | Cr | 1080 | 50 | 1080 | 52 |
| | 9-41 | S WITH | 95 | $8 \times 10^{16}$ | 250 | Cr | 1080 | 50 | 1080 | 52 |
| | 9-42 | S WITH | 95 | $8 \times 10^{16}$ | 250 | Cr | 1080 | 50 | 1080 | 52 |
| COMPARATIVE EXAMPLE | 9-1 | 13 | 1080 | 2 | 13 | 13 | 50 | 50 | 13 | 13 |
| EXAMPLE OF PRESENT INVENTION | 9-2 | 13 | 1080 | 2 | 30 | 10 | 50 | 54 | 30 | 10 |
| | 9-3 | 13 | 1130 | 2 | 30 | 11 | 50 | 54 | 30 | 11 |
| | 9-4 | 13 | 1130 | 5 | 30 | 11 | 50 | 54 | 30 | 11 |
| | 9-5 | 13 | 1130 | 30 | 30 | 11 | 50 | 54 | 30 | 11 |
| | 9-6 | 13 | 1130 | 120 | 30 | 11 | 50 | 54 | 30 | 11 |
| | 9-7 | 13 | 1130 | 360 | 30 | 11 | 50 | 54 | 30 | 11 |
| COMPARATIVE EXAMPLE | 9-8 | 13 | 1130 | 2 | 13 | 13 | 50 | 50 | 13 | 13 |
| EXAMPLE OF PRESENT INVENTION | 9-9 | 5 | 1080 | 2 | 46 | 4.8 | 50 | 54 | 46 | 4.8 |
| | 9-10 | 5 | 1130 | 2 | 57 | 2.1 | 50 | 54 | 57 | 2.1 |
| | 9-11 | 5 | 1130 | 5 | 57 | 2.1 | 50 | 54 | 57 | 2.1 |
| | 9-12 | 5 | 1130 | 30 | 57 | 2.1 | 50 | 54 | 57 | 2.1 |
| | 9-13 | 5 | 1130 | 120 | 57 | 2.1 | 50 | 54 | 57 | 2.1 |
| | 9-14 | 5 | 1130 | 360 | 57 | 2.1 | 50 | 54 | 57 | 2.1 |
| COMPARATIVE EXAMPLE | 9-15 | 13 | 1130 | 2 | 13 | 13 | 50 | 50 | 13 | 13 |
| EXAMPLE OF PRESENT INVENTION | 9-16 | 3.1 | 1080 | 2 | 61 | 2.3 | 50 | 54 | 61 | 2.3 |
| | 9-17 | 3.1 | 1130 | 2 | 81 | 0.8 | 50 | 54 | 81 | 0.8 |
| | 9-18 | 3.1 | 1130 | 5 | 81 | 0.8 | 50 | 54 | 81 | 0.8 |
| | 9-19 | 3.1 | 1130 | 30 | 81 | 0.8 | 50 | 54 | 81 | 0.8 |
| | 9-20 | 3.1 | 1130 | 120 | 81 | 0.8 | 50 | 54 | 81 | 0.8 |
| | 9-21 | 3.1 | 1130 | 360 | 81 | 0.8 | 50 | 54 | 81 | 0.8 |
| COMPARATIVE EXAMPLE | 9-22 | 13 | 1180 | 2 | 13 | 13 | 50 | 125 | 13 | 13 |
| EXAMPLE OF PRESENT INVENTION | 9-23 | 12 | 1080 | 2 | 30 | 12 | 50 | 136 | 30 | 12 |
| | 9-24 | 12 | 1180 | 3 | 33 | 7 | 50 | 136 | 33 | 7 |
| | 9-25 | 12 | 1180 | 7 | 33 | 7 | 50 | 136 | 33 | 7 |
| | 9-26 | 12 | 1180 | 35 | 33 | 7 | 50 | 136 | 33 | 7 |
| | 9-27 | 12 | 1180 | 140 | 33 | 7 | 50 | 136 | 33 | 7 |
| | 9-28 | 12 | 1180 | 420 | 33 | 7 | 50 | 136 | 33 | 7 |
| COMPARATIVE EXAMPLE | 9-29 | 13 | 1180 | 2 | 13 | 13 | 50 | 125 | 13 | 13 |
| EXAMPLE OF PRESENT INVENTION | 9-30 | 6 | 1080 | 2 | 42 | 5.2 | 50 | 136 | 42 | 5.2 |
| | 9-31 | 6 | 1180 | 3 | 53 | 2.3 | 50 | 136 | 53 | 2.3 |
| | 9-32 | 6 | 1180 | 7 | 53 | 2.3 | 50 | 136 | 53 | 2.3 |
| | 9-33 | 6 | 1180 | 35 | 53 | 2.3 | 50 | 136 | 53 | 2.3 |
| | 9-34 | 6 | 1180 | 140 | 53 | 2.3 | 50 | 136 | 53 | 2.3 |

TABLE 22-continued

| | | | | | | | | | | |
|---|---|---|---|---|---|---|---|---|---|---|
| COMPARATIVE EXAMPLE | 9-35 | 6 | 1180 | 420 | 53 | 2.3 | 50 | 136 | 53 | 2.3 |
| | 9-36 | 13 | 1180 | 2 | 13 | 13 | 50 | 125 | 13 | 13 |
| EXAMPLE OF PRESENT INVENTION | 9-37 | 4.2 | 1080 | 2 | 62 | 2 | 50 | 136 | 62 | 2 |
| | 9-38 | 4.2 | 1180 | 3 | 74 | 0.9 | 50 | 136 | 74 | 0.9 |
| | 9-39 | 4.2 | 1180 | 7 | 74 | 0.9 | 50 | 136 | 74 | 0.9 |
| | 9-40 | 4.2 | 1180 | 35 | 74 | 0.9 | 50 | 136 | 74 | 0.9 |
| | 9-41 | 4.2 | 1180 | 140 | 74 | 0.9 | 50 | 136 | 74 | 0.9 |
| | 9-42 | 4.2 | 1180 | 420 | 74 | 0.9 | 50 | 136 | 74 | 0.9 |

Further, an alloying ratio of the metal layer and a ratio of an α single phase region in each of the Fe-based metal plates were measured as in the first experiment. Here, in finding the alloying ratio, a region where the Fe content was 0.5 mass % or less and the content of ferrite former was 99.5 mass % or more was regarded as an alloy layer. Further, a region where the Cr content was 13.0 mass % or more was regarded as the α single phase region, and a ratio of the α single phase region was found from the aforesaid expression (4). Results of these are listed in Table 23.

Further, as in the first experiment, magnetic flux density B50 and saturation magnetic flux density Bs were measured and a ratio B50/Bs of the magnetic flux density B50 to the saturation magnetic flux density Bs was calculated. Further, core loss W10/1k (W10/1000) at a 1000 Hz frequency when the magnetic flux density was 1.0 T was measured. Results of these are listed in Table 23.

9-37 to No. 9-42), the accumulation degree of the {200} planes in the α phase was within the ranges of the present invention at the respective stages of the heat treatment. Further, as listed in Table 23, in the examples of the present invention, the alloying ratio and the ratio of the α single phase region were within the desirable ranges of the present invention. As listed in Table 23, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumu-

TABLE 23

|  | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/ Bs | W10/1k (W/kg) |
|---|---|---|---|---|---|---|---|---|---|
| COMPARATIVE EXAMPLE | 9-1 | 0 | 0 | 13 | 13 | 1.60 | 2.05 | 0.78 | 95 |
| EXAMPLE | 9-2 | 6 | 0.2 | 30 | 10 | 1.74 | 2.05 | 0.85 | 62 |
| OF | 9-3 | 82 | 1.5 | 31 | 10 | 1.74 | 2.05 | 0.85 | 57 |
| PRESENT | 9-4 | 95 | 8.2 | 30 | 10 | 1.74 | 2.05 | 0.85 | 44 |
| INVENTION | 9-5 | 100 | 35 | 30 | 10 | 1.74 | 2.05 | 0.85 | 37 |
|  | 9-6 | 100 | 73 | 30 | 10 | 1.74 | 2.05 | 0.85 | 43 |
|  | 9-7 | 100 | 87 | 30 | 10 | 1.74 | 2.05 | 0.85 | 58 |
| COMPARATIVE EXAMPLE | 9-8 | 0 | 0 | 13 | 13 | 1.60 | 2.05 | 0.78 | 93 |
| EXAMPLE | 9-9 | 10 | 0.4 | 46 | 4.8 | 1.78 | 2.05 | 0.87 | 61 |
| OF | 9-10 | 64 | 2.6 | 53 | 2.7 | 1.85 | 2.05 | 0.90 | 57 |
| PRESENT | 9-11 | 94 | 7.8 | 53 | 2.7 | 1.87 | 2.05 | 0.91 | 42 |
| INVENTION | 9-12 | 100 | 42 | 53 | 2.7 | 1.85 | 2.05 | 0.90 | 33 |
|  | 9-13 | 100 | 71 | 53 | 2.7 | 1.85 | 2.05 | 0.90 | 38 |
|  | 9-14 | 100 | 95 | 53 | 2.7 | 1.87 | 2.05 | 0.91 | 53 |
| COMPARATIVE EXAMPLE | 9-15 | 0 | 0 | 13 | 13 | 1.62 | 2.05 | 0.79 | 94 |
| EXAMPLE | 9-16 | 9 | 0.3 | 61 | 2.3 | 1.89 | 2.05 | 0.92 | 62 |
| OF | 9-17 | 67 | 1.2 | 75 | 1.3 | 1.95 | 2.05 | 0.95 | 48 |
| PRESENT | 9-18 | 89 | 5.9 | 75 | 1.4 | 1.93 | 2.05 | 0.94 | 41 |
| INVENTION | 9-19 | 100 | 37 | 75 | 1.3 | 1.95 | 2.05 | 0.95 | 28 |
|  | 9-20 | 100 | 72 | 76 | 1.4 | 1.97 | 2.05 | 0.96 | 33 |
|  | 9-21 | 100 | 87 | 75 | 1.7 | 1.95 | 2.05 | 0.95 | 48 |
| COMPARATIVE EXAMPLE | 9-22 | 0 | 0 | 13 | 13 | 1.60 | 2.05 | 0.78 | 98 |
| EXAMPLE | 9-23 | 6 | 0.2 | 30 | 12 | 1.74 | 2.05 | 0.85 | 65 |
| OF | 9-24 | 57 | 1.2 | 32 | 9 | 1.74 | 2.05 | 0.85 | 56 |
| PRESENT | 9-25 | 87 | 6.7 | 32 | 9 | 1.74 | 2.05 | 0.85 | 45 |
| INVENTION | 9-26 | 100 | 45 | 32 | 9 | 1.74 | 2.05 | 0.85 | 37 |
|  | 9-27 | 100 | 72 | 32 | 9 | 1.74 | 2.05 | 0.85 | 42 |
|  | 9-28 | 100 | 92 | 32 | 9 | 1.74 | 2.05 | 0.85 | 57 |
| COMPARATIVE EXAMPLE | 9-29 | 0 | 0 | 13 | 13 | 1.60 | 2.05 | 0.78 | 96 |
| EXAMPLE | 9-30 | 5 | 0.1 | 42 | 5.2 | 1.78 | 2.05 | 0.87 | 64 |
| OF | 9-31 | 54 | 1.3 | 56 | 2.1 | 1.87 | 2.05 | 0.91 | 52 |
| PRESENT | 9-32 | 78 | 6.1 | 56 | 2.1 | 1.85 | 2.05 | 0.90 | 41 |
| INVENTION | 9-33 | 100 | 38 | 56 | 2.2 | 1.87 | 2.05 | 0.91 | 32 |
|  | 9-34 | 100 | 71 | 56 | 2.1 | 1.85 | 2.05 | 0.90 | 38 |
|  | 9-35 | 100 | 91 | 56 | 2.2 | 1.87 | 2.05 | 0.91 | 54 |
| COMPARATIVE EXAMPLE | 9-36 | 0 | 0 | 13 | 13 | 1.62 | 2.05 | 0.79 | 100 |
| EXAMPLE | 9-37 | 5 | 0.1 | 62 | 2 | 1.89 | 2.05 | 0.92 | 64 |
| OF | 9-38 | 70 | 2.3 | 82 | 0.8 | 1.95 | 2.05 | 0.95 | 46 |
| PRESENT | 9-39 | 91 | 7.1 | 82 | 0.8 | 1.95 | 2.05 | 0.95 | 40 |
| INVENTION | 9-40 | 100 | 41 | 82 | 0.8 | 1.97 | 2.05 | 0.96 | 26 |
|  | 9-41 | 100 | 76 | 82 | 0.8 | 1.95 | 2.05 | 0.95 | 32 |
|  | 9-42 | 100 | 100 | 82 | 0.8 | 1.97 | 2.05 | 0.96 | 48 |

As listed in Table 22, in examples of the present invention (conditions No. 9-2 to No. 9-7, No. 9-9 to No. 9-14, No. 9-16 to No. 9-21, No. 9-23 to No. 9-28, No. 9-30 to No. 9-35, No.

lation degree of the {200} planes was 30% or more, not only the magnetic flux density B50 but also the core loss W10/1 k maintained a higher property level. Further, it could be confirmed that the core loss W10/1 k has a still better property level when the ratio of the α single phase region is not less than 5% nor more than 80%.

Tenth Experiment

In a tenth experiment, correlations between an accumulation degree of {200} planes and an accumulation degree of {222} planes and core loss in 42 kinds of manufacturing conditions (condition No. 10-1 to condition No. 10-42) were studied.

Base metal plates (silicon steel plates) used in the tenth experiment contained components of the composition T listed in Table 11 and inevitable impurities, with the balance being Fe. An actually measured value of the A3 point at which the base metal plates used in the tenth experiment transformed to a γ single phase was 1020° C. The base metal plates were fabricated in the same manner as that in the fourth experiment. In the condition No. 10-1 to the condition No. 10-42, cold rolling was performed in the same manners as those in the condition No. 4-1 to the condition No. 4-42 respectively.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 24.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, and it was found that, as rolled, the accumulation degree of the {200} planes in the α phase was within a 17% to 24% range and the accumulation degree of the {222} planes in the α phase was within a 17% to 24% range in each of the base metal plates.

Thereafter, Ti layers as the metal layers were formed on a front surface and a rear surface of each of the base metal plates by a sputtering method, except in the conditions No. 10-1, No. 10-8, No. 10-15, No. 10-22, No. 10-29, and No. 10-36. Thickness of each of the Ti layers (total thickness on the both surfaces) is listed in Table 24.

Subsequently, heat treatment was applied on the base metal plates on which the metal layers were formed, under various conditions as in the first experiment. Further, three samples were prepared per condition and the accumulation degree of the {200} planes of the α phase and the accumulation degree of the {222} planes in the α phase were measured at three stages of the heat treatment, as in the first experiment. Results of these are listed in Table 24.

TABLE 24

| | CONDITION No. | BASE METAL PLATE COMPOSITION | BLASTING | REDUCTION RATE (%) | DISLOCATION DENSITY (m/m³) | THICKNESS (μm) | METAL LAYER ELEMENT | THICKNESS (μm) | HEATING RATE (°C/s) | FIRST SAMPLE MEASURED TEMPERATURE (°C) | ACCUMULATION DEGREE OF {200} PLANE (%) |
|---|---|---|---|---|---|---|---|---|---|---|---|
| COMPARATIVE EXAMPLE | 10-1 | T | WITHOUT | 95 | 1 × 10¹⁵ | 100 | NONE | | 50 | 1020 | 17 |
| EXAMPLE OF PRESENT INVENTION | 10-2 | T | WITHOUT | 95 | 1 × 10¹⁵ | 100 | Ti | 5 | 50 | 1020 | 25 |
| | 10-3 | T | WITHOUT | 95 | 1 × 10¹⁵ | 100 | Ti | 5 | 50 | 1020 | 25 |
| | 10-4 | T | WITHOUT | 95 | 1 × 10¹⁵ | 100 | Ti | 5 | 50 | 1020 | 25 |
| | 10-5 | T | WITHOUT | 95 | 1 × 10¹⁵ | 100 | Ti | 5 | 50 | 1020 | 25 |
| | 10-6 | T | WITHOUT | 95 | 1 × 10¹⁵ | 100 | Ti | 5 | 50 | 1020 | 25 |
| | 10-7 | T | WITHOUT | 97.5 | 1 × 10¹⁶ | 100 | Ti | 5 | 50 | 1020 | 25 |
| COMPARATIVE EXAMPLE | 10-8 | T | WITHOUT | 97.5 | 1 × 10¹⁶ | 100 | NONE | | 50 | 1020 | 17 |
| EXAMPLE OF PRESENT INVENTION | 10-9 | T | WITHOUT | 97.5 | 1 × 10¹⁶ | 100 | Ti | 5 | 50 | 1020 | 35 |
| | 10-10 | T | WITHOUT | 97.5 | 1 × 10¹⁶ | 100 | Ti | 5 | 50 | 1020 | 35 |
| | 10-11 | T | WITHOUT | 97.5 | 1 × 10¹⁶ | 100 | Ti | 5 | 50 | 1020 | 35 |
| | 10-12 | T | WITHOUT | 97.5 | 1 × 10¹⁶ | 100 | Ti | 5 | 50 | 1020 | 35 |
| | 10-13 | T | WITHOUT | 97.5 | 1 × 10¹⁶ | 100 | Ti | 5 | 50 | 1020 | 35 |
| | 10-14 | T | WITHOUT | 95 | 8 × 10¹⁶ | 100 | Ti | 5 | 50 | 1020 | 35 |
| COMPARATIVE EXAMPLE | 10-15 | T | WITH | 95 | 8 × 10¹⁶ | 100 | NONE | | 50 | 1020 | 16 |
| EXAMPLE OF PRESENT INVENTION | 10-16 | T | WITH | 95 | 8 × 10¹⁶ | 100 | Ti | 5 | 50 | 1020 | 61 |
| | 10-17 | T | WITH | 95 | 8 × 10¹⁶ | 100 | Ti | 5 | 50 | 1020 | 61 |
| | 10-18 | T | WITH | 95 | 8 × 10¹⁶ | 100 | Ti | 5 | 50 | 1020 | 61 |
| | 10-19 | T | WITH | 95 | 8 × 10¹⁶ | 100 | Ti | 5 | 50 | 1020 | 61 |
| | 10-20 | T | WITH | 95 | 8 × 10¹⁶ | 100 | Ti | 5 | 50 | 1020 | 61 |
| | 10-21 | T | WITH | 95 | 8 × 10¹⁶ | 100 | Ti | 5 | 50 | 1020 | 61 |
| COMPARATIVE EXAMPLE | 10-22 | T | WITHOUT | 97.5 | 1 × 10¹⁵ | 250 | NONE | | 50 | 1020 | 17 |
| EXAMPLE OF PRESENT INVENTION | 10-23 | T | WITHOUT | 95 | 1 × 10¹⁵ | 250 | Ti | 13 | 50 | 1020 | 26 |
| | 10-24 | T | WITHOUT | 95 | 1 × 10¹⁵ | 250 | Ti | 13 | 50 | 1020 | 26 |
| | 10-25 | T | WITHOUT | 95 | 1 × 10¹⁵ | 250 | Ti | 13 | 50 | 1020 | 26 |
| | 10-26 | T | WITHOUT | 95 | 1 × 10¹⁵ | 250 | Ti | 13 | 50 | 1020 | 26 |
| | 10-27 | T | WITHOUT | 95 | 1 × 10¹⁵ | 250 | Ti | 13 | 50 | 1020 | 26 |
| | 10-28 | T | WITHOUT | 95 | 1 × 10¹⁵ | 250 | Ti | 13 | 50 | 1020 | 26 |
| COMPARATIVE EXAMPLE | 10-29 | T | WITHOUT | 97.5 | 1 × 10¹⁶ | 250 | NONE | | 50 | 1020 | 17 |
| EXAMPLE OF PRESENT INVENTION | 10-30 | T | WITHOUT | 97.5 | 1 × 10¹⁶ | 250 | Ti | 13 | 50 | 1020 | 38 |
| | 10-31 | T | WITHOUT | 97.5 | 1 × 10¹⁶ | 250 | Ti | 13 | 50 | 1020 | 38 |
| | 10-32 | T | WITHOUT | 97.5 | 1 × 10¹⁶ | 250 | Ti | 13 | 50 | 1020 | 38 |
| | 10-33 | T | WITHOUT | 97.5 | 1 × 10¹⁶ | 250 | Ti | 13 | 50 | 1020 | 38 |
| | 10-34 | T | WITHOUT | 97.5 | 1 × 10¹⁶ | 250 | Ti | 13 | 50 | 1020 | 38 |
| | 10-35 | T | WITHOUT | 97.5 | 1 × 10¹⁶ | 250 | Ti | 13 | 50 | 1020 | 38 |
| COMPARATIVE EXAMPLE | 10-36 | T | WITH | 95 | 8 × 10¹⁶ | 250 | NONE | | 50 | 1020 | 18 |

TABLE 24-continued

| | CONDITION No. | FIRST SAMPLE | | | SECOND SAMPLE | | | | | | THIRD SAMPLE | | |
|---|---|---|---|---|---|---|---|---|---|---|---|---|---|
| | | | KEEPING TEMPERATURE (°C.) | KEEPING TIME (s) | ACCUMULATION DEGREE OF {200} PLANE (%) | ACCUMULATION DEGREE OF {222} PLANE (%) | | | COOLING RATE (°C./s) | DISTANCE (μm) | ACCUMULATION DEGREE OF {200} PLANE (%) | ACCUMULATION DEGREE OF {222} PLANE (%) |
| | | ACCUMULATION DEGREE OF {222} PLANE (%) | | | | | | | | | | | |
| EXAMPLE OF PRESENT INVENTION | 10-37 | T WITH | 95 | | 1050 | | 8×10$^{16}$ | 250 | Ti | 13 | 50 | 1020 | 58 |
| | 10-38 | T WITH | 95 | | 1050 | | 8×10$^{16}$ | 250 | Ti | 13 | 50 | 1020 | 58 |
| | 10-39 | T WITH | 95 | | 1050 | | 8×10$^{16}$ | 250 | Ti | 13 | 50 | 1020 | 58 |
| | 10-40 | T WITH | 95 | | 1050 | | 8×10$^{16}$ | 250 | Ti | 13 | 50 | 1020 | 58 |
| | 10-41 | T WITH | 95 | | 1050 | | 8×10$^{16}$ | 250 | Ti | 13 | 50 | 1020 | 58 |
| | 10-42 | T WITH | 95 | | 1050 | | 8×10$^{16}$ | 250 | Ti | 13 | 50 | 1020 | 58 |
| COMPARATIVE EXAMPLE | 10-1 | 13 | 1050 | 2 | 13 | 13 | | | 8 | 50 | 13 | 13 |
| EXAMPLE OF PRESENT INVENTION | 10-2 | 16 | 1020 | 2 | 30 | 11 | | | 8 | 54 | 30 | 11 |
| | 10-3 | 16 | 1050 | 2 | 33 | 9 | | | 8 | 54 | 33 | 9 |
| | 10-4 | 16 | 1050 | 5 | 33 | 9 | | | 8 | 54 | 33 | 9 |
| | 10-5 | 16 | 1050 | 30 | 33 | 9 | | | 8 | 54 | 33 | 9 |
| | 10-6 | 16 | 1050 | 120 | 33 | 9 | | | 8 | 54 | 33 | 9 |
| | 10-7 | 16 | 1050 | 360 | 33 | 9 | | | 8 | 54 | 33 | 9 |
| COMPARATIVE EXAMPLE | 10-8 | 13 | 1050 | 2 | 13 | 13 | | | 8 | 50 | 13 | 13 |
| EXAMPLE OF PRESENT INVENTION | 10-9 | 4 | 1020 | 2 | 41 | 5.8 | | | 8 | 54 | 41 | 5.8 |
| | 10-10 | 4 | 1050 | 2 | 52 | 3.2 | | | 8 | 54 | 52 | 3.2 |
| | 10-11 | 4 | 1050 | 5 | 52 | 3.2 | | | 8 | 54 | 52 | 3.2 |
| | 10-12 | 4 | 1050 | 30 | 52 | 3.2 | | | 8 | 54 | 52 | 3.2 |
| | 10-13 | 4 | 1050 | 120 | 52 | 3.2 | | | 8 | 54 | 52 | 3.2 |
| | 10-14 | 4 | 1050 | 360 | 52 | 3.2 | | | 8 | 54 | 52 | 3.2 |
| COMPARATIVE EXAMPLE | 10-15 | 14 | 1050 | 2 | 13 | 13 | | | 8 | 50 | 13 | 13 |
| EXAMPLE OF PRESENT INVENTION | 10-16 | 2.7 | 1020 | 2 | 64 | 1.8 | | | 8 | 54 | 64 | 1.8 |
| | 10-17 | 2.7 | 1050 | 2 | 76 | 1.2 | | | 8 | 54 | 76 | 1.2 |
| | 10-18 | 2.7 | 1050 | 5 | 76 | 1.2 | | | 8 | 54 | 76 | 1.2 |
| | 10-19 | 2.7 | 1050 | 30 | 76 | 1.2 | | | 8 | 54 | 76 | 1.2 |
| | 10-20 | 2.7 | 1050 | 120 | 76 | 1.2 | | | 8 | 54 | 76 | 1.2 |
| | 10-21 | 2.7 | 1050 | 360 | 76 | 1.2 | | | 8 | 54 | 76 | 1.2 |
| COMPARATIVE EXAMPLE | 10-22 | 14 | 1050 | 2 | 13 | 13 | | | 8 | 125 | 13 | 13 |
| EXAMPLE OF PRESENT INVENTION | 10-23 | 13 | 1020 | 2 | 30 | 11 | | | 8 | 136 | 30 | 11 |
| | 10-24 | 13 | 1100 | 3 | 32 | 11 | | | 8 | 136 | 32 | 11 |
| | 10-25 | 13 | 1100 | 7 | 32 | 11 | | | 8 | 136 | 32 | 11 |
| | 10-26 | 13 | 1100 | 35 | 32 | 11 | | | 8 | 136 | 32 | 11 |
| | 10-27 | 13 | 1100 | 140 | 32 | 11 | | | 8 | 136 | 32 | 11 |
| | 10-28 | 13 | 1100 | 420 | 32 | 11 | | | 8 | 136 | 32 | 11 |
| COMPARATIVE EXAMPLE | 10-29 | 14 | 1100 | 2 | 13 | 13 | | | 8 | 125 | 13 | 13 |
| EXAMPLE OF PRESENT INVENTION | 10-30 | 4 | 1020 | 2 | 42 | 4.2 | | | 8 | 136 | 42 | 4.2 |
| | 10-31 | 4 | 1100 | 3 | 54 | 2.9 | | | 8 | 136 | 54 | 2.9 |
| | 10-32 | 4 | 1100 | 7 | 54 | 2.9 | | | 8 | 136 | 54 | 2.9 |
| | 10-33 | 4 | 1100 | 35 | 54 | 2.9 | | | 8 | 136 | 54 | 2.9 |
| | 10-34 | 4 | 1100 | 140 | 54 | 2.9 | | | 8 | 136 | 54 | 2.9 |

TABLE 24-continued

| | | | | | | | | | | | |
|---|---|---|---|---|---|---|---|---|---|---|---|
| COMPARATIVE EXAMPLE | 10-35 | 4 | 1100 | 420 | 54 | 2.9 | 8 | 136 | 54 | 2.9 | |
| | 10-36 | 13 | 1100 | 2 | 13 | 13 | 8 | 125 | 13 | 13 | |
| EXAMPLE OF PRESENT INVENTION | 10-37 | 3.4 | 1020 | 2 | 63 | 1.8 | 8 | 136 | 63 | 1.8 | |
| | 10-38 | 3.4 | 1100 | 3 | 80 | 0.7 | 8 | 136 | 80 | 0.7 | |
| | 10-39 | 3.4 | 1100 | 7 | 80 | 0.7 | 8 | 136 | 80 | 0.7 | |
| | 10-40 | 3.4 | 1100 | 35 | 80 | 0.7 | 8 | 136 | 80 | 0.7 | |
| | 10-41 | 3.4 | 1100 | 140 | 80 | 0.7 | 8 | 136 | 80 | 0.7 | |
| | 10-42 | 3.4 | 1100 | 420 | 80 | 0.7 | 8 | 136 | 80 | 0.7 | |

Further, an alloying ratio of the metal layer and a ratio of an α single phase region in each of the Fe-based metal plates were measured as in the first experiment. Here, in finding the alloying ratio, a region where the Fe content was 0.5 mass % or less and the content of ferrite former was 99.5 mass % or more was regarded as an alloy layer. Further, a region where the Ti content was 1.2 mass % or more was regarded as the α single phase region, and a ratio of the α single phase region was found from the aforesaid expression (4). Results of these are listed in Table 25.

Further, as in the first experiment, magnetic flux density B50 and saturation magnetic flux density Bs were measured and a ratio B50/Bs of the magnetic flux density 50 to the saturation magnetic flux density Bs was calculated. Further, core loss W10/1 k (W10/1000) at a 1000 Hz frequency when the magnetic flux density was 1.0 T was measured. Results of these are listed in Table 25.

10-35, No. 10-37 to No. 10-42), the accumulation degree of the {200} planes in the α phase was within the ranges of the present invention at the respective stages of the heat treatment. Further, as listed in Table 25, in the examples of the present invention, the alloying ratio and the ratio of the α single phase region were within the desirable ranges of the present invention. As listed in Table 25, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumu-

TABLE 25

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/ Bs | W10/1k (W/kg) |
|---|---|---|---|---|---|---|---|---|---|
| COMPARATIVE EXAMPLE | 10-1 | 0 | 0 | 13 | 13 | 1.60 | 2.05 | 0.78 | 91 |
| EXAMPLE OF PRESENT INVENTION | 10-2 | 6 | 0.2 | 30 | 11 | 1.74 | 2.05 | 0.85 | 62 |
| | 10-3 | 82 | 1.5 | 31 | 10 | 1.74 | 2.05 | 0.85 | 57 |
| | 10-4 | 95 | 8.2 | 30 | 10 | 1.74 | 2.05 | 0.85 | 44 |
| | 10-5 | 100 | 35 | 30 | 10 | 1.74 | 2.05 | 0.85 | 37 |
| | 10-6 | 100 | 73 | 30 | 10 | 1.74 | 2.05 | 0.85 | 43 |
| | 10-7 | 100 | 87 | 30 | 10 | 1.74 | 2.05 | 0.85 | 58 |
| COMPARATIVE EXAMPLE | 10-8 | 0 | 0 | 13 | 13 | 1.60 | 2.05 | 0.78 | 93 |
| EXAMPLE OF PRESENT INVENTION | 10-9 | 8 | 0.2 | 41 | 5.8 | 1.76 | 2.05 | 0.86 | 62 |
| | 10-10 | 64 | 2.6 | 53 | 2.7 | 1.85 | 2.05 | 0.90 | 57 |
| | 10-11 | 94 | 7.8 | 53 | 2.7 | 1.87 | 2.05 | 0.91 | 42 |
| | 10-12 | 100 | 42 | 53 | 2.7 | 1.85 | 2.05 | 0.90 | 33 |
| | 10-13 | 100 | 71 | 53 | 2.7 | 1.85 | 2.05 | 0.90 | 38 |
| | 10-14 | 100 | 95 | 53 | 2.7 | 1.87 | 2.05 | 0.91 | 53 |
| COMPARATIVE EXAMPLE | 10-15 | 0 | 0 | 13 | 13 | 1.62 | 2.05 | 0.79 | 92 |
| EXAMPLE OF PRESENT INVENTION | 10-16 | 7 | 0.3 | 64 | 1.8 | 1.91 | 2.05 | 0.93 | 61 |
| | 10-17 | 67 | 1.2 | 75 | 1.3 | 1.95 | 2.05 | 0.95 | 48 |
| | 10-18 | 89 | 5.9 | 75 | 1.4 | 1.93 | 2.05 | 0.94 | 41 |
| | 10-19 | 100 | 37 | 75 | 1.3 | 1.95 | 2.05 | 0.95 | 28 |
| | 10-20 | 100 | 72 | 76 | 1.4 | 1.97 | 2.05 | 0.96 | 33 |
| | 10-21 | 100 | 87 | 75 | 1.7 | 1.95 | 2.05 | 0.95 | 48 |
| COMPARATIVE EXAMPLE | 10-22 | 0 | 0 | 13 | 13 | 1.60 | 2.05 | 0.78 | 102 |
| EXAMPLE OF PRESENT INVENTION | 10-23 | 8 | 0.3 | 30 | 11 | 1.74 | 2.05 | 0.85 | 65 |
| | 10-24 | 57 | 1.2 | 32 | 9 | 1.74 | 2.05 | 0.85 | 56 |
| | 10-25 | 87 | 6.7 | 32 | 9 | 1.74 | 2.05 | 0.85 | 45 |
| | 10-26 | 100 | 45 | 32 | 9 | 1.74 | 2.05 | 0.85 | 37 |
| | 10-27 | 100 | 72 | 32 | 9 | 1.74 | 2.05 | 0.85 | 42 |
| | 10-28 | 100 | 92 | 32 | 9 | 1.74 | 2.05 | 0.85 | 57 |
| COMPARATIVE EXAMPLE | 10-29 | 0 | 0 | 13 | 13 | 1.60 | 2.05 | 0.78 | 99 |
| EXAMPLE OF PRESENT INVENTION | 10-30 | 5 | 0.1 | 42 | 4.2 | 1.78 | 2.05 | 0.87 | 65 |
| | 10-31 | 54 | 1.3 | 56 | 2.1 | 1.87 | 2.05 | 0.91 | 52 |
| | 10-32 | 78 | 6.1 | 56 | 2.1 | 1.85 | 2.05 | 0.90 | 41 |
| | 10-33 | 100 | 38 | 56 | 2.2 | 1.87 | 2.05 | 0.91 | 32 |
| | 10-34 | 100 | 71 | 56 | 2.1 | 1.85 | 2.05 | 0.90 | 38 |
| | 10-35 | 100 | 91 | 56 | 2.2 | 1.87 | 2.05 | 0.91 | 54 |
| COMPARATIVE EXAMPLE | 10-36 | 0 | 0 | 13 | 13 | 1.62 | 2.05 | 0.79 | 97 |
| EXAMPLE OF PRESENT INVENTION | 10-37 | 4 | 0.1 | 63 | 1.8 | 1.91 | 2.05 | 0.93 | 62 |
| | 10-38 | 70 | 2.3 | 82 | 0.8 | 1.95 | 2.05 | 0.95 | 46 |
| | 10-39 | 91 | 7.1 | 82 | 0.8 | 1.95 | 2.05 | 0.95 | 40 |
| | 10-40 | 100 | 41 | 82 | 0.8 | 1.97 | 2.05 | 0.96 | 26 |
| | 10-41 | 100 | 76 | 82 | 0.8 | 1.95 | 2.05 | 0.95 | 32 |
| | 10-42 | 100 | 100 | 82 | 0.8 | 1.97 | 2.05 | 0.96 | 48 |

As listed in Table 24, in examples of the present invention (conditions No. 10-2 to No. 10-7, No. 10-9 to No. 10-14, No. 10-16 to No. 10-21, No. 10-23 to No. 10-28, No. 10-30 to No. lation degree of the {200} planes was 30% or more, not only the magnetic flux density B50 but also the core loss W10/1 k maintained a higher property level. Further, it could be confirmed that the core loss W10/1 k has a still better property level when the ratio of the α single phase region is not less than 5% nor more than 80%.

Eleventh Experiment

In an eleventh experiment, correlations between an accumulation degree of {200} planes and an accumulation degree of {222} planes and core loss in 42 kinds of manufacturing conditions (condition No. 11-1 to condition No. 11-42) were studied.

Base metal plates (silicon steel plates) used in the eleventh experiment contained components of the composition U listed in Table 11 and inevitable impurities, with the balance being Fe. An actually measured value of the A3 point at which the base metal plates used in the eleventh experiment transformed to a γ single phase was 1000° C. The base metal plates were fabricated in the same manner as that in the fourth experiment. In the condition No. 11-1 to the condition No. 11-42, cold rolling was performed in the same manners as those in the condition No. 4-1 to the condition No. 4-42 respectively.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 26.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, and it was found that, as rolled, the accumulation degree of the {200} planes in the α phase was within a 17% to 24% range and the accumulation degree of the {222} planes in the α phase was within a 17% to 24% range in each of the base metal plates.

Thereafter, Ga layers as the metal layers were formed on a front surface and a rear surface of each of the base metal plates by a vapor deposition method, except in the conditions No. 11-1, No. 11-8, No. 11-15, No. 11-22, No. 11-29, and No. 11-36. Thickness of each of the Ga layers (total thickness on the both surfaces) is listed in Table 26.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 26.

TABLE 26

| | | CONDITION No. | BASE METAL PLATE | | | | | METAL LAYER | | FIRST SAMPLE | | |
|---|---|---|---|---|---|---|---|---|---|---|---|---|
| | | | COMPOSITION | BLASTING | REDUCTION RATE (%) | DISLOCATION DENSITY (m/m³) | THICKNESS (μm) | ELEMENT | THICKNESS (μm) | HEATING RATE (°C/s) | MEASURED TEMPERATURE (°C) | ACCUMULATION DEGREE OF {200} PLANE (%) |
| COMPARATIVE EXAMPLE | | 11-1 | U | WITHOUT | 95 | 1 × 10¹⁵ | 100 | NONE | | 10 | 1000 | 16 |
| EXAMPLE OF PRESENT INVENTION | | 11-2 | U | WITHOUT | 95 | 1 × 10¹⁵ | 100 | Ge | 6 | 10 | 1000 | 25 |
| | | 11-3 | U | WITHOUT | 95 | 1 × 10¹⁵ | 100 | Ge | 6 | 10 | 1000 | 25 |
| | | 11-4 | U | WITHOUT | 95 | 1 × 10¹⁵ | 100 | Ge | 6 | 10 | 1000 | 25 |
| | | 11-5 | U | WITHOUT | 95 | 1 × 10¹⁵ | 100 | Ge | 6 | 10 | 1000 | 25 |
| | | 11-6 | U | WITHOUT | 95 | 1 × 10¹⁵ | 100 | Ge | 6 | 10 | 1000 | 25 |
| | | 11-7 | U | WITHOUT | 97.5 | 1 × 10¹⁶ | 100 | Ge | 6 | 10 | 1000 | 25 |
| COMPARATIVE EXAMPLE | | 11-8 | U | WITHOUT | 97.5 | 1 × 10¹⁶ | 100 | NONE | | 10 | 1000 | 16 |
| EXAMPLE OF PRESENT INVENTION | | 11-9 | U | WITHOUT | 97.5 | 1 × 10¹⁶ | 100 | Ge | 6 | 10 | 1000 | 38 |
| | | 11-10 | U | WITHOUT | 97.5 | 1 × 10¹⁶ | 100 | Ge | 6 | 10 | 1000 | 38 |
| | | 11-11 | U | WITHOUT | 97.5 | 1 × 10¹⁶ | 100 | Ge | 6 | 10 | 1000 | 38 |
| | | 11-12 | U | WITHOUT | 97.5 | 1 × 10¹⁶ | 100 | Ge | 6 | 10 | 1000 | 38 |
| | | 11-13 | U | WITHOUT | 97.5 | 1 × 10¹⁶ | 100 | Ge | 6 | 10 | 1000 | 38 |
| | | 11-14 | U | WITH | 95 | 8 × 10¹⁶ | 100 | Ge | 6 | 10 | 1000 | 38 |
| COMPARATIVE EXAMPLE | | 11-15 | U | WITH | 95 | 8 × 10¹⁶ | 100 | NONE | | 10 | 1000 | 17 |
| EXAMPLE OF PRESENT INVENTION | | 11-16 | U | WITH | 95 | 8 × 10¹⁶ | 100 | Ge | 6 | 10 | 1000 | 48 |
| | | 11-17 | U | WITH | 95 | 8 × 10¹⁶ | 100 | Ge | 6 | 10 | 1000 | 48 |
| | | 11-18 | U | WITH | 95 | 8 × 10¹⁶ | 100 | Ge | 6 | 10 | 1000 | 48 |
| | | 11-19 | U | WITH | 95 | 8 × 10¹⁶ | 100 | Ge | 6 | 10 | 1000 | 48 |
| | | 11-20 | U | WITH | 95 | 8 × 10¹⁶ | 100 | Ge | 6 | 10 | 1000 | 48 |
| | | 11-21 | U | WITH | 95 | 8 × 10¹⁶ | 100 | Ge | 6 | 10 | 1000 | 48 |
| COMPARATIVE EXAMPLE | | 11-22 | U | WITHOUT | 95 | 1 × 10¹⁵ | 250 | NONE | | 10 | 1000 | 17 |
| EXAMPLE OF PRESENT INVENTION | | 11-23 | U | WITHOUT | 95 | 1 × 10¹⁵ | 250 | Ge | 14 | 10 | 1000 | 26 |
| | | 11-24 | U | WITHOUT | 95 | 1 × 10¹⁵ | 250 | Ge | 14 | 10 | 1000 | 26 |
| | | 11-25 | U | WITHOUT | 95 | 1 × 10¹⁵ | 250 | Ge | 14 | 10 | 1000 | 26 |
| | | 11-26 | U | WITHOUT | 95 | 1 × 10¹⁵ | 250 | Ge | 14 | 10 | 1000 | 26 |
| | | 11-27 | U | WITHOUT | 95 | 1 × 10¹⁵ | 250 | Ge | 14 | 10 | 1000 | 26 |
| | | 11-28 | U | WITHOUT | 95 | 1 × 10¹⁵ | 250 | Ge | 14 | 10 | 1000 | 26 |
| COMPARATIVE EXAMPLE | | 11-29 | U | WITHOUT | 97.5 | 1 × 10¹⁶ | 250 | NONE | | 10 | 1000 | 17 |
| EXAMPLE OF PRESENT INVENTION | | 11-30 | U | WITHOUT | 97.5 | 1 × 10¹⁶ | 250 | Ge | 14 | 10 | 1000 | 35 |
| | | 11-31 | U | WITHOUT | 97.5 | 1 × 10¹⁶ | 250 | Ge | 14 | 10 | 1000 | 35 |
| | | 11-32 | U | WITHOUT | 97.5 | 1 × 10¹⁶ | 250 | Ge | 14 | 10 | 1000 | 35 |
| | | 11-33 | U | WITHOUT | 97.5 | 1 × 10¹⁶ | 250 | Ge | 14 | 10 | 1000 | 35 |
| | | 11-34 | U | WITHOUT | 97.5 | 1 × 10¹⁶ | 250 | Ge | 14 | 10 | 1000 | 35 |
| | | 11-35 | U | WITHOUT | 97.5 | 1 × 10¹⁶ | 250 | Ge | 14 | 10 | 1000 | 35 |
| COMPARATIVE EXAMPLE | | 11-36 | U | WITH | 95 | 8 × 10¹⁶ | 250 | NONE | | 10 | 1000 | 17 |

TABLE 26-continued

| | | | | | | | | | | |
|---|---|---|---|---|---|---|---|---|---|---|
| EXAMPLE OF PRESENT INVENTION | 11-37 | 95 | WITH | U | 8 × 10¹⁶ | 250 | Ge | 10 | 14 | 1000 | 54 |
| | 11-38 | 95 | WITH | U | 8 × 10¹⁶ | 250 | Ge | 10 | 14 | 1000 | 54 |
| | 11-39 | 95 | WITH | U | 8 × 10¹⁶ | 250 | Ge | 10 | 14 | 1000 | 54 |
| | 11-40 | 95 | WITH | U | 8 × 10¹⁶ | 250 | Ge | 10 | 14 | 1000 | 54 |
| | 11-41 | 95 | WITH | U | 8 × 10¹⁶ | 250 | Ge | 10 | 14 | 1000 | 54 |
| | 11-42 | 95 | WITH | U | 8 × 10¹⁶ | 250 | Ge | 10 | 14 | 1000 | 54 |

| | | FIRST SAMPLE | | SECOND SAMPLE | | | | THIRD SAMPLE | |
|---|---|---|---|---|---|---|---|---|---|
| | CONDITION No. | KEEPING TEMPERATURE (°C) | KEEPING TIME (s) | ACCUMULATION DEGREE OF {222} PLANE (%) | ACCUMULATION DEGREE OF {200} PLANE (%) | ACCUMULATION DEGREE OF {222} PLANE (%) | COOLING RATE (°C/s) | DISTANCE (μm) | ACCUMULATION DEGREE OF {200} PLANE (%) | ACCUMULATION DEGREE OF {222} PLANE (%) |
| COMPARATIVE EXAMPLE | 11-1 | 1050 | 2 | 13 | 13 | 13 | 20 | 50 | 13 | 13 |
| EXAMPLE OF PRESENT INVENTION | 11-2 | 1000 | 2 | 17 | 30 | 10 | 20 | 54 | 30 | 10 |
| | 11-3 | 1050 | 2 | 17 | 32 | 10 | 20 | 54 | 32 | 10 |
| | 11-4 | 1050 | 5 | 17 | 32 | 10 | 20 | 54 | 32 | 10 |
| | 11-5 | 1050 | 30 | 17 | 32 | 10 | 20 | 54 | 32 | 10 |
| | 11-6 | 1050 | 120 | 17 | 32 | 10 | 20 | 54 | 32 | 10 |
| | 11-7 | 1050 | 360 | 17 | 32 | 10 | 20 | 54 | 32 | 10 |
| COMPARATIVE EXAMPLE | 11-8 | 1050 | 2 | 13 | 13 | 13 | 20 | 50 | 13 | 13 |
| EXAMPLE OF PRESENT INVENTION | 11-9 | 1000 | 2 | 9 | 42 | 4.8 | 20 | 54 | 42 | 4.6 |
| | 11-10 | 1050 | 2 | 9 | 55 | 2.6 | 20 | 54 | 55 | 2.6 |
| | 11-11 | 1050 | 5 | 9 | 55 | 2.6 | 20 | 54 | 55 | 2.6 |
| | 11-12 | 1050 | 30 | 9 | 55 | 2.6 | 20 | 54 | 55 | 2.6 |
| | 11-13 | 1050 | 120 | 9 | 55 | 2.6 | 20 | 54 | 55 | 2.6 |
| | 11-14 | 1050 | 350 | 9 | 55 | 2.6 | 20 | 54 | 55 | 2.6 |
| COMPARATIVE EXAMPLE | 11-15 | 1050 | 2 | 13 | 13 | 13 | 20 | 50 | 13 | 13 |
| EXAMPLE OF PRESENT INVENTION | 11-16 | 1000 | 2 | 2.1 | 59 | 2.9 | 20 | 54 | 59 | 2.9 |
| | 11-17 | 1050 | 2 | 2.1 | 74 | 1.5 | 20 | 54 | 74 | 1.5 |
| | 11-18 | 1050 | 5 | 2.1 | 74 | 1.5 | 20 | 54 | 74 | 1.5 |
| | 11-19 | 1050 | 30 | 2.1 | 74 | 1.5 | 20 | 54 | 74 | 1.5 |
| | 11-20 | 1050 | 120 | 2.1 | 74 | 1.5 | 20 | 54 | 74 | 1.5 |
| | 11-21 | 1050 | 360 | 2.1 | 74 | 1.5 | 20 | 54 | 74 | 1.5 |
| COMPARATIVE EXAMPLE | 11-22 | 1050 | 2 | 13 | 13 | 13 | 20 | 125 | 13 | 13 |
| EXAMPLE OF PRESENT INVENTION | 11-23 | 1000 | 2 | 15 | 30 | 11 | 20 | 136 | 30 | 11 |
| | 11-24 | 1100 | 3 | 15 | 31 | 13 | 20 | 136 | 31 | 13 |
| | 11-25 | 1100 | 7 | 15 | 31 | 13 | 20 | 136 | 31 | 13 |
| | 11-26 | 1100 | 35 | 15 | 31 | 13 | 20 | 136 | 31 | 13 |
| | 11-27 | 1100 | 140 | 15 | 31 | 13 | 20 | 136 | 31 | 13 |
| | 11-28 | 1100 | 420 | 15 | 31 | 13 | 20 | 136 | 31 | 13 |
| COMPARATIVE EXAMPLE | 11-29 | 1100 | 2 | 14 | 13 | 13 | 20 | 125 | 13 | 13 |
| EXAMPLE OF PRESENT INVENTION | 11-30 | 1000 | 2 | 8 | 45 | 4.2 | 20 | 136 | 45 | 4.2 |
| | 11-31 | 1100 | 3 | 8 | 52 | 3.2 | 20 | 136 | 52 | 3.2 |
| | 11-32 | 1100 | 7 | 8 | 52 | 3.2 | 20 | 136 | 52 | 3.2 |
| | 11-33 | 1100 | 35 | 8 | 52 | 3.2 | 20 | 136 | 52 | 3.2 |
| | 11-34 | 1100 | 140 | 8 | 52 | 3.2 | 20 | 136 | 52 | 3.2 |

TABLE 26-continued

| | | | | | | | | | |
|---|---|---|---|---|---|---|---|---|---|
| COMPARATIVE EXAMPLE | 11-35 | 8 | 1100 | 420 | 52 | 3.2 | 20 | 136 | 52 | 3.2 |
| | 11-36 | 12 | 1100 | 2 | 13 | 13 | 20 | 125 | 13 | 13 |
| EXAMPLE OF PRESENT INVENTION | 11-37 | 3.4 | 1000 | 2 | 58 | 3 | 20 | 136 | 58 | 3 |
| | 11-38 | 3.4 | 1100 | 3 | 78 | 0.8 | 20 | 136 | 78 | 0.8 |
| | 11-39 | 3.4 | 1100 | 7 | 78 | 0.8 | 20 | 136 | 78 | 0.8 |
| | 11-40 | 3.4 | 1100 | 35 | 78 | 0.8 | 20 | 136 | 78 | 0.8 |
| | 11-41 | 3.4 | 1100 | 140 | 78 | 0.8 | 20 | 136 | 78 | 0.8 |
| | 11-42 | 3.4 | 1100 | 420 | 78 | 0.8 | 20 | 136 | 78 | 0.8 |

Further, an alloying ratio of the metal layer and a ratio of the α single phase region in each of the Fe-based metal plates were measured as in the first experiment. Here, in finding the alloying ratio, a region where the Fe content was 0.5 mass % or less and the content of ferrite former was 99.5 mass % or more was regarded as an alloy layer. Further, a region where the Ga content was 4.1 mass % or more was regarded as the α single phase region, and a ratio of the α single phase region was found from the aforesaid expression (4). Results of these are listed in Table 27.

Further, as in the first experiment, magnetic flux density B50 and saturation magnetic flux density Bs were measured and a ratio B50/Bs of the magnetic flux density B50 to the saturation magnetic flux density Bs was calculated. Further, core loss W10/1 k (W10/1000) at a 1000 Hz frequency when the magnetic flux density was 1.0 T was measured. Results of these are listed in Table 27.

11-35, No. 11-37 to No. 11-42), the accumulation degree of the {200} planes in the α phase was within the ranges of the present invention at the respective stages of the heat treatment. Further, as listed in Table 27, in the examples of the present invention, the alloying ratio and the ratio of the α single phase region were within the desirable ranges of the present invention. As listed in Table 27, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumu-

TABLE 27

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs | W10/1k (W/kg) |
|---|---|---|---|---|---|---|---|---|---|
| COMPARATIVE EXAMPLE | 11-1 | 0 | 0 | 13 | 13 | 1.60 | 2.05 | 0.78 | 93 |
| EXAMPLE OF PRESENT INVENTION | 11-2 | 5 | 0.1 | 30 | 10 | 1.74 | 2.05 | 0.85 | 63 |
| | 11-3 | 82 | 1.5 | 31 | 10 | 1.74 | 2.05 | 0.85 | 57 |
| | 11-4 | 95 | 8.2 | 30 | 10 | 1.74 | 2.05 | 0.85 | 44 |
| | 11-5 | 100 | 35 | 30 | 10 | 1.74 | 2.05 | 0.85 | 37 |
| | 11-6 | 100 | 73 | 30 | 10 | 1.74 | 2.05 | 0.85 | 43 |
| | 11-7 | 100 | 87 | 30 | 10 | 1.74 | 2.05 | 0.85 | 58 |
| COMPARATIVE EXAMPLE | 11-8 | 0 | 0 | 13 | 13 | 1.60 | 2.05 | 0.78 | 92 |
| EXAMPLE OF PRESENT INVENTION | 11-9 | 8 | 0.2 | 42 | 4.8 | 1.78 | 2.05 | 0.87 | 62 |
| | 11-10 | 64 | 2.6 | 53 | 2.7 | 1.85 | 2.05 | 0.90 | 57 |
| | 11-11 | 94 | 7.8 | 53 | 2.7 | 1.87 | 2.05 | 0.91 | 42 |
| | 11-12 | 100 | 42 | 53 | 2.7 | 1.85 | 2.05 | 0.90 | 33 |
| | 11-13 | 100 | 71 | 53 | 2.7 | 1.85 | 2.05 | 0.90 | 38 |
| | 11-14 | 100 | 95 | 53 | 2.7 | 1.87 | 2.05 | 0.91 | 53 |
| COMPARATIVE EXAMPLE | 11-15 | 0 | 0 | 13 | 13 | 1.62 | 2.05 | 0.79 | 92 |
| EXAMPLE OF PRESENT INVENTION | 11-16 | 5 | 0.2 | 59 | 2.9 | 1.87 | 2.05 | 0.91 | 63 |
| | 11-17 | 67 | 1.2 | 75 | 1.3 | 1.95 | 2.05 | 0.95 | 48 |
| | 11-18 | 89 | 5.9 | 75 | 1.4 | 1.93 | 2.05 | 0.94 | 41 |
| | 11-19 | 100 | 37 | 75 | 1.3 | 1.95 | 2.05 | 0.95 | 28 |
| | 11-20 | 100 | 72 | 76 | 1.4 | 1.97 | 2.05 | 0.96 | 33 |
| | 11-21 | 100 | 87 | 75 | 1.7 | 1.95 | 2.05 | 0.95 | 48 |
| COMPARATIVE EXAMPLE | 11-22 | 0 | 0 | 13 | 13 | 1.60 | 2.05 | 0.78 | 101 |
| EXAMPLE OF PRESENT INVENTION | 11-23 | 4 | 0.2 | 30 | 11 | 1.74 | 2.05 | 0.85 | 64 |
| | 11-24 | 57 | 1.2 | 32 | 9 | 1.74 | 2.05 | 0.85 | 56 |
| | 11-25 | 87 | 6.7 | 32 | 9 | 1.74 | 2.05 | 0.85 | 45 |
| | 11-26 | 100 | 45 | 32 | 9 | 1.74 | 2.05 | 0.85 | 37 |
| | 11-27 | 100 | 72 | 32 | 9 | 1.74 | 2.05 | 0.85 | 42 |
| | 11-28 | 100 | 92 | 32 | 9 | 1.74 | 2.05 | 0.85 | 57 |
| COMPARATIVE EXAMPLE | 11-29 | 0 | 0 | 13 | 13 | 1.60 | 2.05 | 0.78 | 97 |
| EXAMPLE OF PRESENT INVENTION | 11-30 | 9 | 0.4 | 45 | 4.2 | 1.80 | 2.05 | 0.88 | 63 |
| | 11-31 | 54 | 1.3 | 56 | 2.1 | 1.87 | 2.05 | 0.91 | 52 |
| | 11-32 | 78 | 6.1 | 56 | 2.1 | 1.85 | 2.05 | 0.90 | 41 |
| | 11-33 | 100 | 38 | 56 | 2.2 | 1.87 | 2.05 | 0.91 | 32 |
| | 11-34 | 100 | 71 | 56 | 2.1 | 1.85 | 2.05 | 0.90 | 38 |
| | 11-35 | 100 | 91 | 56 | 2.2 | 1.87 | 2.05 | 0.91 | 54 |
| COMPARATIVE EXAMPLE | 11-36 | 0 | 0 | 13 | 13 | 1.62 | 2.05 | 0.79 | 100 |
| EXAMPLE OF PRESENT INVENTION | 11-37 | 9 | 0.2 | 58 | 3 | 1.91 | 2.05 | 0.93 | 64 |
| | 11-38 | 70 | 2.3 | 82 | 0.8 | 1.95 | 2.05 | 0.95 | 48 |
| | 11-39 | 91 | 7.1 | 82 | 0.8 | 1.95 | 2.05 | 0.95 | 40 |
| | 11-40 | 100 | 41 | 82 | 0.8 | 1.97 | 2.05 | 0.96 | 26 |
| | 11-41 | 100 | 76 | 82 | 0.8 | 1.95 | 2.05 | 0.95 | 32 |
| | 11-42 | 100 | 100 | 82 | 0.8 | 1.97 | 2.05 | 0.96 | 48 |

As listed in Table 26, in examples of the present invention (conditions No. 11-2 to No. 11-7, No. 11-9 to No. 11-14, No. 11-16 to No. 11-21, No. 11-23 to No. 11-28, No. 11-30 to No. lation degree of the {200} planes was 30% or more, not only the magnetic flux density B50 but also the core loss W10/1 k maintained a higher property level. Further, it could be con-

Twelfth Experiment

In a twelfth experiment, correlations between an accumulation degree of {200} planes and an accumulation degree of {222} planes and core loss in 42 kinds of manufacturing conditions (condition No. 12-1 to condition No. 12-42) were studied.

Base metal plates (silicon steel plates) used in the twelfth experiment contained components of the composition V listed in Table 11 and inevitable impurities, with the balance being Fe. An actually measured value of the A3 point at which the base metal plates used in the twelfth experiment transformed to a γ single phase was 1000° C. The base metal plates were fabricated in the same manner as that in the fourth experiment. In the condition No. 12-1 to the condition No. 12-42, cold rolling was performed in the same manners as those in the condition No. 4-1 to the condition No. 4-42 respectively.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 28.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, it was found that, as rolled, the accumulation degree of the {200} planes in the α phase was within a 17% to 24% range and the accumulation degree of the {222} planes in the α phase was within a 17% to 24% range in each of the base metal plates.

Thereafter, Ge layers as the metal layers were formed on a front surface and a rear surface of each of the base metal plates by a sputtering method, except in the conditions No. 12-1, No. 12-8, No. 12-15, No. 12-22, No. 12-29, and No. 12-36. Thickness of each of the Ga layers (total thickness on the both surfaces) is listed in Table 28.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 28.

TABLE 28

| | | BASE METAL PLATE | | | | METAL LAYER | | HETING | FIRST SAMPLE | |
|---|---|---|---|---|---|---|---|---|---|---|
| | CONDITION No. | COMPOSITION | BLASTING | REDUCTION RATE (%) | DISLOCATION DENSITY (m/m³) | THICKNESS (μm) | ELEMENT | THICKNESS (μm) | RATE (°C./s) | MEASURED TEMPERATURE (°C.) | ACCUMULATION DEGREE OF {200} PLANE (%) |

| | CONDITION No. | COMPOSITION | BLASTING | REDUCTION RATE (%) | DISLOCATION DENSITY (m/m³) | THICKNESS (μm) | ELEMENT | THICKNESS (μm) | RATE (°C./s) | MEASURED TEMPERATURE (°C.) | {200} PLANE (%) |
|---|---|---|---|---|---|---|---|---|---|---|---|
| COMPARATIVE EXAMPLE | 12-1 | V | WITHOUT | 95 | $1 \times 10^{15}$ | 100 | NONE | | 10 | 1000 | 17 |
| EXAMPLE OF PRESENT INVENTION | 12-2 | V | WITHOUT | 95 | $1 \times 10^{15}$ | 100 | Ge | 7 | 10 | 1000 | 26 |
| | 12-3 | V | WITHOUT | 95 | $1 \times 10^{15}$ | 100 | Ge | 7 | 10 | 1000 | 26 |
| | 12-4 | V | WITHOUT | 95 | $1 \times 10^{15}$ | 100 | Ge | 7 | 10 | 1000 | 26 |
| | 12-5 | V | WITHOUT | 95 | $1 \times 10^{15}$ | 100 | Ge | 7 | 10 | 1000 | 26 |
| | 12-6 | V | WITHOUT | 95 | $1 \times 10^{15}$ | 100 | Ge | 7 | 10 | 1000 | 26 |
| | 12-7 | V | WITHOUT | 95 | $1 \times 10^{16}$ | 100 | Ge | 7 | 10 | 1000 | 26 |
| COMPARATIVE EXAMPLE | 12-8 | V | WITHOUT | 97.5 | $1 \times 10^{16}$ | 100 | NONE | | 10 | 1000 | 18 |
| EXAMPLE OF PRESENT INVENTION | 12-9 | V | WITHOUT | 97.5 | $1 \times 10^{16}$ | 100 | Ge | 7 | 10 | 1000 | 39 |
| | 12-10 | V | WITHOUT | 97.5 | $1 \times 10^{16}$ | 100 | Ge | 7 | 10 | 1000 | 39 |
| | 12-11 | V | WITHOUT | 97.5 | $1 \times 10^{16}$ | 100 | Ge | 7 | 10 | 1000 | 39 |
| | 12-12 | V | WITHOUT | 97.5 | $1 \times 10^{16}$ | 100 | Ge | 7 | 10 | 1000 | 39 |
| | 12-13 | V | WITHOUT | 97.5 | $1 \times 10^{16}$ | 100 | Ge | 7 | 10 | 1000 | 39 |
| | 12-14 | V | WITHOUT | 97.5 | $1 \times 10^{16}$ | 100 | Ge | 7 | 10 | 1000 | 39 |
| COMPARATIVE EXAMPLE | 12-15 | V | WITH | 95 | $8 \times 10^{16}$ | 100 | NONE | | 10 | 1000 | 17 |
| EXAMPLE OF PRESENT INVENTION | 12-16 | V | WITH | 95 | $8 \times 10^{16}$ | 100 | Ge | 7 | 10 | 1000 | 58 |
| | 12-17 | V | WITH | 95 | $8 \times 10^{16}$ | 100 | Ge | 7 | 10 | 1000 | 58 |
| | 12-18 | V | WITH | 95 | $8 \times 10^{16}$ | 100 | Ge | 7 | 10 | 1000 | 58 |
| | 12-19 | V | WITH | 95 | $8 \times 10^{16}$ | 100 | Ge | 7 | 10 | 1000 | 58 |
| | 12-20 | V | WITH | 95 | $8 \times 10^{16}$ | 100 | Ge | 7 | 10 | 1000 | 58 |
| | 12-21 | V | WITH | 95 | $8 \times 10^{16}$ | 100 | Ge | 7 | 10 | 1000 | 58 |
| COMPARATIVE EXAMPLE | 12-22 | V | WITHOUT | 95 | $1 \times 10^{15}$ | 250 | NONE | | 10 | 1000 | 17 |
| EXAMPLE OF PRESENT INVENTION | 12-23 | V | WITHOUT | 95 | $1 \times 10^{15}$ | 250 | Ge | 17 | 10 | 1000 | 27 |
| | 12-24 | V | WITHOUT | 95 | $1 \times 10^{15}$ | 250 | Ge | 17 | 10 | 1000 | 27 |
| | 12-25 | V | WITHOUT | 95 | $1 \times 10^{15}$ | 250 | Ge | 17 | 10 | 1000 | 27 |
| | 12-26 | V | WITHOUT | 95 | $1 \times 10^{15}$ | 250 | Ge | 17 | 10 | 1000 | 27 |
| | 12-27 | V | WITHOUT | 95 | $1 \times 10^{15}$ | 250 | Ge | 17 | 10 | 1000 | 27 |
| | 12-28 | V | WITHOUT | 95 | $1 \times 10^{15}$ | 250 | Ge | 17 | 10 | 1000 | 27 |
| COMPARATIVE EXAMPLE | 12-29 | V | WITHOUT | 97.5 | $1 \times 10^{16}$ | 250 | NONE | | 10 | 1000 | 16 |
| EXAMPLE OF PRESENT INVENTION | 12-30 | V | WITHOUT | 97.5 | $1 \times 10^{16}$ | 250 | Ge | 17 | 10 | 1000 | 42 |
| | 12-31 | V | WITHOUT | 97.5 | $1 \times 10^{16}$ | 250 | Ge | 17 | 10 | 1000 | 42 |
| | 12-32 | V | WITHOUT | 97.5 | $1 \times 10^{16}$ | 250 | Ge | 17 | 10 | 1000 | 42 |
| | 12-33 | V | WITHOUT | 97.5 | $1 \times 10^{16}$ | 250 | Ge | 17 | 10 | 1000 | 42 |
| | 12-34 | V | WITHOUT | 97.5 | $1 \times 10^{16}$ | 250 | Ge | 17 | 10 | 1000 | 42 |
| | 12-35 | V | WITHOUT | 97.5 | $1 \times 10^{16}$ | 250 | Ge | 17 | 10 | 1000 | 42 |
| COMPARATIVE EXAMPLE | 12-36 | V | WITH | 95 | $8 \times 10^{16}$ | 250 | NONE | | 10 | 1000 | 17 |

TABLE 28-continued

| | | | | | | | FIRST SAMPLE | SECOND SAMPLE | | | | | | THIRD SAMPLE | |
|---|---|---|---|---|---|---|---|---|---|---|---|---|---|---|---|
| | CONDITION No. | | | | | | ACCUMULATION DEGREE OF {222} PLANE (%) | KEEPING TEMPERATURE (°C.) | KEEPING TIME (s) | ACCUMULATION DEGREE OF {200} PLANE (%) | ACCUMULATION DEGREE OF {222} PLANE (%) | COOLING RATE (°C./s) | DISTANCE (μm) | ACCUMULATION DEGREE OF {200} PLANE (%) | ACCUMULATION DEGREE OF {222} PLANE (%) |
| EXAMPLE OF PRESENT INVENTION | 12-37 | V | WITH | 95 | 8 × 10¹⁶ | 250 | Ge | | | | | 17 | 10 | 1000 | 50 |
| EXAMPLE OF PRESENT INVENTION | 12-38 | V | WITH | 95 | 8 × 10¹⁶ | 250 | Ge | | | | | 17 | 10 | 1000 | 50 |
| EXAMPLE OF PRESENT INVENTION | 12-39 | V | WITH | 95 | 8 × 10¹⁶ | 250 | Ge | | | | | 17 | 10 | 1000 | 50 |
| EXAMPLE OF PRESENT INVENTION | 12-40 | V | WITH | 95 | 8 × 10¹⁶ | 250 | Ge | | | | | 17 | 10 | 1000 | 50 |
| EXAMPLE OF PRESENT INVENTION | 12-41 | V | WITH | 95 | 8 × 10¹⁶ | 250 | Ge | | | | | 17 | 10 | 1000 | 50 |
| EXAMPLE OF PRESENT INVENTION | 12-42 | V | WITH | 95 | 8 × 10¹⁶ | 250 | Ge | | | | | 17 | 10 | 1000 | 50 |
| COMPARATIVE EXAMPLE | 12-1 | | | | | | | 13 | 1100 | 2 | 13 | 13 | 15 | 50 | 13 | 13 |
| EXAMPLE OF PRESENT INVENTION | 12-2 | | | | | | | 16 | 1000 | 2 | 30 | 11 | 15 | 54 | 30 | 11 |
| EXAMPLE OF PRESENT INVENTION | 12-3 | | | | | | | 16 | 1100 | 2 | 30 | 12 | 15 | 54 | 30 | 12 |
| EXAMPLE OF PRESENT INVENTION | 12-4 | | | | | | | 16 | 1100 | 5 | 30 | 12 | 15 | 54 | 30 | 12 |
| EXAMPLE OF PRESENT INVENTION | 12-5 | | | | | | | 16 | 1100 | 30 | 30 | 12 | 15 | 54 | 30 | 12 |
| EXAMPLE OF PRESENT INVENTION | 12-6 | | | | | | | 16 | 1100 | 120 | 30 | 12 | 15 | 54 | 30 | 12 |
| EXAMPLE OF PRESENT INVENTION | 12-7 | | | | | | | 16 | 1100 | 360 | 30 | 12 | 15 | 54 | 30 | 12 |
| COMPARATIVE EXAMPLE | 12-8 | | | | | | | 13 | 1100 | 2 | 13 | 13 | 15 | 50 | 13 | 13 |
| EXAMPLE OF PRESENT INVENTION | 12-9 | | | | | | | 10 | 1000 | 2 | 42 | 4.9 | 15 | 54 | 42 | 4.9 |
| EXAMPLE OF PRESENT INVENTION | 12-10 | | | | | | | 10 | 1100 | 2 | 55 | 2.8 | 15 | 54 | 55 | 2.8 |
| EXAMPLE OF PRESENT INVENTION | 12-11 | | | | | | | 10 | 1100 | 5 | 55 | 2.8 | 15 | 54 | 55 | 2.8 |
| EXAMPLE OF PRESENT INVENTION | 12-12 | | | | | | | 10 | 1100 | 30 | 55 | 2.8 | 15 | 54 | 55 | 2.8 |
| EXAMPLE OF PRESENT INVENTION | 12-13 | | | | | | | 10 | 1100 | 120 | 55 | 2.8 | 15 | 54 | 55 | 2.8 |
| EXAMPLE OF PRESENT INVENTION | 12-14 | | | | | | | 10 | 1100 | 360 | 55 | 2.8 | 15 | 54 | 55 | 2.8 |
| COMPARATIVE EXAMPLE | 12-15 | | | | | | | 14 | 1100 | 2 | 13 | 13 | 15 | 50 | 13 | 13 |
| EXAMPLE OF PRESENT INVENTION | 12-16 | | | | | | | 3.2 | 1000 | 2 | 61 | 2.4 | 15 | 54 | 61 | 2.4 |
| EXAMPLE OF PRESENT INVENTION | 12-17 | | | | | | | 3.2 | 1100 | 2 | 77 | 1.3 | 15 | 54 | 77 | 1.3 |
| EXAMPLE OF PRESENT INVENTION | 12-18 | | | | | | | 3.2 | 1100 | 5 | 77 | 1.3 | 15 | 54 | 77 | 1.3 |
| EXAMPLE OF PRESENT INVENTION | 12-19 | | | | | | | 3.2 | 1100 | 30 | 77 | 1.3 | 15 | 54 | 77 | 1.3 |
| EXAMPLE OF PRESENT INVENTION | 12-20 | | | | | | | 3.2 | 1100 | 120 | 77 | 1.3 | 15 | 54 | 77 | 1.3 |
| EXAMPLE OF PRESENT INVENTION | 12-21 | | | | | | | 3.2 | 1100 | 360 | 77 | 1.3 | 15 | 54 | 77 | 1.3 |
| COMPARATIVE EXAMPLE | 12-22 | | | | | | | 13 | 1150 | 2 | 13 | 13 | 15 | 125 | 13 | 13 |
| EXAMPLE OF PRESENT INVENTION | 12-23 | | | | | | | 17 | 1000 | 2 | 30 | 10 | 15 | 136 | 30 | 10 |
| EXAMPLE OF PRESENT INVENTION | 12-24 | | | | | | | 17 | 1150 | 3 | 32 | 14 | 15 | 136 | 32 | 14 |
| EXAMPLE OF PRESENT INVENTION | 12-25 | | | | | | | 17 | 1150 | 7 | 32 | 14 | 15 | 136 | 32 | 14 |
| EXAMPLE OF PRESENT INVENTION | 12-26 | | | | | | | 17 | 1150 | 35 | 32 | 14 | 15 | 136 | 32 | 14 |
| EXAMPLE OF PRESENT INVENTION | 12-27 | | | | | | | 17 | 1150 | 140 | 32 | 14 | 15 | 136 | 32 | 14 |
| EXAMPLE OF PRESENT INVENTION | 12-28 | | | | | | | 17 | 1150 | 420 | 32 | 14 | 15 | 136 | 32 | 14 |
| COMPARATIVE EXAMPLE | 12-29 | | | | | | | 14 | 1150 | 2 | 13 | 13 | 15 | 125 | 13 | 13 |
| EXAMPLE OF PRESENT INVENTION | 12-30 | | | | | | | 4 | 1000 | 2 | 43 | 4.9 | 15 | 136 | 43 | 4.9 |
| EXAMPLE OF PRESENT INVENTION | 12-31 | | | | | | | 4 | 1150 | 3 | 59 | 1.8 | 15 | 136 | 59 | 1.8 |
| EXAMPLE OF PRESENT INVENTION | 12-32 | | | | | | | 4 | 1150 | 7 | 59 | 1.8 | 15 | 136 | 59 | 1.8 |
| EXAMPLE OF PRESENT INVENTION | 12-33 | | | | | | | 4 | 1150 | 35 | 59 | 1.6 | 15 | 136 | 59 | 1.6 |
| EXAMPLE OF PRESENT INVENTION | 12-34 | | | | | | | 4 | 1150 | 140 | 59 | 1.8 | 15 | 136 | 59 | 1.8 |

TABLE 28-continued

| | | | | | | | | | |
|---|---|---|---|---|---|---|---|---|---|
| COMPARATIVE EXAMPLE | 12-35 | 4 | 1150 | 420 | 59 | 1.8 | 15 | 136 | 59 | 1.8 |
| | 12-36 | 13 | 1150 | 2 | 13 | 13 | 15 | 125 | 13 | 13 |
| EXAMPLE OF PRESENT INVENTION | 12-37 | 3.4 | 1000 | 2 | 58 | 2.8 | 15 | 136 | 58 | 2.8 |
| | 12-38 | 3.4 | 1150 | 3 | 79 | 0.8 | 15 | 136 | 79 | 0.8 |
| | 12-39 | 3.4 | 1150 | 7 | 79 | 0.8 | 15 | 136 | 79 | 0.8 |
| | 12-40 | 3.4 | 1150 | 35 | 79 | 0.8 | 15 | 136 | 79 | 0.8 |
| | 12-41 | 3.4 | 1150 | 140 | 79 | 0.8 | 15 | 136 | 79 | 0.8 |
| | 12-42 | 3.4 | 1150 | 420 | 79 | 0.8 | 15 | 136 | 70 | 0.8 |

Further, an alloying ratio of the metal layer and a ratio of an α single phase region in each of the Fe-based metal plates were measured as in the first experiment. Here, in finding the alloying ratio, a region where the Fe content was 0.5 mass % or less and the content of ferrite former was 99.5 mass % or more was regarded as an alloy layer. Further, a region where the Ge content was 6.4 mass % or more was regarded as the α single phase region, and a ratio of the α single phase region was found from the aforesaid expression (4). Results of these are listed in Table 29.

Further, as in the first experiment, magnetic flux density B50 and saturation magnetic flux density Bs were measured and a ratio B50/Bs of the magnetic flux density B50 to the saturation magnetic flux density Bs was calculated. Further, core loss W10/1 k (W10/1000) at a 1000 Hz frequency when the magnetic flux density was 1.0 T was measured. Results of these are listed in Table 29.

the {200} planes in the α phase was within the ranges of the present invention at the respective stages of the heat treatment. Further, as listed in Table 29, in the examples of the present invention, the alloying ratio and the ratio of the α single phase region were within the desirable ranges of the present invention. As listed in Table 29, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumulation degree of the {200} planes was 30% or more, not only the magnetic flux density B50 but also the core loss W10/1 k

TABLE 29

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs | W10/1k (W/kg) |
|---|---|---|---|---|---|---|---|---|---|
| COMPARATIVE EXAMPLE | 12-1 | 0 | 0 | 13 | 13 | 1.60 | 2.05 | 0.78 | 94 |
| EXAMPLE OF PRESENT INVENTION | 12-2 | 5 | 0.1 | 30 | 11 | 1.74 | 2.05 | 0.85 | 64 |
| | 12-3 | 82 | 1.5 | 31 | 10 | 1.74 | 2.05 | 0.85 | 57 |
| | 12-4 | 95 | 8.2 | 30 | 10 | 1.74 | 2.05 | 0.85 | 44 |
| | 12-5 | 100 | 35 | 30 | 10 | 1.74 | 2.05 | 0.85 | 37 |
| | 12-6 | 100 | 73 | 30 | 10 | 1.74 | 2.05 | 0.85 | 43 |
| | 12-7 | 100 | 87 | 30 | 10 | 1.74 | 2.05 | 0.85 | 58 |
| COMPARATIVE EXAMPLE | 12-8 | 0 | 0 | 13 | 13 | 1.60 | 2.05 | 0.78 | 93 |
| EXAMPLE OF PRESENT INVENTION | 12-9 | 7 | 0.2 | 42 | 4.9 | 1.82 | 2.05 | 0.89 | 62 |
| | 12-10 | 75 | 2.6 | 53 | 2.7 | 1.85 | 2.05 | 0.90 | 57 |
| | 12-11 | 94 | 7.8 | 53 | 2.7 | 1.87 | 2.05 | 0.91 | 42 |
| | 12-12 | 100 | 42 | 53 | 2.7 | 1.85 | 2.05 | 0.90 | 33 |
| | 12-13 | 100 | 71 | 53 | 2.7 | 1.85 | 2.05 | 0.90 | 38 |
| | 12-14 | 100 | 95 | 53 | 2.7 | 1.87 | 2.05 | 0.91 | 53 |
| COMPARATIVE EXAMPLE | 12-15 | 0 | 0 | 13 | 13 | 1.62 | 2.05 | 0.79 | 95 |
| EXAMPLE OF PRESENT INVENTION | 12-16 | 7 | 0.2 | 61 | 2.4 | 1.91 | 2.05 | 0.93 | 61 |
| | 12-17 | 67 | 1.2 | 75 | 1.3 | 1.95 | 2.05 | 0.95 | 48 |
| | 12-18 | 89 | 5.9 | 75 | 1.4 | 1.93 | 2.05 | 0.94 | 41 |
| | 12-19 | 100 | 37 | 75 | 1.3 | 1.95 | 2.05 | 0.95 | 28 |
| | 12-20 | 100 | 72 | 76 | 1.4 | 1.97 | 2.05 | 0.96 | 33 |
| | 12-21 | 100 | 87 | 75 | 1.7 | 1.95 | 2.05 | 0.95 | 48 |
| COMPARATIVE EXAMPLE | 12-22 | 0 | 0 | 13 | 13 | 1.60 | 2.05 | 0.78 | 98 |
| EXAMPLE OF PRESENT INVENTION | 12-23 | 10 | 0.3 | 30 | 10 | 1.74 | 2.05 | 0.85 | 64 |
| | 12-24 | 57 | 1.2 | 32 | 9 | 1.74 | 2.05 | 0.85 | 56 |
| | 12-25 | 87 | 6.7 | 32 | 9 | 1.74 | 2.05 | 0.85 | 45 |
| | 12-26 | 100 | 45 | 32 | 9 | 1.74 | 2.05 | 0.85 | 37 |
| | 12-27 | 100 | 72 | 32 | 9 | 1.74 | 2.05 | 0.85 | 42 |
| | 12-28 | 100 | 92 | 32 | 9 | 1.74 | 2.05 | 0.85 | 57 |
| COMPARATIVE EXAMPLE | 12-29 | 0 | 0 | 13 | 13 | 1.60 | 2.05 | 0.78 | 104 |
| EXAMPLE OF PRESENT INVENTION | 12-30 | 5 | 0.1 | 43 | 4.9 | 1.78 | 2.05 | 0.87 | 63 |
| | 12-31 | 54 | 1.3 | 56 | 2.1 | 1.87 | 2.05 | 0.91 | 52 |
| | 12-32 | 78 | 6.1 | 56 | 2.1 | 1.85 | 2.05 | 0.90 | 41 |
| | 12-33 | 100 | 38 | 56 | 2.2 | 1.87 | 2.05 | 0.91 | 32 |
| | 12-34 | 100 | 71 | 56 | 2.1 | 1.85 | 2.05 | 0.90 | 38 |
| | 12-35 | 100 | 91 | 56 | 2.2 | 1.87 | 2.05 | 0.91 | 54 |
| COMPARATIVE EXAMPLE | 12-36 | 0 | 0 | 13 | 13 | 1.62 | 2.05 | 0.79 | 98 |
| EXAMPLE OF PRESENT INVENTION | 12-37 | 6 | 0.3 | 58 | 2.8 | 1.89 | 2.05 | 0.92 | 63 |
| | 12-38 | 70 | 2.3 | 82 | 0.8 | 1.95 | 2.05 | 0.95 | 46 |
| | 12-39 | 91 | 7.1 | 82 | 0.8 | 1.95 | 2.05 | 0.95 | 40 |
| | 12-40 | 100 | 41 | 82 | 0.8 | 1.97 | 2.05 | 0.96 | 26 |
| | 12-41 | 100 | 76 | 82 | 0.8 | 1.95 | 2.05 | 0.95 | 32 |
| | 12-42 | 100 | 100 | 82 | 0.8 | 1.97 | 2.05 | 0.96 | 48 |

As listed in Table 28, in examples of the present invention (conditions No. 12-2 to No. 12-7, No. 12-9 to No. 12-14, No. 12-16 to No. 12-21, No. 12-23 to No. 12-28, No. 12-30 to No. 12-35, No. 12-37 to No. 12-42), the accumulation degree of maintained a higher property level. Further, it could be confirmed that the core loss W10/1 k has a still better property level when the ratio of the α single phase region is not less than 5% nor more than 80%.

Thirteenth Experiment

In a thirteenth experiment, correlations between an accumulation degree of {200} planes and an accumulation degree of {222} planes and core loss in 42 kinds of manufacturing conditions (condition No. 13-1 to condition No. 13-42) were studied.

Base metal plates (silicon steel plates) used in the thirteenth experiment contained components of the composition W listed in Table 11 and inevitable impurities, with the balance being Fe. An actually measured value of the A3 point at which the base metal plates used in the thirteenth experiment transformed to a γ single phase was 1010° C. The base metal plates were fabricated in the same manner as that in the fourth experiment. In the condition No. 13-1 to the condition No. 13-42, cold rolling was performed in the same manners as those in the condition No. 4-1 to the condition No. 4-42 respectively.

Next, dislocation density of each of the base metal plates was measured with a transmission electron microscope as in the first experiment. Here, in each of the base metal plates having undergone the blasting, since a texture with high dislocation density was observed in a region 30 μm from the surface, dislocation density in this region was measured. Average values of the obtained dislocation densities are listed in Table 30.

Textures of the base metal plates at room temperature were observed, and it was found that their main phase was an α phase. Further, the accumulation degree of the {200} planes in the α phase and the accumulation degree of the {222} planes in the α phase were measured by the aforesaid method, it was found that, as rolled, the accumulation degree of the {200} planes in the α phase was within a 17% to 24% range and the accumulation degree of the {222} planes in the α phase was within a 17% to 24% range in each of the base metal plates.

Thereafter, W layers as the metal layers were formed on a front surface and a rear surface of each of the base metal plates by a sputtering method, except in the conditions No. 13-1, No. 13-8, No. 13-15, No. 13-22, No. 13-29, and No. 13-36. Thickness of each of the W layers (total thickness on the both surfaces) is listed in Table 30.

Subsequently, heat treatment was applied on the base metal plates on which the metal layers were formed, under various conditions as in the first experiment. Further, three samples were prepared per condition and the accumulation degree of the {200} planes in the α phase and the accumulation degree of the {222} planes in the α phase were measured at three stages of the heat treatment, as in the first experiment. Results of these are listed in Table 30.

TABLE 30

| | CONDITION No. | BASE METAL PLATE COMPOSITION | BLASTING | REDUCTION RATE (%) | DISLOCATION DENSITY (m/m³) | THICKNESS (μm) | METAL LAYER ELEMENT | THICKNESS (μm) | HEATING RATE (°C/s) | FIRST SAMPLE MEASURED TEMPERATURE (°C) | ACCUMULATION DEGREE OF {200} PLANE (%) |
|---|---|---|---|---|---|---|---|---|---|---|---|
| COMPARATIVE EXAMPLE | 13-1 | W | WITHOUT | 95 | $1 \times 10^{15}$ | 100 | NONE | | 5 | 1010 | 16 |
| EXAMPLE OF PRESENT INVENTION | 13-2 | W | WITHOUT | 95 | $1 \times 10^{15}$ | 100 | W | 1.2 | 5 | 1010 | 27 |
| | 13-3 | W | WITHOUT | 95 | $1 \times 10^{15}$ | 100 | W | 1.2 | 5 | 1010 | 27 |
| | 13-4 | W | WITHOUT | 95 | $1 \times 10^{15}$ | 100 | W | 1.2 | 5 | 1010 | 27 |
| | 13-5 | W | WITHOUT | 95 | $1 \times 10^{15}$ | 100 | W | 1.2 | 5 | 1010 | 27 |
| | 13-6 | W | WITHOUT | 95 | $1 \times 10^{15}$ | 100 | W | 1.2 | 5 | 1010 | 27 |
| | 13-7 | W | WITHOUT | 95 | $1 \times 10^{15}$ | 100 | W | 1.2 | 5 | 1010 | 27 |
| COMPARATIVE EXAMPLE | 13-8 | W | WITHOUT | 97.5 | $1 \times 10^{15}$ | 100 | NONE | | 5 | 1010 | 15 |
| EXAMPLE OF PRESENT INVENTION | 13-9 | W | WITHOUT | 97.5 | $1 \times 10^{15}$ | 100 | W | 1.2 | 5 | 1010 | 41 |
| | 13-10 | W | WITHOUT | 97.5 | $1 \times 10^{15}$ | 100 | W | 1.2 | 5 | 1010 | 41 |
| | 13-11 | W | WITHOUT | 97.5 | $1 \times 10^{15}$ | 100 | W | 1.2 | 5 | 1010 | 41 |
| | 13-12 | W | WITHOUT | 97.5 | $1 \times 10^{15}$ | 100 | W | 1.2 | 5 | 1010 | 41 |
| | 13-13 | W | WITHOUT | 97.5 | $1 \times 10^{15}$ | 100 | W | 1.2 | 5 | 1010 | 41 |
| | 13-14 | W | WITHOUT | 97.5 | $1 \times 10^{15}$ | 100 | W | 1.2 | 5 | 1010 | 41 |
| COMPARATIVE EXAMPLE | 13-15 | W | WITH | 95 | $8 \times 10^{16}$ | 100 | NONE | | 5 | 1010 | 15 |
| EXAMPLE OF PRESENT INVENTION | 13-16 | W | WITH | 95 | $8 \times 10^{16}$ | 100 | W | 1.2 | 5 | 1010 | 61 |
| | 13-17 | W | WITH | 95 | $8 \times 10^{16}$ | 100 | W | 1.2 | 5 | 1010 | 61 |
| | 13-18 | W | WITH | 95 | $8 \times 10^{16}$ | 100 | W | 1.2 | 5 | 1010 | 61 |
| | 13-19 | W | WITH | 95 | $8 \times 10^{16}$ | 100 | W | 1.2 | 5 | 1010 | 61 |
| | 13-20 | W | WITH | 95 | $8 \times 10^{16}$ | 100 | W | 1.2 | 5 | 1010 | 61 |
| | 13-21 | W | WITH | 95 | $8 \times 10^{16}$ | 100 | W | 1.2 | 5 | 1010 | 61 |
| COMPARATIVE EXAMPLE | 13-22 | W | WITHOUT | 95 | $1 \times 10^{15}$ | 250 | NONE | | 5 | 1010 | 15 |
| EXAMPLE OF PRESENT INVENTION | 13-23 | W | WITHOUT | 95 | $1 \times 10^{15}$ | 250 | W | 3 | 5 | 1010 | 26 |
| | 13-24 | W | WITHOUT | 95 | $1 \times 10^{15}$ | 250 | W | 3 | 5 | 1010 | 26 |
| | 13-25 | W | WITHOUT | 95 | $1 \times 10^{15}$ | 250 | W | 3 | 5 | 1010 | 26 |
| | 13-26 | W | WITHOUT | 95 | $1 \times 10^{15}$ | 250 | W | 3 | 5 | 1010 | 26 |
| | 13-27 | W | WITHOUT | 95 | $1 \times 10^{15}$ | 250 | W | 3 | 5 | 1010 | 26 |
| | 13-28 | W | WITHOUT | 95 | $1 \times 10^{15}$ | 250 | W | 3 | 5 | 1010 | 26 |
| COMPARATIVE EXAMPLE | 13-29 | W | WITHOUT | 97.5 | $1 \times 10^{15}$ | 250 | NONE | | 5 | 1010 | 15 |
| EXAMPLE OF PRESENT INVENTION | 13-30 | W | WITHOUT | 97.5 | $1 \times 10^{15}$ | 250 | W | 3 | 5 | 1010 | 37 |
| | 13-31 | W | WITHOUT | 97.5 | $1 \times 10^{15}$ | 250 | W | 3 | 5 | 1010 | 37 |
| | 13-32 | W | WITHOUT | 97.5 | $1 \times 10^{15}$ | 250 | W | 3 | 5 | 1010 | 37 |
| | 13-33 | W | WITHOUT | 97.5 | $1 \times 10^{15}$ | 250 | W | 3 | 5 | 1010 | 37 |
| | 13-34 | W | WITHOUT | 97.5 | $1 \times 10^{15}$ | 250 | W | 3 | 5 | 1010 | 37 |
| | 13-35 | W | WITHOUT | 97.5 | $1 \times 10^{15}$ | 250 | W | 3 | 5 | 1010 | 37 |
| COMPARATIVE EXAMPLE | 13-36 | W | WITH | 95 | $8 \times 10^{16}$ | 250 | NONE | | 5 | 1010 | 15 |

TABLE 30-continued

| | CONDITION No. | FIRST SAMPLE ACCUMULATION DEGREE OF {222} PLANE (%) | KEEPING TEMPERATURE (°C.) | KEEPING TIME (s) | SECOND SAMPLE ACCUMULATION DEGREE OF {200} PLANE (%) | ACCUMULATION DEGREE OF {222} PLANE (%) | | | COOLING RATE (°C./s) | DISTANCE (µm) | THIRD SAMPLE ACCUMULATION DEGREE OF {200} PLANE (%) | ACCUMULATION DEGREE OF {222} PLANE (%) |
|---|---|---|---|---|---|---|---|---|---|---|---|---|
| EXAMPLE OF PRESENT INVENTION | 13-37 | W | WITH | 95 | $8 \times 10^{16}$ | 250 | W | 3 | 5 | 1010 | 58 |
| EXAMPLE OF PRESENT INVENTION | 13-38 | W | WITH | 95 | $8 \times 10^{16}$ | 250 | W | 3 | 5 | 1010 | 58 |
| EXAMPLE OF PRESENT INVENTION | 13-39 | W | WITH | 95 | $8 \times 10^{16}$ | 250 | W | 3 | 5 | 1010 | 58 |
| EXAMPLE OF PRESENT INVENTION | 13-40 | W | WITH | 95 | $8 \times 10^{16}$ | 250 | W | 3 | 5 | 1010 | 58 |
| EXAMPLE OF PRESENT INVENTION | 13-41 | W | WITH | 95 | $8 \times 10^{16}$ | 250 | W | 3 | 5 | 1010 | 58 |
| EXAMPLE OF PRESENT INVENTION | 13-42 | W | WITH | 95 | $8 \times 10^{16}$ | 250 | W | 3 | 5 | 1010 | 58 |
| COMPARATIVE EXAMPLE | 13-1 | 14 | 1150 | 2 | 13 | 13 | | 3 | 50 | 13 | 13 |
| EXAMPLE OF PRESENT INVENTION | 13-2 | 12 | 1010 | 2 | 30 | 11 | | 3 | 54 | 30 | 11 |
| EXAMPLE OF PRESENT INVENTION | 13-3 | 12 | 1150 | 2 | 36 | 8 | | 3 | 54 | 36 | 8 |
| EXAMPLE OF PRESENT INVENTION | 13-4 | 12 | 1150 | 5 | 36 | 8 | | 3 | 54 | 36 | 8 |
| EXAMPLE OF PRESENT INVENTION | 13-5 | 12 | 1150 | 30 | 36 | 8 | | 3 | 54 | 36 | 8 |
| EXAMPLE OF PRESENT INVENTION | 13-6 | 12 | 1150 | 120 | 36 | 8 | | 3 | 54 | 36 | 8 |
| EXAMPLE OF PRESENT INVENTION | 13-7 | 12 | 1150 | 360 | 36 | 8 | | 3 | 54 | 36 | 8 |
| COMPARATIVE EXAMPLE | 13-8 | 13 | 1150 | 2 | 13 | 13 | | 3 | 50 | 13 | 13 |
| EXAMPLE OF PRESENT INVENTION | 13-9 | 8 | 1010 | 2 | 43 | 5.9 | | 3 | 54 | 43 | 5.9 |
| EXAMPLE OF PRESENT INVENTION | 13-10 | 8 | 1150 | 2 | 57 | 2.1 | | 3 | 54 | 57 | 2.1 |
| EXAMPLE OF PRESENT INVENTION | 13-11 | 8 | 1150 | 5 | 57 | 2.1 | | 3 | 54 | 57 | 2.1 |
| EXAMPLE OF PRESENT INVENTION | 13-12 | 8 | 1150 | 30 | 57 | 2.1 | | 3 | 54 | 57 | 2.1 |
| EXAMPLE OF PRESENT INVENTION | 13-13 | 8 | 1150 | 120 | 57 | 2.1 | | 3 | 54 | 57 | 2.1 |
| EXAMPLE OF PRESENT INVENTION | 13-14 | 8 | 1150 | 360 | 57 | 2.1 | | 3 | 54 | 57 | 2.1 |
| COMPARATIVE EXAMPLE | 13-15 | 13 | 1150 | 2 | 13 | 13 | | 3 | 50 | 13 | 13 |
| EXAMPLE OF PRESENT INVENTION | 13-16 | 2.8 | 1010 | 2 | 63 | 2 | | 3 | 54 | 63 | 2 |
| EXAMPLE OF PRESENT INVENTION | 13-17 | 2.8 | 1150 | 2 | 83 | 0.9 | | 3 | 54 | 83 | 0.9 |
| EXAMPLE OF PRESENT INVENTION | 13-18 | 2.8 | 1150 | 5 | 83 | 0.9 | | 3 | 54 | 83 | 0.9 |
| EXAMPLE OF PRESENT INVENTION | 13-19 | 2.8 | 1150 | 30 | 83 | 0.9 | | 3 | 54 | 83 | 0.9 |
| EXAMPLE OF PRESENT INVENTION | 13-20 | 2.8 | 1150 | 120 | 83 | 0.9 | | 3 | 54 | 83 | 0.9 |
| EXAMPLE OF PRESENT INVENTION | 13-21 | 2.8 | 1150 | 360 | 83 | 0.9 | | 3 | 54 | 83 | 0.9 |
| COMPARATIVE EXAMPLE | 13-22 | 13 | 1200 | 2 | 13 | 13 | | 3 | 125 | 13 | 13 |
| EXAMPLE OF PRESENT INVENTION | 13-23 | 13 | 1010 | 2 | 30 | 11 | | 3 | 136 | 30 | 11 |
| EXAMPLE OF PRESENT INVENTION | 13-24 | 13 | 1200 | 3 | 34 | 10 | | 3 | 136 | 34 | 10 |
| EXAMPLE OF PRESENT INVENTION | 13-25 | 13 | 1200 | 7 | 34 | 10 | | 3 | 136 | 34 | 10 |
| EXAMPLE OF PRESENT INVENTION | 13-26 | 13 | 1200 | 35 | 34 | 10 | | 3 | 136 | 34 | 10 |
| EXAMPLE OF PRESENT INVENTION | 13-27 | 13 | 1200 | 140 | 34 | 10 | | 3 | 136 | 34 | 10 |
| EXAMPLE OF PRESENT INVENTION | 13-28 | 13 | 1200 | 420 | 34 | 10 | | 3 | 136 | 34 | 10 |
| COMPARATIVE EXAMPLE | 13-29 | 14 | 1200 | 2 | 13 | 13 | | 3 | 125 | 13 | 13 |
| EXAMPLE OF PRESENT INVENTION | 13-30 | 10 | 1000 | 2 | 41 | 5.3 | | 3 | 136 | 41 | 5.3 |
| EXAMPLE OF PRESENT INVENTION | 13-31 | 10 | 1200 | 3 | 55 | 2.5 | | 3 | 136 | 55 | 2.8 |
| EXAMPLE OF PRESENT INVENTION | 13-32 | 10 | 1200 | 7 | 55 | 2.8 | | 3 | 136 | 55 | 2.8 |
| EXAMPLE OF PRESENT INVENTION | 13-33 | 10 | 1200 | 35 | 55 | 2.8 | | 3 | 136 | 55 | 2.8 |
| EXAMPLE OF PRESENT INVENTION | 13-34 | 10 | 1200 | 140 | 55 | 2.8 | | 3 | 136 | 55 | 2.8 |

TABLE 30-continued

| | | | | | | | | | |
|---|---|---|---|---|---|---|---|---|---|
| COMPARATIVE EXAMPLE | 13-35 | 10 | 1200 | 420 | 55 | 2.8 | 3 | 136 | 55 | 2.8 |
| | 13-36 | 14 | 1200 | 2 | 13 | 13 | 3 | 125 | 13 | 13 |
| EXAMPLE OF PRESENT INVENTION | 13-37 | 3.2 | 1010 | 2 | 60 | 2.5 | 3 | 136 | 60 | 2.5 |
| | 13-38 | 3.2 | 1200 | 3 | 82 | 0.8 | 3 | 136 | 82 | 0.8 |
| | 13-39 | 3.2 | 1200 | 7 | 82 | 0.8 | 3 | 136 | 82 | 0.8 |
| | 13-40 | 3.2 | 1200 | 35 | 82 | 0.8 | 3 | 136 | 82 | 0.8 |
| | 13-41 | 3.2 | 1200 | 140 | 82 | 0.8 | 3 | 136 | 82 | 0.8 |
| | 13-42 | 3.2 | 1200 | 420 | 82 | 0.8 | 3 | 136 | 82 | 0.8 |

Further, an alloying ratio of the metal layer and a ratio of an α single phase region in each of the Fe-based metal plates were measured as in the first experiment. Here, in finding the alloying ratio, a region where the Fe content was 0.5 mass % or less and the content of ferrite former was 99.5 mass % or more was regarded as an alloy layer. Further, a region where the W content was 6.6 mass % or more was regarded as the α single phase region, and a ratio of the α single phase region was found from the aforesaid expression (4). Results of these are listed in Table 31.

Further, as in the first experiment, magnetic flux density B50 and saturation magnetic flux density Bs were measured and a ratio B50/Bs of the magnetic flux density B50 to the saturation magnetic flux density Bs was calculated. Further, core loss W10/1 k (W10/1000) at a 1000 Hz frequency when the magnetic flux density was 1.0 T was measured. Results of these are listed in Table 31.

13-35, No. 13-37 to No. 13-42), the accumulation degree of the {200} planes in the α phase was within the ranges of the present invention at the respective stages of the heat treatment. Further, as listed in Table 31, in the examples of the present invention, the alloying ratio and the ratio of the α single phase region were within the desirable ranges of the present invention. As listed in Table 31, according to the examples of the present invention, the Fe-based metal plates in which the accumulation degree of the {200} planes in the α phase was 30% or more and the accumulation degree of the {222} planes in the α phase was 30% or less were obtained. Further, in the Fe-based metal plates of the examples of the present invention, the ratio B50/Bs was 0.85 or more.

In the examples of the present invention, when the ratio of the α single phase region was 1% or more and the accumu-

TABLE 31

| | CONDITION No. | ALLOYING RATE (%) | RATIO OF α SINGLE PHASE (%) | ACCUMULATION DEGREE OF {200} PLANE (%) | ACCUMULATION DEGREE OF {222} PLANE (%) | B50 (T) | Bs (T) | B50/Bs | W10/1k (W/kg) |
|---|---|---|---|---|---|---|---|---|---|
| COMPARATIVE EXAMPLE | 13-1 | 0 | 0 | 13 | 13 | 1.60 | 2.05 | 0.78 | 91 |
| EXAMPLE OF PRESENT INVENTION | 13-2 | 7 | 0.2 | 30 | 11 | 1.74 | 2.05 | 0.85 | 63 |
| | 13-3 | 82 | 1.5 | 31 | 10 | 1.74 | 2.05 | 0.85 | 57 |
| | 13-4 | 95 | 8.2 | 30 | 10 | 1.74 | 2.05 | 0.85 | 44 |
| | 13-5 | 100 | 35 | 30 | 10 | 1.74 | 2.05 | 0.85 | 37 |
| | 13-6 | 100 | 73 | 30 | 10 | 1.74 | 2.05 | 0.85 | 43 |
| | 13-7 | 100 | 87 | 30 | 10 | 1.74 | 2.05 | 0.85 | 58 |
| COMPARATIVE EXAMPLE | 13-8 | 0 | 0 | 13 | 13 | 1.60 | 2.05 | 0.78 | 92 |
| EXAMPLE OF PRESENT INVENTION | 13-9 | 10 | 0.3 | 43 | 5.9 | 1.78 | 2.05 | 0.87 | 61 |
| | 13-10 | 64 | 2.6 | 53 | 2.7 | 1.85 | 2.05 | 0.90 | 57 |
| | 13-11 | 94 | 7.8 | 53 | 2.7 | 1.87 | 2.05 | 0.91 | 42 |
| | 13-12 | 100 | 42 | 53 | 2.7 | 1.85 | 2.05 | 0.90 | 33 |
| | 13-13 | 100 | 71 | 53 | 2.7 | 1.85 | 2.05 | 0.90 | 38 |
| | 13-14 | 100 | 95 | 53 | 2.7 | 1.87 | 2.05 | 0.91 | 53 |
| COMPARATIVE EXAMPLE | 13-15 | 0 | 0 | 13 | 13 | 1.62 | 2.05 | 0.79 | 92 |
| EXAMPLE OF PRESENT INVENTION | 13-16 | 5 | 0.1 | 63 | 2 | 1.91 | 2.05 | 0.93 | 63 |
| | 13-17 | 67 | 1.2 | 75 | 1.3 | 1.95 | 2.05 | 0.95 | 48 |
| | 13-18 | 89 | 5.9 | 75 | 1.4 | 1.93 | 2.05 | 0.94 | 41 |
| | 13-19 | 100 | 37 | 75 | 1.3 | 1.95 | 2.05 | 0.95 | 28 |
| | 13-20 | 100 | 72 | 76 | 1.4 | 1.97 | 2.05 | 0.96 | 33 |
| | 13-21 | 100 | 87 | 75 | 1.7 | 1.95 | 2.05 | 0.95 | 48 |
| COMPARATIVE EXAMPLE | 13-22 | 0 | 0 | 13 | 13 | 1.60 | 2.05 | 0.78 | 99 |
| EXAMPLE OF PRESENT INVENTION | 13-23 | 8 | 0.3 | 30 | 11 | 1.74 | 2.05 | 0.85 | 64 |
| | 13-24 | 57 | 1.2 | 32 | 9 | 1.74 | 2.05 | 0.85 | 56 |
| | 13-25 | 87 | 6.7 | 32 | 9 | 1.74 | 2.05 | 0.85 | 45 |
| | 13-26 | 100 | 45 | 32 | 9 | 1.74 | 2.05 | 0.85 | 37 |
| | 13-27 | 100 | 72 | 32 | 9 | 1.74 | 2.05 | 0.85 | 42 |
| | 13-28 | 100 | 92 | 32 | 9 | 1.74 | 2.05 | 0.85 | 57 |
| COMPARATIVE EXAMPLE | 13-29 | 0 | 0 | 13 | 13 | 1.60 | 2.05 | 0.78 | 101 |
| EXAMPLE OF PRESENT INVENTION | 13-30 | 8 | 0.3 | 41 | 5.3 | 1.78 | 2.05 | 0.87 | 64 |
| | 13-31 | 54 | 1.3 | 56 | 2.1 | 1.87 | 2.05 | 0.91 | 52 |
| | 13-32 | 78 | 6.1 | 56 | 2.1 | 1.85 | 2.05 | 0.90 | 41 |
| | 13-33 | 100 | 38 | 56 | 2.2 | 1.87 | 2.05 | 0.91 | 32 |
| | 13-34 | 100 | 71 | 56 | 2.1 | 1.85 | 2.05 | 0.90 | 38 |
| | 13-35 | 100 | 91 | 56 | 2.2 | 1.87 | 2.05 | 0.91 | 54 |
| COMPARATIVE EXAMPLE | 13-36 | 0 | 0 | 13 | 13 | 1.62 | 2.05 | 0.79 | 102 |
| EXAMPLE OF PRESENT INVENTION | 13-37 | 8 | 0.2 | 60 | 2.5 | 1.89 | 2.05 | 0.92 | 63 |
| | 13-38 | 70 | 2.3 | 82 | 0.8 | 1.95 | 2.05 | 0.95 | 46 |
| | 13-39 | 91 | 7.1 | 82 | 0.8 | 1.95 | 2.05 | 0.95 | 40 |
| | 13-40 | 100 | 41 | 82 | 0.8 | 1.97 | 2.05 | 0.96 | 26 |
| | 13-41 | 100 | 76 | 82 | 0.8 | 1.95 | 2.05 | 0.95 | 32 |
| | 13-42 | 100 | 100 | 82 | 0.8 | 1.97 | 2.05 | 0.96 | 48 |

As listed in Table 30, in examples of the present invention (conditions No. 13-2 to No. 13-7, No. 13-9 to No. 13-14, No. 13-16 to No. 13-21, No. 13-23 to No. 13-28, No. 13-30 to No. lation degree of the {200} planes was 30% or more, not only the magnetic flux density B50 but also the core loss W10/1 k maintained a higher property level. Further, it could be confirmed that the core loss W10/1 k has a still better property level when the ratio of the α single phase region is not less than 5% nor more than 80%.

INDUSTRIAL APPLICABILITY

The present invention is usable in, for example, industries related to magnetic materials such as iron cores.

The invention claimed is:

1. A method of manufacturing an Fe-based metal plate comprising:
    forming a metal layer containing ferrite former on at least one surface of a base metal plate of an α-γ transforming Fe or Fe alloy;
    next heating the base metal plate and the metal layer to an A3 point of the Fe or the Fe alloy so as to diffuse the ferrite former into the base metal plate and form an alloy region of a ferrite phase in which an accumulation degree of {200} planes is 25% or more and an accumulation degree of {222} planes is 40% or less; and
    next heating the base metal plate to a temperature equal to or higher than the A3 point of the Fe or the Fe alloy so as to increase the accumulation degree of the {200} planes and decrease the accumulation degree of the {222} planes while maintaining the alloy region of the ferrite phase.

2. The method of manufacturing an Fe-based metal plate according to claim 1, comprising, after the increasing the accumulation degree of the {200} planes and the decreasing the accumulation degree of the {222} planes, cooling the base metal plate to a temperature lower than the A3 point of the Fe or the Fe alloy so as to transform an unalloyed region in the base metal plate from an austenitic phase to a ferrite phase, further increase the accumulation degree of the {200} planes and further decrease the accumulation degree of the {222} planes.

3. The method of manufacturing an Fe-based metal plate according to claim 1, wherein, in the increasing the accumulation degree of the {200} planes and the decreasing the accumulation degree of the {222} planes, the accumulation degree of the {200} planes is increased to 30% or more and the accumulation degree of the {222} planes is decreased to 30% or less.

4. The method of manufacturing an Fe-based metal plate according to claim 1, wherein, in the increasing the accumulation degree of the {200} planes and the decreasing the accumulation degree of the {222} planes, the accumulation degree of the {200} planes is increased to 50% or more and the accumulation degree of the {222} planes is decreased to 15% or less.

5. The method of manufacturing an Fe-based metal plate according to claim 1, wherein, in the increasing the accumulation degree of the {200} planes and the decreasing the accumulation degree of the {222} planes, the ferrite former contained in the metal layer are all diffused into the base metal plate.

6. The method of manufacturing an Fe-based metal plate according to claim 1, wherein the ferrite former are at least one kind selected from a group consisting of Al, Cr, Ga, Ge, Mo, Sb, Si, Sn, Ti, V, W, and Zn.

7. The method of manufacturing an Fe-based metal plate according to claim 1, wherein, in the increasing the accumulation degree of the {200} planes and the decreasing the accumulation degree of the {222} planes, an area ratio of a ferrite single phase region to the metal plate in a cross section in a thickness direction is made to 1% or more.

8. The method of manufacturing an Fe-based metal plate according to claim 1, wherein as the base metal plate, used is one in which a working strain is brought about and in which dislocation density is not less than $1 \times 10^{15}$ m/m$^3$ nor more than $1 \times 10^{17}$ m/m$^3$.

9. The method of manufacturing an Fe-based metal plate according to claim 1, wherein as the base metal plate, used is one in which a working strain is brought about by cold rolling in which rolling reduction ratio is not less than 97% nor more than 99.99%.

10. The method of manufacturing an Fe-based metal plate according to claim 1, wherein as the base metal plate, used is one in which a working strain is brought about by shot blasting.

11. The method of manufacturing an Fe-based metal plate according to claim 1, wherein as the base metal plate, used is one in which a working strain is brought about by cold rolling in which rolling reduction ratio is not less than 50% nor more than 99.99% and shot blasting.

12. The method of manufacturing an Fe-based metal plate according to claim 1, wherein as the base metal plate, used is one in which a shear strain of 0.2 or more is brought about by cold rolling.

13. The method of manufacturing an Fe-based metal plate according to claim 1, wherein as the base metal plate, used is one in which a shear strain of 0.1 or more is brought about by cold rolling and a working strain is brought about by shot blasting.

14. The method of manufacturing an Fe-based metal plate according to claim 1, wherein a thickness of the base metal plate is not less than 10 μm nor more than 5 mm.

15. A Fe-based metal plate, containing ferrite former,
    wherein, in a surface, an accumulation degree of {200} planes in a ferrite phase is 30% or more and an accumulation degree of {222} planes in the ferrite phase is 30% or less, and the ferrite former is at least one selected from the group consisting of Al, Cr, Ga, Ge, Mo, Sb, Sn, Ti, V, W and Zn,
    wherein the Fe-based metal plate is formed by diffusion of the ferrite former from a surface to an inner part of an α-γ transforming Fe or Fe alloy plate, and
    wherein a ratio of an α single phase region to the Fe-based metal plate in a thickness direction is not less than 5% and not more than 80%.

16. The Fe-based metal plate according to claim 15, comprising, on the surface, a metal layer containing the ferrite former.

17. The Fe-based metal plate according to claim 15, wherein the accumulation degree of the {200} planes is 50% or more and the accumulation degree of the {222} planes is 15% or less.

18. The Fe-based metal plate according to claim 15, wherein the ferrite former are at least one kind selected from a group consisting of Al, Cr, Ga, Ge, Mo, Sb, Si, Sn, Ti, V, W, and Zn.

19. The Fe-based metal plate according to claim 15, comprising a 1% ferrite single phase region or more in terms of an area ratio in a thicknesswise cross section of the metal plate.

* * * * *

UNITED STATES PATENT AND TRADEMARK OFFICE
CERTIFICATE OF CORRECTION

PATENT NO. : 8,911,565 B2
APPLICATION NO. : 13/504319
DATED : December 16, 2014
INVENTOR(S) : Tooru Inaguma et al.

It is certified that error appears in the above-identified patent and that said Letters Patent is hereby corrected as shown below:

In the Claims

Column 130, lines 56-58, Claim 18, change "wherein the ferrite former are at least one kind selected from a group consisting of Al, Cr, Ga, Ge, Mo, Sb, Si, Sn, Ti, V, W, and Zn." to -- wherein the ferrite former is at least one selected from a group consisting of Cr, Ga, Ge, Mo, Sb, Sn, Ti, V, W, and Zn. --.

Signed and Sealed this
Twenty-second Day of September, 2015

Michelle K. Lee
*Director of the United States Patent and Trademark Office*